US008400278B2

(12) United States Patent
Koyama

(10) Patent No.: US 8,400,278 B2
(45) Date of Patent: Mar. 19, 2013

(54) SEMICONDUCTOR DEVICE AND IC LABEL, IC TAG, AND IC CARD HAVING THE SAME

(75) Inventor: Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1184 days.

(21) Appl. No.: 11/806,133

(22) Filed: May 30, 2007

(65) Prior Publication Data

US 2007/0285246 A1  Dec. 13, 2007

(30) Foreign Application Priority Data

May 31, 2006  (JP) ................................. 2006-152831

(51) Int. Cl.
*H04Q 5/22* (2006.01)
(52) U.S. Cl. ............... 340/10.51; 340/539.3; 340/572.1; 340/10.1; 340/10.2; 340/10.34; 320/166
(58) Field of Classification Search ............... 340/572.1, 340/10.34; 361/18; 320/166
See application file for complete search history.

(56) References Cited

U.S. PATENT DOCUMENTS

| 4,455,588 | A | * | 6/1984 | Mochida et al. ............. 340/5.54 |
| 4,740,431 | A | * | 4/1988 | Little ................................. 429/9 |
| 4,955,038 | A | * | 9/1990 | Lee et al. ....................... 375/256 |
| 5,212,664 | A | * | 5/1993 | Shinohara ..................... 365/229 |
| 5,233,316 | A | * | 8/1993 | Yamada et al. ................. 331/45 |
| 5,300,875 | A | * | 4/1994 | Tuttle ............................. 320/138 |
| 5,310,999 | A | * | 5/1994 | Claus et al. .................... 235/384 |
| 5,317,309 | A | * | 5/1994 | Vercellotti et al. ........... 340/10.5 |
| 5,394,116 | A | * | 2/1995 | Kasturia ........................... 331/34 |
| 5,457,447 | A | * | 10/1995 | Ghaem et al. ............... 340/10.42 |
| 5,682,149 | A | * | 10/1997 | Hofman ..................... 340/870.17 |
| 6,462,647 | B1 | * | 10/2002 | Roz ............................... 340/10.1 |
| 6,489,883 | B1 | * | 12/2002 | Iiyama et al. ................... 340/5.1 |
| 6,690,259 | B2 | * | 2/2004 | Aslanidis et al. ............. 340/5.61 |
| 6,700,491 | B2 | * | 3/2004 | Shafer ......................... 340/572.7 |
| 6,837,438 | B1 | * | 1/2005 | Takasugi et al. .............. 235/492 |
| 6,847,291 | B2 | * | 1/2005 | Kemp ............................ 340/521 |

(Continued)

FOREIGN PATENT DOCUMENTS

| CN | 1529182 | 9/2004 |
| GB | 2292866 A | * 9/1995 |

(Continued)

OTHER PUBLICATIONS

International Search Report (Application No. PCT/JP2007/061146) dated Aug. 21, 2007.

(Continued)

*Primary Examiner* — Benjamin C Lee
*Assistant Examiner* — Quang D Pham
(74) *Attorney, Agent, or Firm* — Eric J. Robinson; Robinson Intellectual Property Law Office, P.C.

(57) ABSTRACT

The present invention provides a power supply circuit provided with a battery as a power source for supplying power to an RFID, and the battery of the power supply circuit is charged with a wireless signal. Then, a switching circuit is provided in the power supply circuit that supplies power to a signal control circuit which transmits and receives individual information to and from the outside to intermittently control supply of power to the signal control circuit by a signal from a low-frequency signal generation circuit.

14 Claims, 34 Drawing Sheets

U.S. PATENT DOCUMENTS

| | | | |
|---|---|---|---|
| 6,944,424 B2* | 9/2005 | Heinrich et al. | 455/41.1 |
| 7,205,899 B2* | 4/2007 | Surkau | 340/572.8 |
| 7,284,703 B2 | 10/2007 | Powell et al. | |
| 7,893,816 B1* | 2/2011 | Kwan | 340/10.34 |
| 2003/0035502 A1* | 2/2003 | Boerker | 375/372 |
| 2003/0067382 A1* | 4/2003 | Spiess et al. | 340/7.32 |
| 2005/0033544 A1* | 2/2005 | Brooks et al. | 702/128 |
| 2005/0146220 A1* | 7/2005 | Hamel et al. | 307/44 |
| 2005/0162131 A1 | 7/2005 | Sennami et al. | |
| 2005/0248455 A1* | 11/2005 | Pope et al. | 340/539.27 |
| 2005/0254183 A1* | 11/2005 | Ishida et al. | 361/18 |
| 2006/0017659 A1* | 1/2006 | Ogawa et al. | 345/30 |
| 2007/0037527 A1* | 2/2007 | Poppa | 455/76 |
| 2007/0247920 A1* | 10/2007 | Kawajiri et al. | 365/185.27 |
| 2007/0278998 A1* | 12/2007 | Koyama | 320/109 |
| 2008/0136603 A1* | 6/2008 | Choi et al. | 340/10.33 |
| 2009/0179751 A1* | 7/2009 | Forster | 340/501 |
| 2009/0179761 A1* | 7/2009 | Chang et al. | 340/572.1 |

FOREIGN PATENT DOCUMENTS

| | | | |
|---|---|---|---|
| GB | 2 292 866 | | 3/1996 |
| JP | 08-069513 | | 3/1996 |
| JP | 10-307898 | | 11/1998 |
| JP | 11-338984 | * | 12/1999 |
| JP | 11-345292 | | 12/1999 |
| JP | H11-338984 | * | 12/1999 |
| JP | 2000-166129 | | 6/2000 |
| JP | 2001-067446 | * | 3/2001 |
| JP | 2001067446 | * | 3/2001 |
| JP | 2001067446 A | * | 3/2001 |
| JP | 2002-057617 | | 2/2002 |
| JP | 2003-006592 | | 1/2003 |
| JP | 2003-070187 | | 3/2003 |
| JP | 2003-299255 | | 10/2003 |
| JP | 2003-299255 A | | 10/2003 |
| JP | 2004-343410 | | 12/2004 |
| JP | 2005-293485 | | 10/2005 |
| JP | 2005-316724 | | 11/2005 |
| JP | 2006-004015 | | 1/2006 |
| JP | 2006-503376 | | 1/2006 |

OTHER PUBLICATIONS

Written Opinion (Application No. PCT/JP2007/061146) dated Aug. 21, 2007.

Chinese Office Action (Application No. 200780019549.3) Dated Aug. 30, 2010.

* cited by examiner

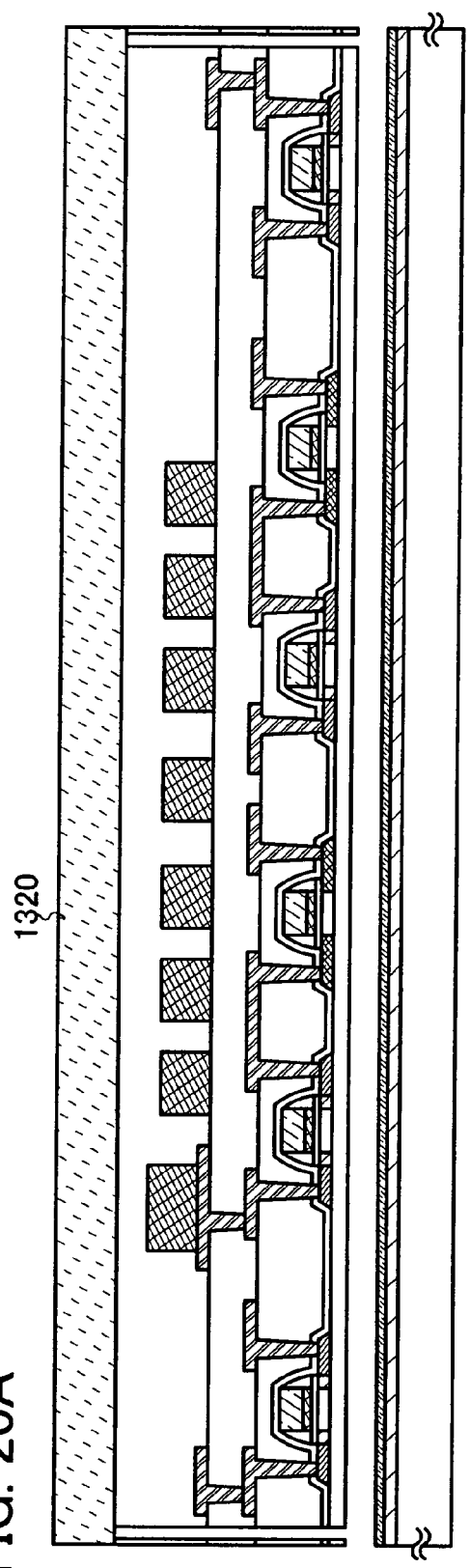
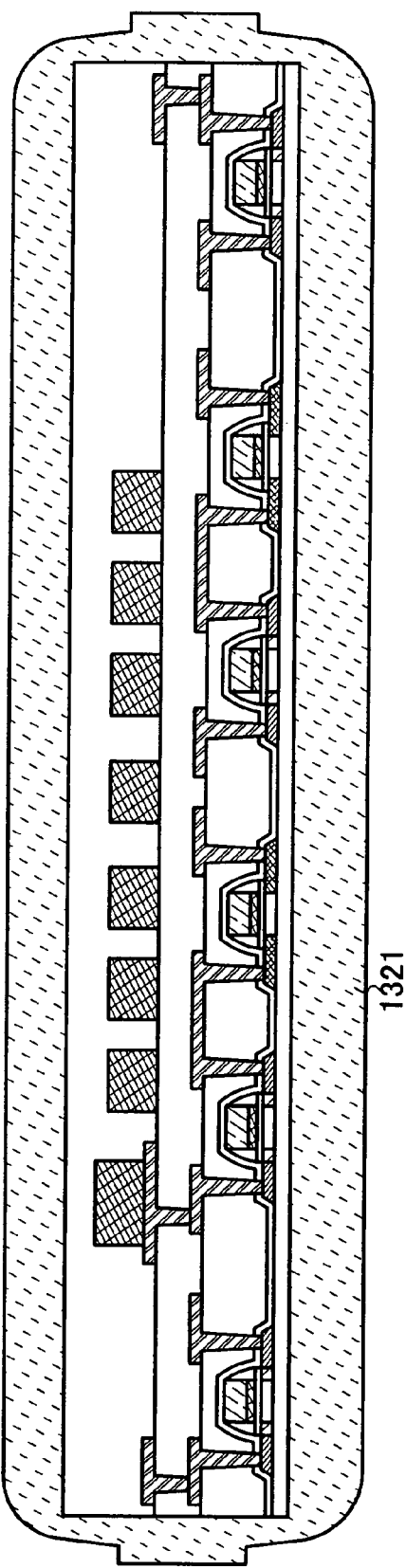
FIG. 20A
FIG. 20B

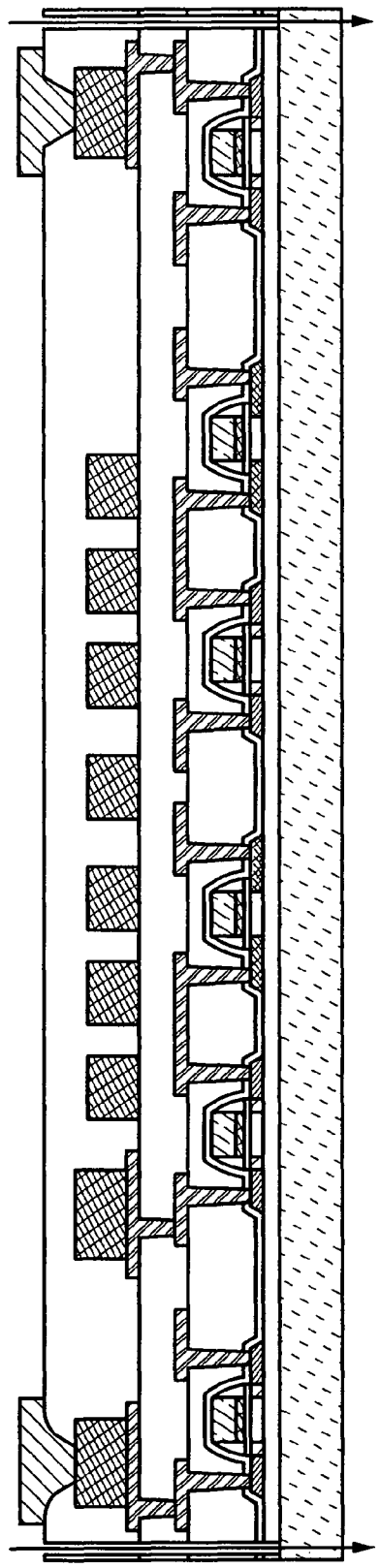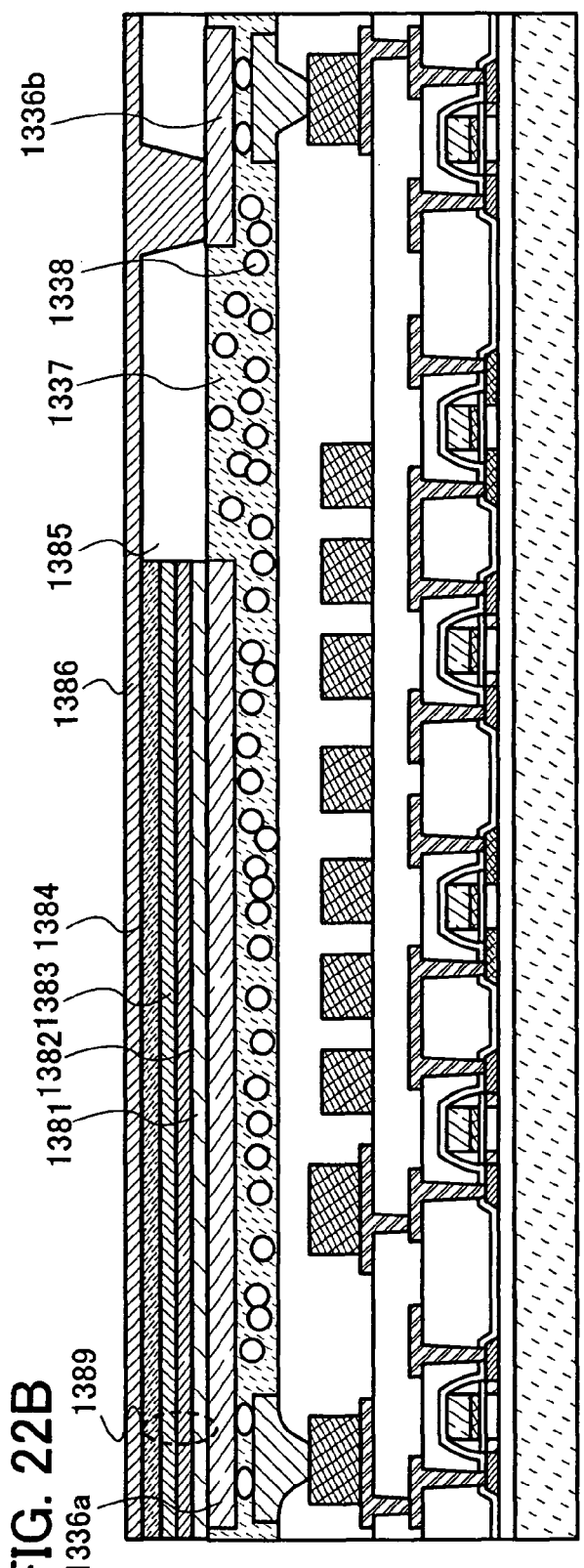
FIG. 22A
FIG. 22B

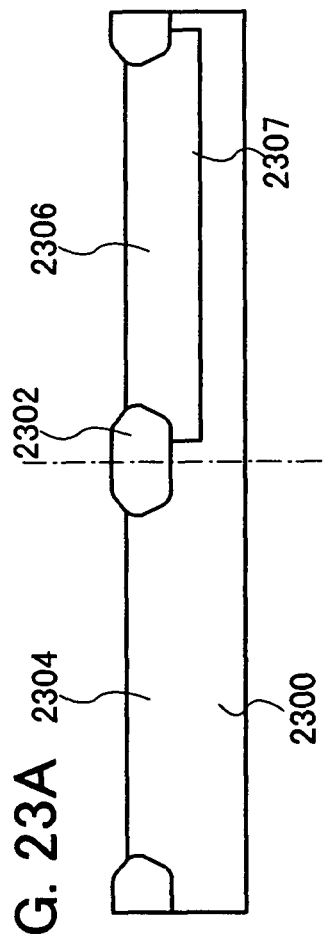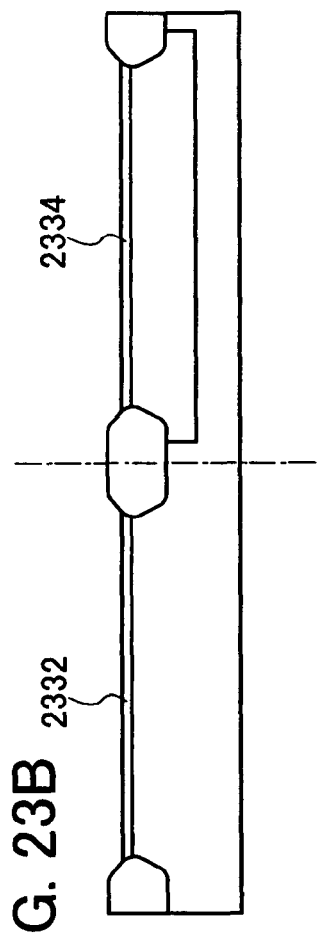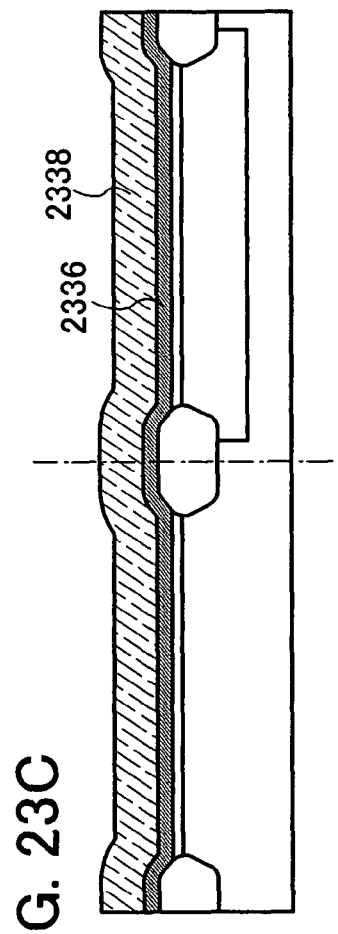

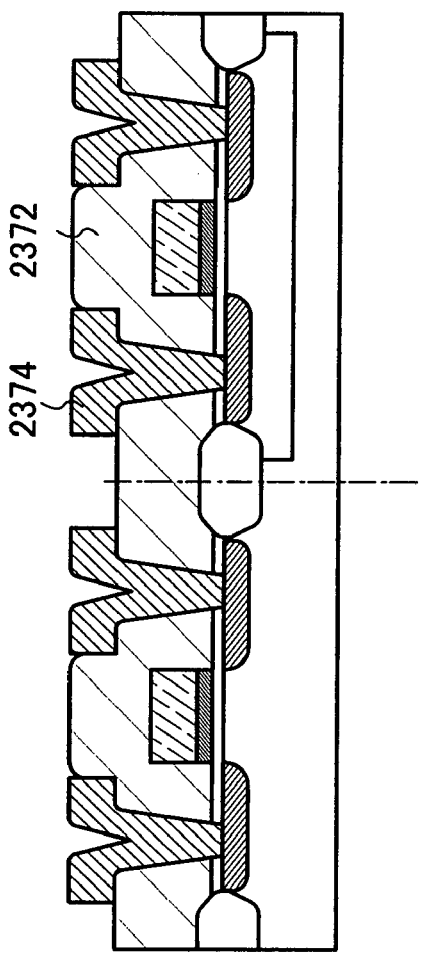
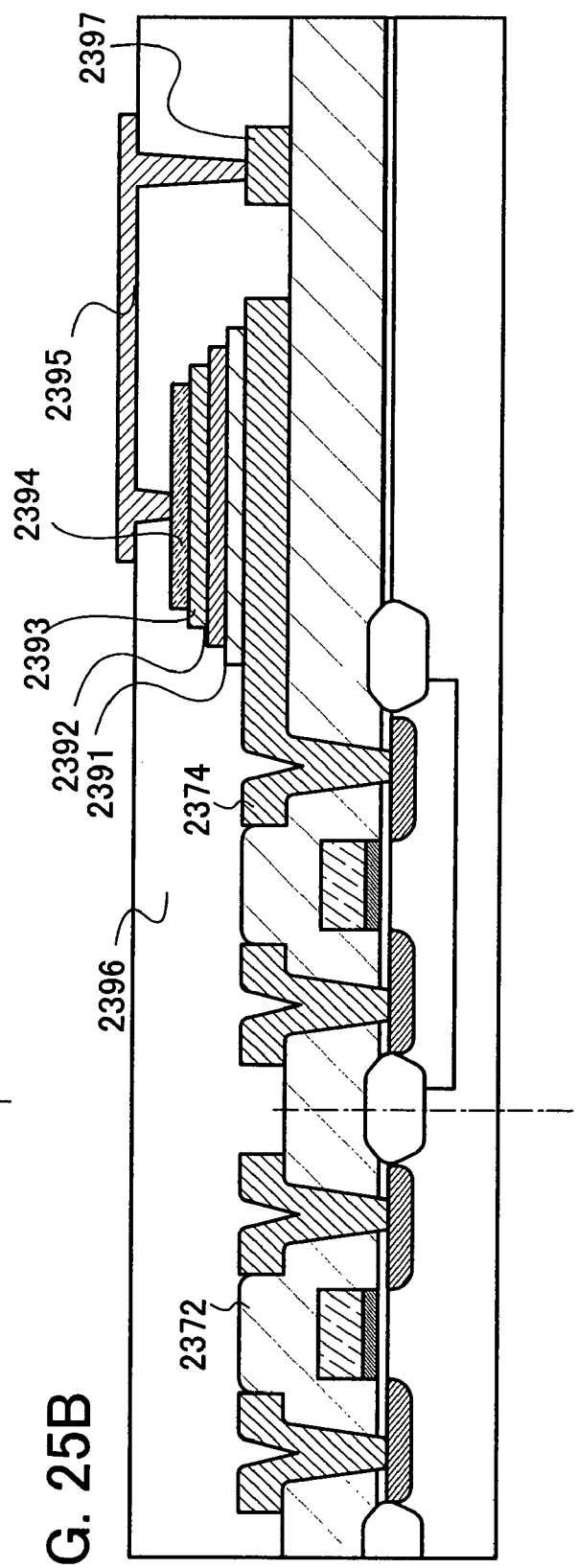
FIG. 25A
FIG. 25B

SEMICONDUCTOR DEVICE AND IC LABEL, IC TAG, AND IC CARD HAVING THE SAME

TECHNICAL FIELD

The present invention relates to a semiconductor device. In particular, the present invention relates to a semiconductor device which transmits and receives data through radio waves and receives power. Further, the present invention relates to a communication system through radio waves and using a semiconductor device, an antenna and a reader/writer which transmit and receive data to and from the semiconductor device, and an antenna and a charger which supply power to the semiconductor device.

Note that semiconductor devices in this specification refers to all devices which can function with the use of a semiconductor characteristic.

BACKGROUND ART

In recent years, an individual identification technique using wireless communication using an electromagnetic field, a radio wave, or the like has attracted attention. In particular, an individual identification technique with the utilization of an RFID (Radio Frequency IDentification) tag as a semiconductor device which communicates data by wireless communication has attracted attention. The RFID tag (hereinafter, simply referred to as an RFID) is also referred to as an IC (Integrated Circuit) tag, an IC chip, an RF tag, a wireless tag, or an electronic tag. The individual identification technique with the utilization of an RFID has been useful for production, management, and the like of an individual object, and has been expected to be applied to personal authentication.

An RFID can be classified into two types depending on whether a power source is incorporated in the RFID or a power source is supplied from the outside: an active-type RFID capable of transmitting radio waves or electromagnetic waves including information on the RFID, and a passive-type RFID which is driven with the utilization of power of radio waves or electromagnetic waves (carrier waves) from outside (as for the active-type RFID, see Patent Document 1: Japanese Published Patent Application No. 2005-316724 and, as for the passive-type RFID, see Patent Document 2: Japanese Translation of PCT International Application No. 2006-503376). Between the two, the active-type RFID has a structure in which a power source for driving the RFID is incorporated and a battery is provided as the power source. In addition, the passive-type RFID has a structure in which power of radio waves or electromagnetic waves (carrier waves) from the outside is used as a power source for driving the RFID so that a structure without a battery is realized.

FIG. 31 is a block diagram showing a specific structure of an active-type RFID. In an active-type RFID 3100 of FIG. 31, communication signals received by an antenna circuit 3101 are inputted into a demodulation circuit 3105 and an amplifier circuit 3106 in a signal control circuit 3102. Communication signals of 13.56 MHz or 915 MHz are usually transmitted after being processed using ASK modulation, PSK modulation, or the like. Here, in FIG. 31, an example of a 13.56 MHz carrier is shown as the communication signal. In FIG. 31, a clock signal which is a reference for processing a signal is necessary, and a 13.56 MHz carrier is used as a clock here. The amplifier circuit 3106 amplifies the 13.56 MHz carrier and supplies it to a logic circuit 3107 as the clock. In addition, the ASK modulated communication signal or the PSK modulated communication signal is demodulated by the demodulation circuit 3105. The signal which has been demodulated is also transmitted to the logic circuit 3107 to be analyzed. The signal analyzed by the logic circuit 3107 is transmitted to a memory control circuit 3108, and in accordance with the signal, the memory control circuit 3108 controls a memory circuit 3109, and data stored in the memory circuit 3109 is taken out and transmitted to a logic circuit 3110. The signal stored in the memory circuit 3109 is subjected to encode processing by the logic circuit 3110 and then amplified by an amplifier circuit 3111 so that the carrier is modulated by a modulation circuit 3112 with the signal. Here, a power source in FIG. 31 is supplied by a battery 3103 provided outside the signal control circuit through a power source circuit 3104. The power source circuit 3104 supplies power to the amplifier circuit 3106, the demodulation circuit 3105, the logic circuit 3107, the memory control circuit 3108, the memory circuit 3109, the logic circuit 3110, the amplifier circuit 3111, the modulation circuit 3112, and the like. In such a manner, the active-type RFID operates.

FIG. 32 is a block diagram showing a specific structure of a passive-type RFID. In a passive-type RFID 3200 of FIG. 32, a communication signal received by an antenna circuit 3201 is inputted into a demodulation circuit 3205 and an amplifier circuit 3206 in a signal control circuit 3202. The communication signal is usually transmitted after a carrier such as a 13.56 MHz carrier or a 915 MHz carrier is processed using ASK modulation, PSK modulation, or the like. Here, in FIG. 32, an example of a 13.56 MHz carrier is shown as the communication signal. In FIG. 32, a clock signal which is a reference for processing a signal is necessary, and a 13.56 MHz carrier is used as the clock here. The amplifier circuit 3206 amplifies the 13.56 MHz carrier and supplies it to a logic circuit 3207 as the clock. In addition, the ASK modulated communication signal or the PSK modulated communication signal is demodulated by the demodulation circuit 3205. The signal which has been demodulated is also transmitted to the logic circuit 3207 to be analyzed. The signal analyzed in the logic circuit 3207 is transmitted to a memory control circuit 3208, and in accordance with the signal, the memory control circuit 3208 controls a memory circuit 3209, and data stored in the memory circuit 3209 is taken out and transmitted to a logic circuit 3210. The signal stored in the memory circuit 3209 is encoded in the logic circuit 3210 and then amplified in an amplifier circuit 3211 so that a modulation circuit 3212 modulates the signal. On the other hand, the communication signal inputted into a rectifier circuit 3203 is rectified and inputted into a power source circuit 3204. The power source circuit 3204 supplies power to the amplifier circuit 3206, the demodulation circuit 3205, the logic circuit 3207, the memory control circuit 3208, the memory circuit 3209, the logic circuit 3210, the amplifier circuit 3211, the modulation circuit 3212, and the like. In such a manner, the passive-type RFID operates.

DISCLOSURE OF INVENTION

However, as shown in FIG. 31, in the case of a semiconductor device having an active-type RFID provided with a battery for driving, there has been a problem in that the battery consumes over time, and eventually power necessary for transmitting and receiving individual information cannot be generated in accordance with transmission and reception of individual information and set intensity of radio waves necessary for transmission and reception of the individual information. Accordingly, there has been a problem in that confirmation of remaining capacity of a battery and replacement of a battery are required in order to continuously use a semiconductor device having an active-type RFID provided with a battery for driving.

In addition, as shown in FIG. 32, in the case of a semiconductor device having a passive-type RFID which uses power of radio waves or electromagnetic waves (carrier waves) from the outside as a power source for driving itself, there has been a problem in that it has been difficult to transmit and receive signals a long distance and to secure power for transmitting radio waves necessary for transmission and reception of signals, so that it has been difficult to realize transmission and reception in excellent condition. Accordingly, in order to use a semiconductor device having a passive-type RFID which uses power of radio waves or electromagnetic waves (carrier waves) from the outside as a power source, there has been a problem in that a distance between the RFID and an antenna of a reader/writer which is a power supply means has been limited to be short.

In view of the above problems, it is an object of the present invention to provide a semiconductor device having an RFID, in which individual information can be transmitted and received, and constant transmission and reception of individual information are kept in excellent condition even when enough power of radio waves or electromagnetic waves (carrier waves) from the outside is not supplied to a power source for driving without confirmation of remaining capacity of a battery and replacement of a battery in accordance with deterioration over time of a battery as a driving power source. Additionally, it is another object of the present invention to provide a semiconductor device where the power consumption of the signal control circuit, which is supplied with power from the driving power source, is reduced so that driving thereof can be performed with low power consumption.

In order to solve the above problems, the present invention provides a power supply circuit provided with a battery (here, a secondary battery) as a power source for supplying power to an RFID. In the present invention, the battery of the power supply circuit is charged with a wireless signal. In addition, a switching circuit is provided in the power supply circuit that supplies power to a signal control circuit which transmits and receives individual information to and from the outside to periodically control supply of power to the signal control circuit. Hereinafter, a specific structure of the present invention will be described.

One structure of the present invention is a semiconductor device including an antenna circuit, a power supply circuit, and a signal control circuit. The power supply circuit has a rectifier circuit which rectifies a signal from the antenna circuit, a battery which is charged by the rectified signal, a switching circuit, a low-frequency signal generation circuit, and a power source circuit. The switching circuit controls power which is supplied from the battery to the power source circuit, by a signal from the low-frequency signal generation circuit, whereby power supply to the signal control circuit is controlled.

According to another structure of the present invention, a semiconductor device includes an antenna circuit, a power supply circuit, and a signal control circuit. The power supply circuit has a rectifier circuit which rectifies a signal from the antenna circuit, a control circuit, a battery which is charged by the rectified signal, a switching circuit, a low-frequency signal generation circuit, and a power source circuit. The control circuit compares power from the rectifier circuit with power from the battery to select power supplied to the switching circuit. The switching circuit controls power which is supplied to the power source circuit through the control circuit, by a signal from the low-frequency signal generation circuit, whereby power supply to the signal control circuit is controlled.

Note that, in the present invention, the battery may be a lithium battery, a nickel-metal-hydride battery, a nickel-cadmium battery, an organic-radical battery, or a capacitor.

Note that, in the present invention, the battery may include an anode active material layer, a solid electrolyte layer over the anode active material layer, a cathode active material layer over the solid electrolyte layer, and a collector thin film over the cathode active material layer.

Note that, in the present invention, the control circuit may be a circuit which connect the battery and the switching circuit when power from the rectifier circuit is less than power from the battery, and does not connect the battery and the switching circuit when power from the battery is less than power from rectifier circuit.

Note that, in the present invention, the semiconductor device may have a booster antenna, and the antenna circuit may receive a signal from the outside through the booster antenna.

Note that, in the present invention, the antenna circuit may include a first antenna circuit for receiving power to charge the battery and a second antenna circuit for transmitting and receiving signals to and from the signal control circuit.

Note that, in the present invention, the first antenna circuit may include a plurality of antenna circuits.

Note that, in the present invention, one of the first antenna circuit and the second antenna circuit may receive a signal with an electromagnetic induction method.

Note that, in the present invention, the low-frequency signal generation circuit may generate signals outputted to the switching circuit by frequency-division of generated clock signals.

Note that, in the present invention, the signal control circuit may include an amplifier circuit, a modulation circuit, a demodulation circuit, a logic circuit, and a memory control circuit.

In the present invention, "being connected" refers to "being electrically connected" and "being directly connected". Therefore, in the structure disclosed in the present invention, in addition to the predetermined connection, another element, which enables an electrical connection (for example, a switch, a transistor, a capacitor element, an inductor, a resistor element, a diode, or the like), may be provided therebetween. Alternatively, a direct connection may be made without interposition of another element. Note that, when elements are connected without interposition of another element which enables an electrical connection and connected not electrically but directly, it is described as "being directly connected". Note that "being electrically connected" also refers to "being directly connected".

Note that transistors of various modes can be applied to the present invention. Thus, kinds of transistors applicable to the present invention are not limited. Therefore, the following transistors are applicable to the present invention: a thin film transistor (TFT) using a non-single crystal semiconductor film typified by amorphous silicon and polycrystalline silicon; a transistor which is formed using a semiconductor substrate or an SOI substrate; a MOS transistor; a junction transistor; a bipolar transistor; a transistor using a compound semiconductor such as ZnO or a-InGaZnO; a transistor using an organic semiconductor or a carbon nanotube; and other transistors. Note that a non-single crystal semiconductor film may contain hydrogen or halogen. A substrate on which a transistor is provided is not limited to a particular type and various kinds of substrates can be used. Therefore, a transistor can be provided using, for example, a single crystal substrate, an SOI substrate, a glass substrate, a quartz substrate, a plastic substrate, a paper substrate, a cellophane substrate, or the like. Moreover, a transistor formed over one substrate may be moved to another substrate to be provided thereover.

In addition, a transistor applied to a semiconductor device of the present invention may have, for example, a multi-gate structure where the number of gates is two or more. With a multi-gate structure, an off current can be reduced and reliability can be improved by improvement of the pressure resistance of a transistor, and flat characteristics can be obtained because a drain-source current does not change so much even when a drain-source voltage changes at the time of the operation in a saturation region. In addition, gate electrodes may be provided over and under a channel. Accordingly, a current value is increased and an S value can be set small because a depletion layer is easily formed. Moreover, a gate electrode may be provided over or under the channel. Either a forward staggered structure or an inversely staggered structure may be employed. A channel region may be divided into a plurality of regions, or connected in parallel or in series. Further, a source electrode or a drain electrode may overlap a channel (or part thereof), thereby preventing a charge from being accumulated in part of the channel and an unstable operation. Furthermore, an LDD region may be provided. By provision of an LDD region, an off current can be reduced and reliability can be improved by improvement of the pressure resistance of a transistor, and flat characteristics can be obtained because a drain-source current does not change so much even when a drain-source voltage changes at the time of the operation in a saturation region.

Note that various types of transistors can be used as a transistor applied to a semiconductor device of the present invention and formed using various substrates as described above. Therefore, all of the circuits may be formed using a glass substrate, a plastic substrate, a single crystal substrate, an SOI substrate, or any substrate. When all the circuits are formed using one substrate, cost can be reduced by reduction in the number of components and reliability can be improved by reduction in the number of connections with the components. Alternatively, some circuits may be formed over one substrate and other circuits may be formed over another substrate. In other words, not all of the circuits are necessary to be formed over one substrate. For example, some of circuits may be formed over a glass substrate using transistors and other circuits may be formed using a single crystal substrate as an IC chip provided over the glass substrate by COG (Chip On Glass) to be connected with the circuits formed over the glass substrate. Alternatively, the IC chip may be connected to a glass substrate using TAB (Tape Automated Bonding) or a printed wiring board. In such a manner, when some circuits are formed over one substrate, cost can be reduced by reduction in the number of components and reliability can be improved by reduction in the number of connections with the components. In addition, although circuits with a high driving voltage or a high driving frequency consumes more power, when they are formed using different substrate from the other circuits, increase in power consumption can be prevented.

Note that a semiconductor device described in this specification corresponds to a general device which can function by utilization of semiconductor characteristics.

A semiconductor device of the present invention has a power supply circuit provided with a battery; therefore, the battery can be charged periodically and shortage of power for transmitting and receiving individual information in accordance with deterioration over time of a battery can be prevented. In addition, in charging the battery, the semiconductor device of the present invention receives power in an antenna circuit provided in an RFID so that the battery is charged. Therefore, the semiconductor device can charge the battery with the utilization of power of radio waves or electromagnetic waves from the outside as a power source for driving the RFID without being directly connected to a charger. Consequently, it becomes possible to continuously use the semiconductor device without check of remaining capacity of a battery or replacement of the battery, which is necessary in the case of an active RFID. Additionally, power for driving the RFID is always retained in the battery, whereby power which is enough for an operation of the RFID can be obtained and communication distance with the reader/writer can be extended.

In the semiconductor device of the present invention, in addition to the advantage of providing the above battery, a switching circuit is provided in the power supply circuit that supplies power to a signal control circuit which transmits and receives individual information to and from the outside to periodically control supply of power to the signal control circuit. An RFID operation can be performed intermittently by control of the supply of power to the signal control circuit in the switching circuit provided in the power supply circuit. Therefore, reduction in the power consumption of the battery can be achieved and further longtime operation can be performed even without supply of power by a wireless signal.

BRIEF DESCRIPTION OF DRAWINGS

In the accompanying drawings:
FIGS. 20A and 20B illustrate a structure of Embodiment 2;
FIGS. 22A and 22B illustrate a structure of Embodiment 2;
FIGS. 23A to 23C illustrate a structure of Embodiment 3;
FIGS. 25A and 25B illustrate a structure of Embodiment 3.

BEST MODE FOR CARRYING OUT THE INVENTION

Figure 1:
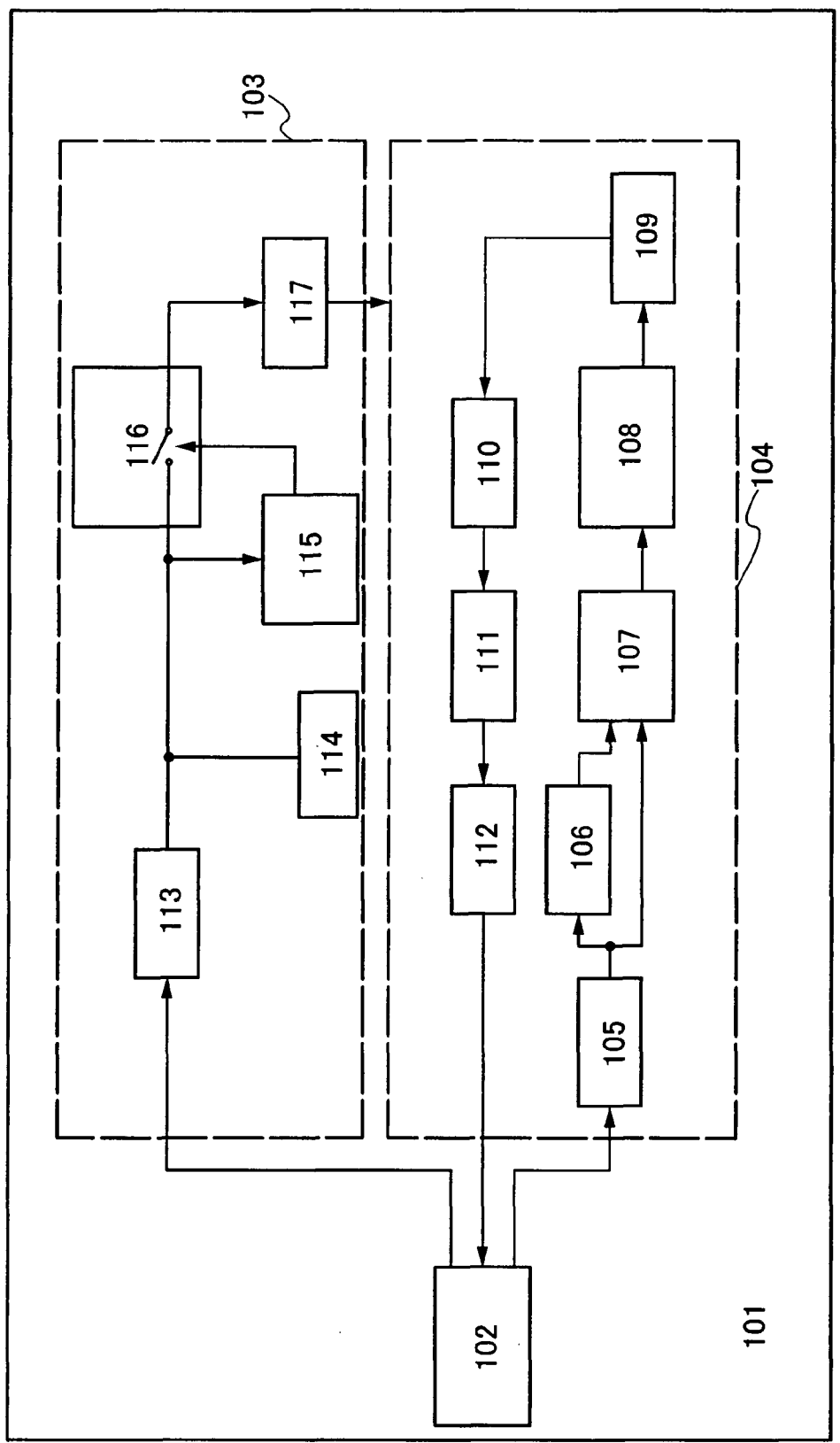
FIG. 1 illustrates a structure of Embodiment Mode 1.

Although embodiment modes of the present invention will be explained with reference to the accompanying drawings, it is to be understood that various changes and modifications will be apparent to those skilled in the art. Therefore, unless such changes and modifications depart from the spirit and the scope of the present invention, they should be construed as being included therein. Note that, in the structure of the present invention which will be explained below, reference numerals denoting the same portions are used in common in different drawings.

(Embodiment Mode 1)

A structural example of a semiconductor device of the present invention will be explained with reference to block diagrams shown in FIGS. 1 and 2. Note that, in this embodiment mode, explanation is made of a case where a semiconductor device is used as an RFID tag (hereinafter, also simply referred to as an "RFID").

A semiconductor device shown in FIG. 1 (hereinafter, described as an "RFID 101") includes an antenna circuit 102, a power supply circuit 103, and a signal control circuit 104. The signal control circuit 104 includes an amplifier circuit 105, a demodulation circuit 106, a logic circuit 107, a memory control circuit 108, a memory circuit 109, a logic circuit 110, an amplifier circuit 111, and a modulation circuit 112. In addition, the power supply circuit 103 includes a rectifier circuit 113, a battery 114, a low-frequency signal generation circuit 115, a switching circuit 116, and a power source circuit 117.

Figure 2:
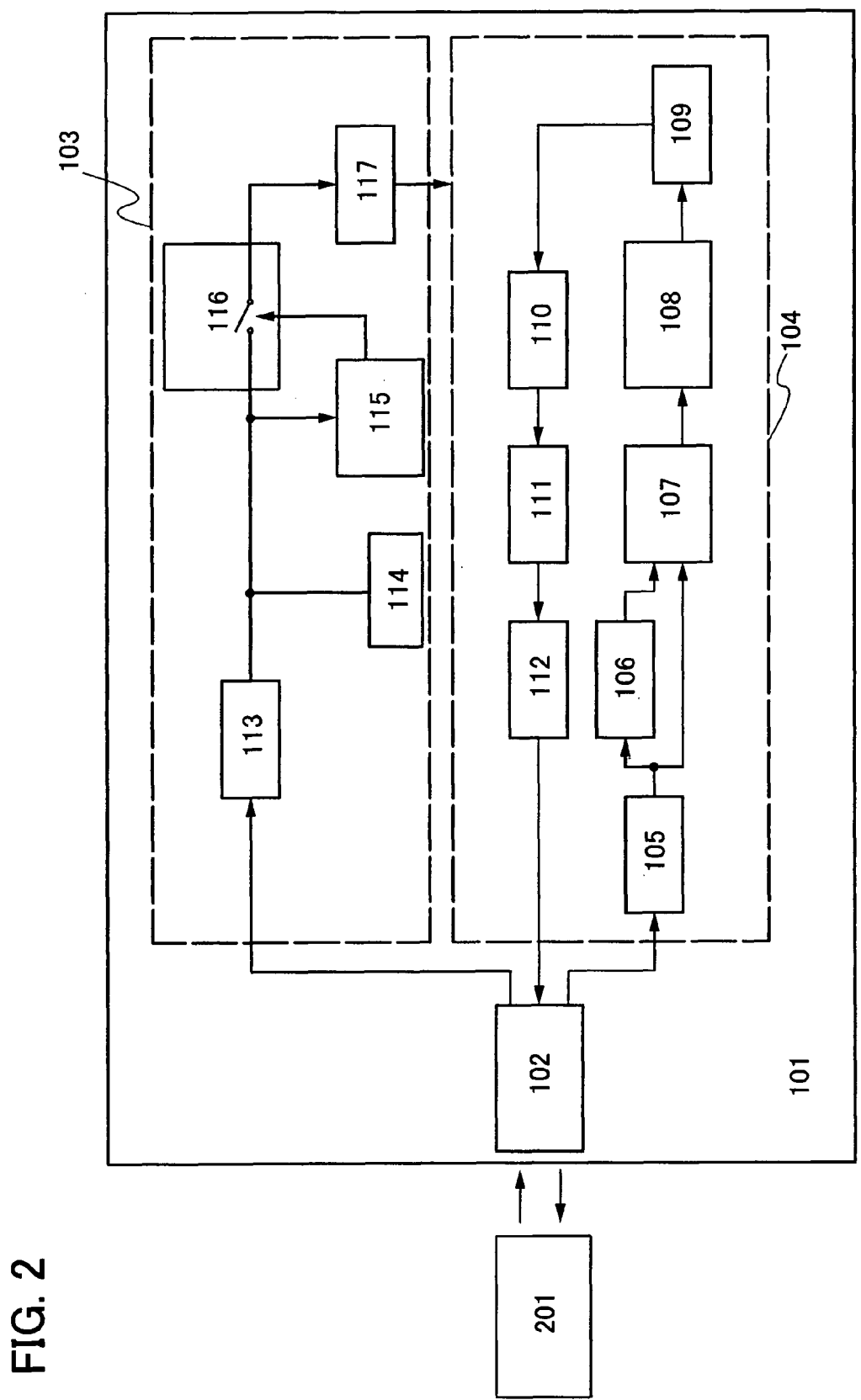
FIG. 2 illustrates a structure of Embodiment Mode 1.

FIG. 2 shows a block diagram where the antenna circuit 102 transmits and receives a signal to and from a reader/writer 201 and then charging is performed in accordance with the signal from the reader/writer 201. In FIG. 2, the signal received by the antenna circuit 102 is inputted into the power supply circuit 103 and the signal control circuit 104.

In FIG. 2, a signal inputted into the power supply circuit 103 by the antenna circuit 102 is inputted into the power source circuit 117 through the rectifier circuit 113 and the switching circuit 116. In addition, in FIG. 2, the signal received by the antenna circuit 102 is inputted into the battery 114 through the rectifier circuit 113 to charge the battery 114. Moreover, in FIG. 2, the signal received by the antenna circuit 102 is inputted into the low-frequency signal generation circuit 115 through the rectifier circuit 113. Further, the low-frequency signal generation circuit 115 outputs a signal that controls on/off of the switching circuit 116.

In addition, in FIG. 2, a signal inputted into the signal control circuit 104 by the antenna circuit 102 is inputted into the demodulation circuit 106 through the amplifier circuit 105, and then, the signals are demodulated by the demodulation circuit 106. The signals are inputted into the modulation circuit 112 through the logic circuit 107, the memory control circuit 108, the memory circuit 109, the logic circuit and the amplifier circuit 111, and then, modulated by the modulation circuit 112. Then, the signals are transmitted to the reader/writer 201 by the antenna circuit 102.

Figure 4A:
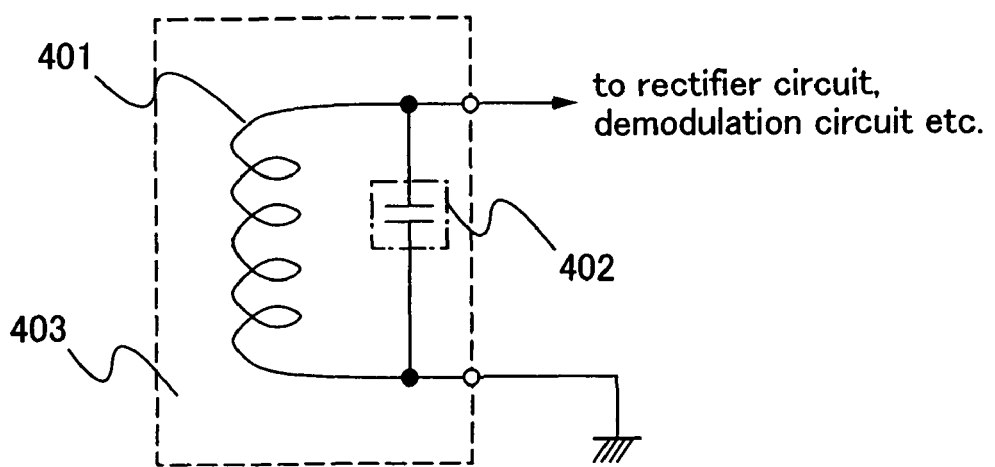
FIGS. 4A and 4B each illustrate a structure of Embodiment Mode 1.
Figure 4B:
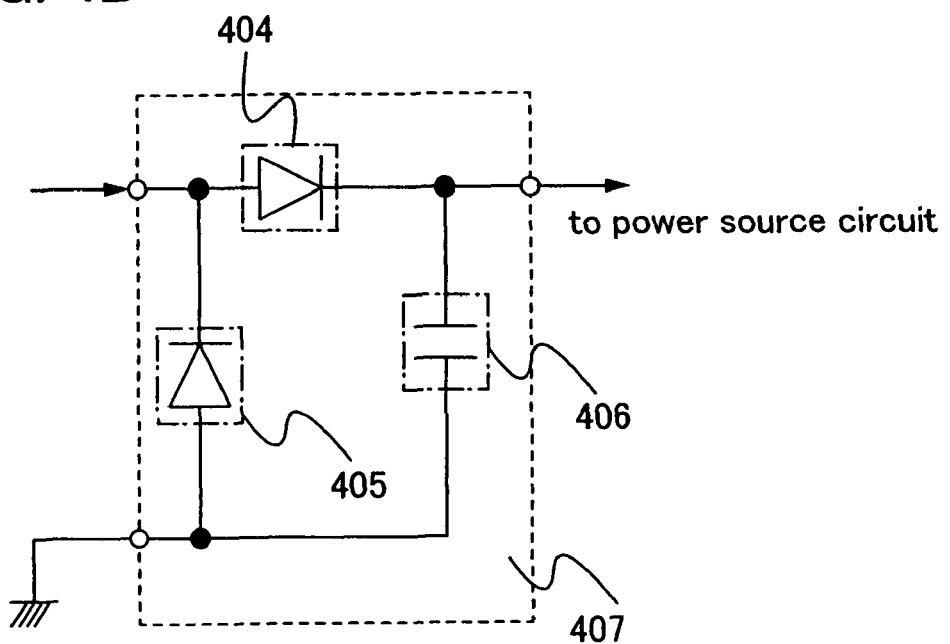

Note that the antenna circuit 102 can be formed of an antenna 401 and a resonant capacitor 402 as shown in FIG. 4A, and the antenna 401 and the resonant capacitor 402 are collectively regarded as the antenna circuit 102. It is only necessary that the rectifier circuit 113 converts an AC signal inducted by an electromagnetic wave received by the antenna circuit 102 into a DC signal by rectifying and smoothing the AC signal. For example, as shown in FIG. 4B, a rectifier circuit 407 may be formed of a diode 404, a diode 405, and a smoothing capacitor 406.

In the power source circuit 117 in each of FIGS. 1 and 2, signals of carrier waves are rectified in the rectifier circuit 113 so that power can be supplied to the power source circuit 117 through the switching circuit 116. Power of the battery 114 can be supplied to the power source circuits 117 through the switching circuit 116 when enough power cannot be obtained from the antenna circuit 102 of the RFID 101 in the case where the communication distance is extended.

Moreover, also a shape of the antenna provided in the antenna circuit 102 of FIGS. 1 and 2 is not particularly limited. In other words, an electromagnetic coupling method, an electromagnetic induction method, a microwave method, or the like can be used as a signal transmission method applied to the antenna circuit 102 of the RFID 101. The transmission method may be appropriately selected in consideration of a use, and an antenna having an optimal length and shape may be provided depending on the transmission method.

In the case of employing, for example, an electromagnetic coupling method or an electromagnetic induction method (for example, a 13.56 MHz band) as the transmission method, electromagnetic induction caused by change in magnetic field density is used. Therefore, a conductive film serving as an antenna is formed to have an annular shape (for example, a loop antenna) or a spiral shape (for example, a spiral antenna).

In the case of employing, for example, a microwave method (a UHF band (860 to 960 MHz band), a 2.45 GHz band, or the like) as the transmission method, the shape and the length of the conductive film serving as the antenna may be appropriately set in consideration of a wavelength of an electromagnetic wave used for signal transmission. For example, the conductive film serving as the antenna can be formed in a linear shape (for example, a dipole antenna), a flat shape (for example, a patch antenna), or the like. The shape of the conductive film serving as the antenna is not limited to a linear shape, and the conductive film serving as the antenna may be provided in a curved-line shape, a meandering shape, or a combination thereof, in consideration of a wavelength of an electromagnetic wave.

Note that a frequency of a signal transmitted and received between the antenna circuit 102 and the reader/writer 201 is 125 kHz, 13.56 MHz, 915 MHz, 2.45 GHz, or the like, and each of which is standardized by ISO or the like. Of course, the frequency of the signal transmitted and received to and from the antenna circuit 102 and the reader/writer 201 is not limited thereto, and for example, any of the following frequencies can be used: a submillimeter wave of greater than or equal to 300 GHz and less than 3 THz; a millimeter wave of greater than or equal to 30 GHz and less than 300 GHz; a microwave of greater than or equal to 3 GHz and less than 30 GHz; an ultrashort wave of greater than or equal to 300 MHz and less than 3 GHz; a very short wave of greater than or equal to 30 MHz and less than 300 MHz; a short wave of greater than or equal to 3 MHz and less than 30 MHz; a medium wave of greater than or equal to 300 KHz and less than 3 MHz; a long wave of greater than or equal to 30 KHz and less than 300 KHz; and a very long wave of greater than or equal to 3 KHz and less than 30 KHz. In addition, the signal transmitted and received to and from the antenna circuit 102 and the reader/writer 201 is a signal in which a carrier wave is modulated. A modulation method of the carrier wave may be either analog modulation or digital modulation, or may be any of amplitude modulation, phase modulation, frequency modulation, and spread spectrum. Preferably, amplitude modulation or frequency modulation may be used.

Figure 3A:
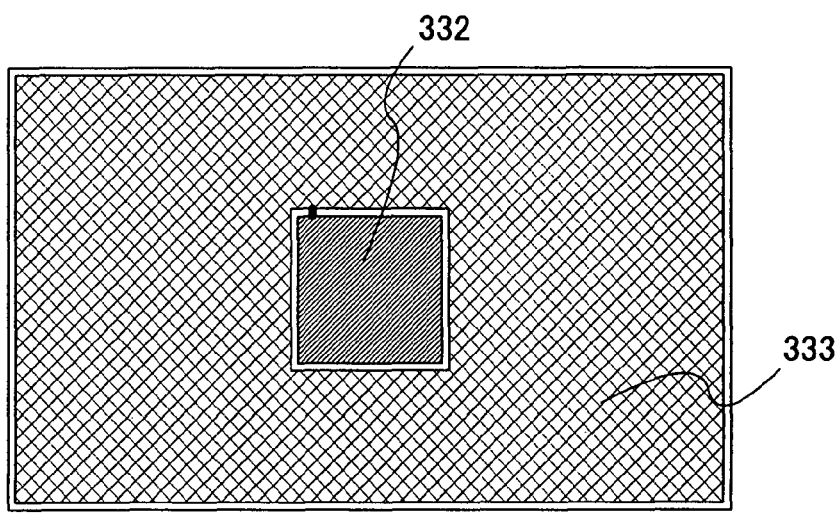
FIGS. 3A to 3E each illustrate a structure of Embodiment Mode 1.
Figure 3B:
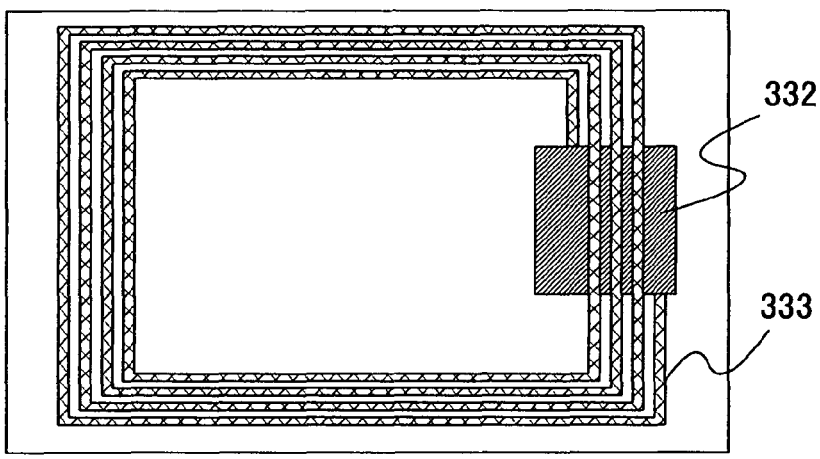
Figure 3C:
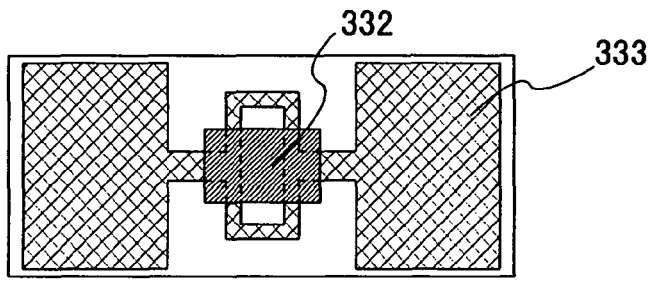
Figure 3D:
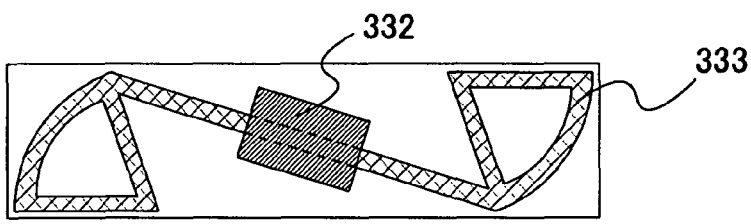
Figure 3E:
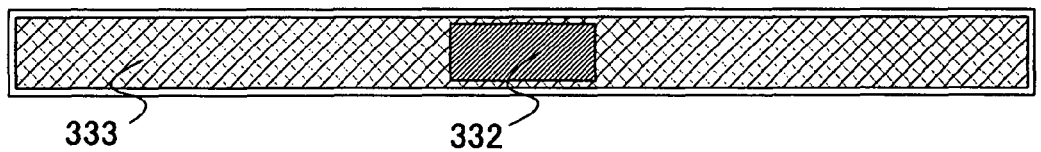

Here, FIGS. 3A to 3E show examples of shapes of the antenna provided for the antenna circuit 102. For example, as shown in FIG. 3A, an antenna 333 may be provided on the periphery of a chip 332 provided with the signal control circuit and the power supply circuit. As shown in FIG. 3B, an antenna 333 that is thin may be provided over a chip 332 provided with the signal control circuit. As shown in FIG. 3C, an antenna 333 may receive a high-frequency electromagnetic wave with respect to a chip 332 provided with the signal processing circuit. As shown in FIG. 3D, an antenna 333 may be 180° omnidirectional (capable of receiving signals in any direction) with respect to a chip 332 provided with the signal processing circuit. As shown in FIG. 3E, an antenna 333 may be extended to be long as a stick with respect to a chip 332 provided with the signal processing circuit. The antennas having these shapes can be used for the antenna circuit.

In addition, in FIGS. 3A to 3E, there is no specific limitation with regard to a connection of the chip 332 provided with a signal control circuit and the antenna. For example, the antenna 333 and the chip 332 provided with a signal control circuit may be connected by wire bonding connection or bump connection. Alternatively, the chip may be attached to the antenna 333 with part of the chip being an electrode. In this method, an ACF (Anisotropically Conductive Film) can be used to attach the chip 332 to the antenna 333. An appropriate length necessary for an antenna varies depending on frequency for receiving signals. Therefore, the length is a submultiple of a wavelength. For example, in the case where a frequency is 2.45 GHz, the length of antenna may be approximately 60 mm (½ wavelength) and approximately 30 mm (¼ wavelength).

Figure 5:
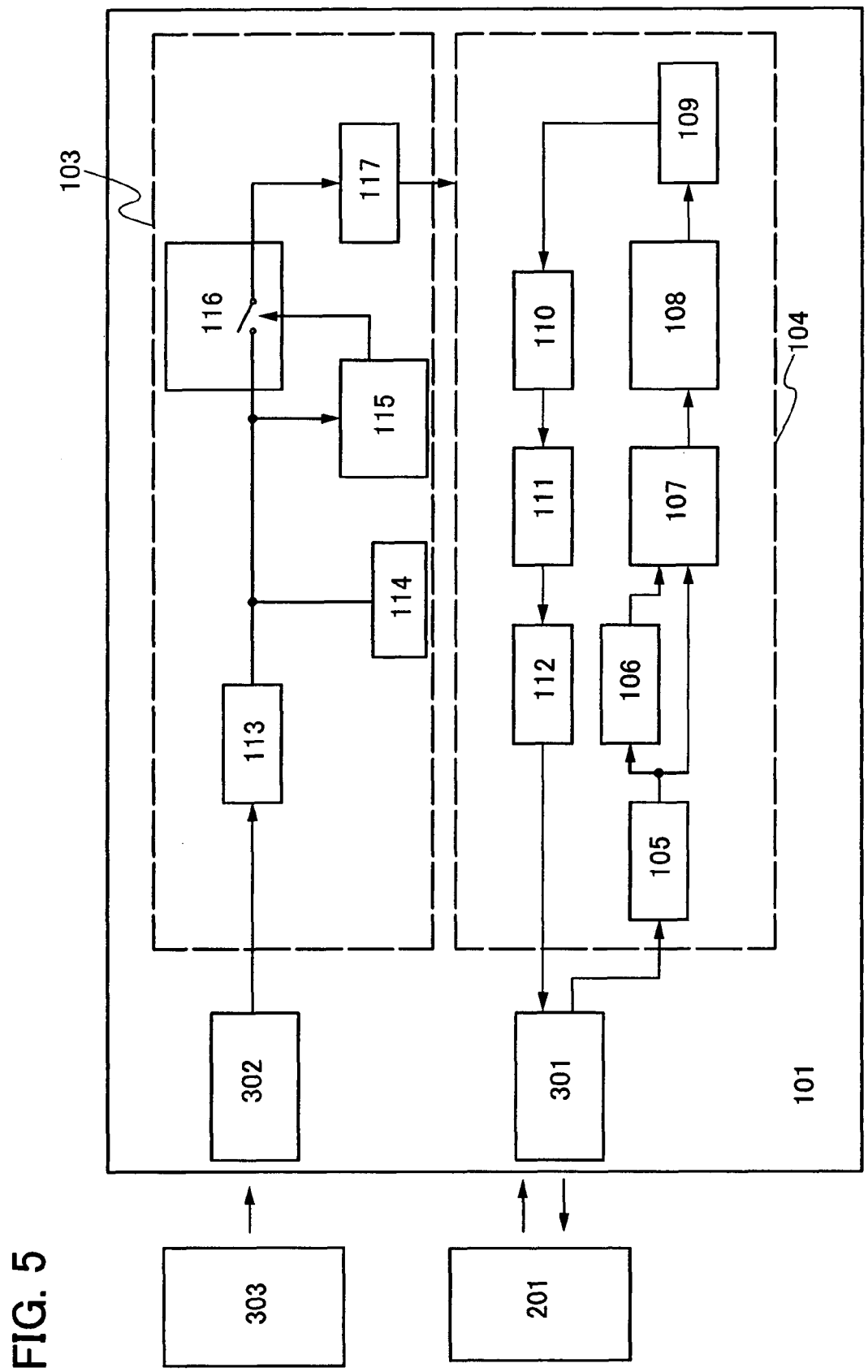
FIG. 5 illustrates a structure of Embodiment Mode 1.

FIG. 5 shows an RFID having the structures where the number of antenna circuits is more than those shown in FIG. 1 and FIG. 2. As shown in FIG. 5, a first antenna circuit 301 for the signal control circuit 104 and a second antenna circuit 302 for the power supply circuit 103 are used instead of the antenna circuit 102 in the RFID 101. In this case, it is preferable that a wireless signal for supplying power to the power supply circuit 103 be supplied from a charger 303, not from a reader/writer 201. It is preferable that the wireless signal transmitted to the second antenna circuit 302 be a signal having a frequency different from that of the signal transmitted from the reader/writer 201 in order to avoid interference with the signal transmitted from the reader/writer 201.

Note that, in the structure shown in FIG. 5, without limitation to the signal received from the charger 303, the second antenna circuit 302 may receive another wireless signal in the space to supply the signal to the power supply circuit. For example, the following can be used as a wireless signal (a radio wave) received by the second antenna circuit 302 in order to charge the battery 114 of the RFID 101: a radio wave of a relay station of a cellular phone (800 to 900 MHz band, 1.5 GHz band, 1.9 to 2.1 GHz band, or the like); a radio wave generated from a cellular phone; a radio wave of a radio wave clock (40 kHz or the like); noise of a home AC power source (60 Hz or the like); a radio wave randomly generated from another reader/writer (reader/writer which does not directly communicate with the RFID 101); or the like.

Since the battery is charged wirelessly by reception of the external wireless signal, an additional charger or the like for charging the battery is not necessary; therefore, the RFID can be provided at lower cost. The length and shape of the antenna of the second antenna circuit 302 is set to have such length and shape that the antenna can receive these wireless signals easily. In a case of receiving plural kinds of radio waves (having different frequencies), a plurality of antenna circuits which include antennas having different lengths and different shapes are preferably provided.

In addition, in the present invention, the RFID operates intermittently so that reduction of power consumption can be achieved by control of on/off of the switching circuit 116 by a signal from the low-frequency signal generation circuit 115. General RFIDs operate constantly by reception of signals from a reader/writer; however, the RFIDs do not always have to respond constantly in some cases depending on the content of data or the use of the RFIDs. In accordance with this invention, in such a case, the operation of the RFID is stopped so that consumption of power stored in the battery can be reduced. Only the low-frequency signal generation circuit 115 in FIGS. 1 and 2 operates constantly in the semiconductor device of the present invention. The low-frequency signal generation circuit 115 operates based on power stored in the battery 114.

In the present invention, a battery refers to a battery which can restore continuous operating time by being charged. Note that, as a battery, a battery formed in a sheet shape with a thickness of 1 to several µm is preferably used. For example, a lithium battery, preferably, a lithium polymer battery using a gel-like electrolyte, a lithium ion battery, or the like is used. Accordingly, the battery can be reduced in its size. Of course, any battery can be used as long as the battery can be charged, and a battery capable of charging and discharging such as a nickel-metal-hydride battery or a nickel-cadmium battery may be used or a capacitor having high capacity or the like may also be used.

Next, an example of the power source circuit 117 in FIGS. 1 and 2 will be explained with reference to FIG. 6.

The power source circuit 117 includes a reference voltage circuit and a buffer amplifier circuit. The reference voltage circuit includes a resistor 1000, and diode-connected transistors 1002 and 1003, and generates a reference voltage corresponding to twice a Vgs of a transistor. The buffer amplifier circuit includes a differential circuit formed of transistors 1005 and 1006, a current mirror circuit formed of transistors 1007 and 1008, a current supply resistor 1004, and a common source amplifier circuit formed of a transistor 1009 and a resistor 1010.

Figure 6:
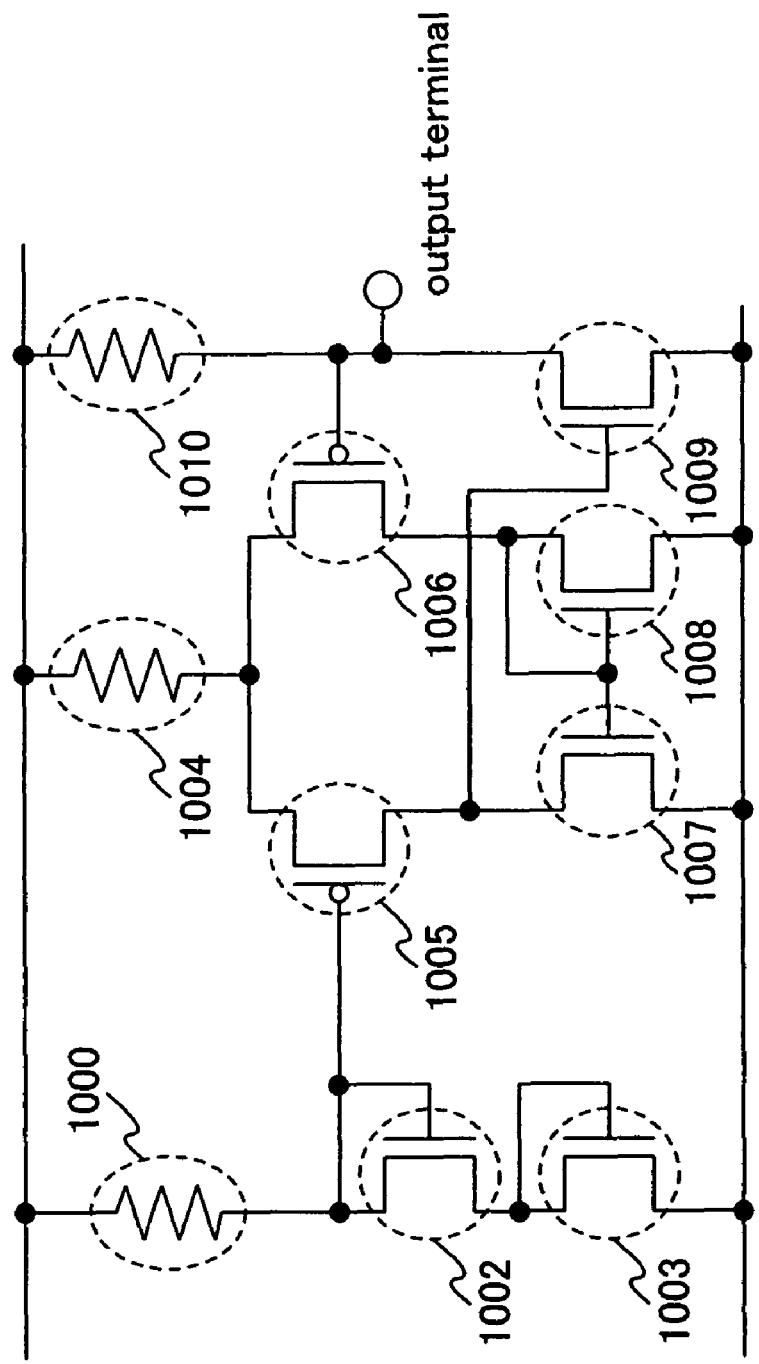
FIG. 6 illustrates a structure of Embodiment Mode 1.

In the power source circuit shown in FIG. 6, when the amount of current flowing from an output terminal is large, the amount of current flowing through the transistor 1009 is reduced; when the amount of current flowing from the output terminal is small, the amount of current flowing through the transistor 1009 is increased; and a current flowing through the resistor 1010 is almost constant. The potential of the output terminal has almost the same value as that of the reference voltage circuit. Although the power source circuit including the reference voltage circuit and the buffer amplifier circuit is shown here, a power source circuit used in the present invention is not limited to that of FIG. 6, and the power source circuit may be a circuit having another form.

Next, an operation in writing data into the signal control circuit 104 of the RFID 101 shown in FIGS. 1 and 2 by the reader/writer 201 will be explained below. The signal received by the antenna circuit 102 is inputted into the logic circuit 107 as a clock signal through the amplifier circuit 105. Further, the signal inputted from the antenna circuit 102 is demodulated in the demodulation circuit 106, and then inputted as data into the logic circuit 107.

In the logic circuit 107, the inputted data is decoded. The reader/writer 201 encodes data by a transform mirror code, an NRZ-L code, or the like to transmit, and then the logic circuit 107 decodes the data. When the decoded data is transmitted to the memory control circuit 108, the data is written to the memory circuit 109 in accordance with the decoded data. The memory circuit 109 is necessary to be a nonvolatile memory circuit which can hold data even when a power source is shut off; thus, a mask ROM or the like is used.

In order to read data stored in the memory circuit 109, which is in the signal control circuit 104 of the RFID 100 shown in FIGS. 1 and 2, the reader/writer 201 operates as described below. An AC signal received by the antenna circuit 102 is inputted into the logic circuit 107 through the amplifier circuit 105, and a logic operation is performed. Then, the signal from the logic circuit 107 is used to control the memory control circuit 108, and the data stored in the memory circuit 109 is called up. After the data called from the memory circuit 109 is processed in the logic circuit 110 and then amplified in the amplifier circuit 111, the modulation circuit 112 is operated. Data is processed in accordance with a method prescribed by ISO 14443, ISO 15693, ISO 18000, or the like. A method prescribed by another standard may also be used as long as consistency with a reader/writer can be ensured.

When the modulation circuit 112 operates, impedance of the antenna circuit 102 varies. Accordingly, a signal of the reader/writer 201, which is reflected in the antenna circuit 102, is changed. The change is read by the reader/writer, which makes it possible to know data stored in the memory circuit 109 of the RFID 101. Such a modulation method is referred to as a load modulation method.

Note that transistors of various modes can be applied to a transistor provided for the signal control circuit 104. Thus, kinds of transistors applicable to the present invention are not limited. Therefore, the following transistors are applicable to the present invention: a thin film transistor (TFT) using a non-single crystal semiconductor film comprising a material typified by amorphous silicon and polycrystalline silicon; a transistor which is formed using a semiconductor substrate or an SOI substrate; a MOS transistor; a junction transistor; a bipolar transistor; a transistor using a compound semiconductor such as ZnO or a-InGaZnO; a transistor using an organic semiconductor or a carbon nanotube; and other transistors. Note that a non-single crystal semiconductor film may also contain hydrogen or halogen. A substrate over which the signal control circuit 104 is provided is not limited to a particular type and various kinds of substrates can be used. Thus, the signal control circuit 104 can be provided using, for example, a single crystal substrate, an SOI substrate, a glass substrate, a quartz substrate, a plastic substrate, a paper substrate, a cellophane substrate, a stone substrate, or the like. Moreover, the signal control circuit 104 formed over a certain substrate may be moved to another substrate to be provided thereover.

Next, an operation in charging power to the RFID 101 shown in FIGS. 1 and 2 by an external wireless signal will be explained below. An external wireless signal received by the antenna circuit 102 is half-wave rectified and then smoothed by the rectifier circuit 113. Then, power outputted from the rectifier circuit 113 is supplied to the power source circuit 117 through the switching circuit 116, and surplus power is stored in the battery 114.

As described above, the RFID operated intermittently so that reduction of power consumption can be achieved in the present invention. In general, the RFID operates constantly by reception of the signal from the reader/writer; however, the RFID does not always have to respond constantly in some cases depending on the content of data or the use of the RFID. In such a case, the operation of the RFID is stopped so that consumption of power stored in the battery can be reduced. Only the low-frequency signal generation circuit 115 in FIGS. 1 and 2 operates constantly in the present invention.

The low-frequency signal generation circuit 115 operates based on power stored in the battery 114. An output waveform of the low-frequency signal generation circuit will be explained with reference to FIG. 7.

Figure 7:
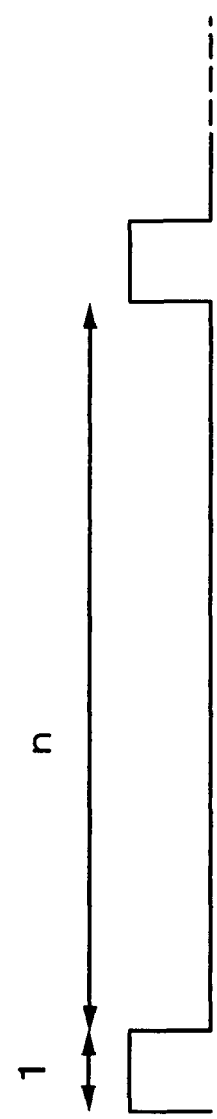
FIG. 7 illustrates a structure of Embodiment Mode 1.

FIG. 7 shows a waveform of a signal that is outputted from the low-frequency signal generation circuit to the switching circuit by. In an example of FIG. 7, a duty ratio of the output waveform is set 1:n (n is an integer) so that power consumption can be set approximately 1/(n+1). The switching circuit 116 is driven in accordance with this signal. The switching circuit 116 connects the battery 114 and the power source circuit 117 only during a period where the output signal is high; therefore, the RFID is operated only during the period.

Figure 8:
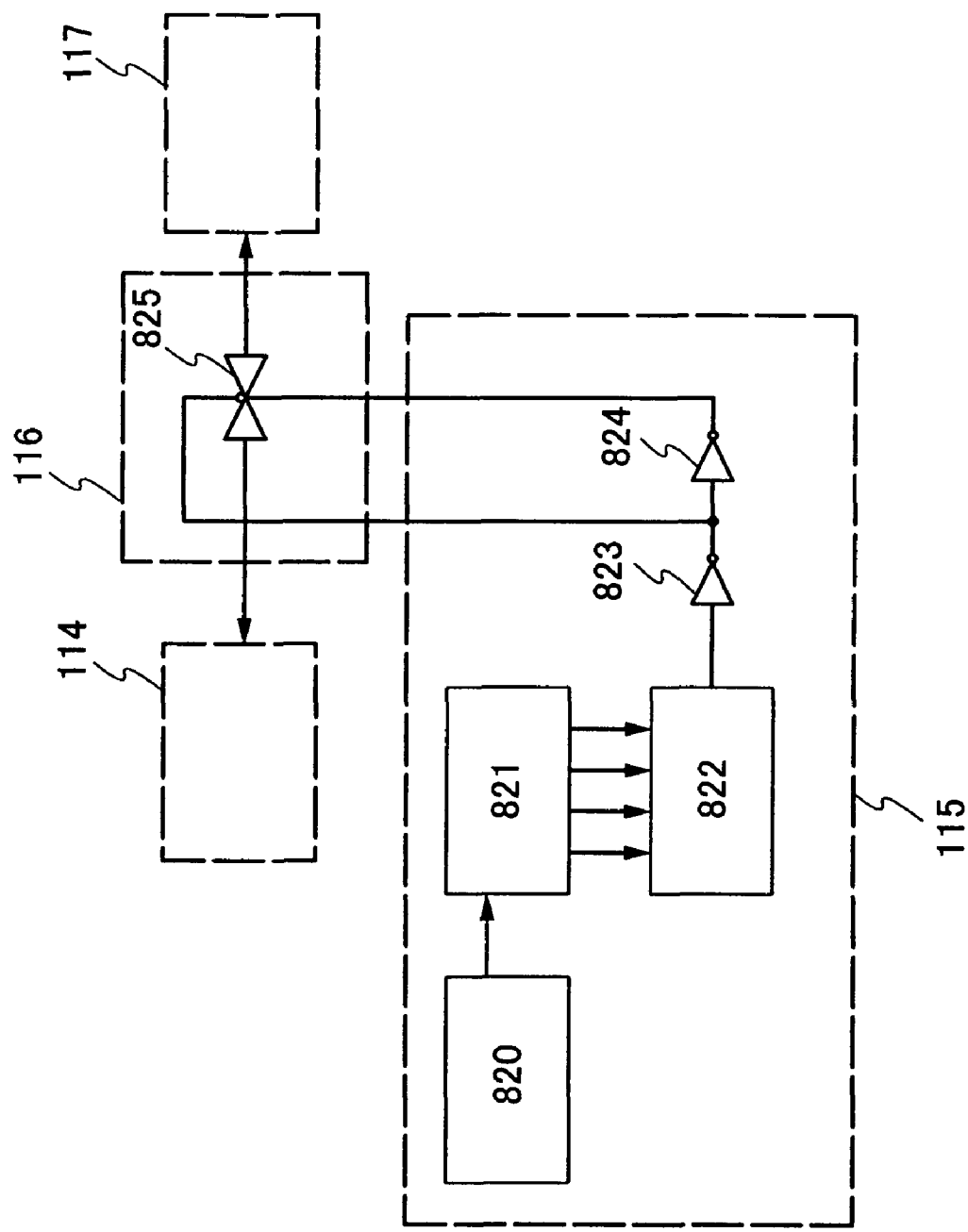
FIG. 8 illustrates a structure of Embodiment Mode 1.

FIG. 8 explains a specific structural example of the low-frequency signal generation circuit in FIGS. 1 and 2. A low-frequency signal generation circuit 115 of FIG. 8 includes a ring oscillator 820, a divider circuit 821, an AND circuit 822, and inverters 823 and 824. An oscillation signal of the ring oscillator 820 is frequency-divided with the divider circuit 821 and the output is inputted into the AND circuit 822 to generate a low-duty ratio signal with the AND circuit 822. Further, the output of the AND circuit 822 is inputted into the switching circuit 116 including a transmission gate 825 through the inverters 823 and 824. The ring oscillator 820 is a ring oscillator that oscillates with a low frequency, and oscillation is performed at 1 kHz, for example.

Figure 9:
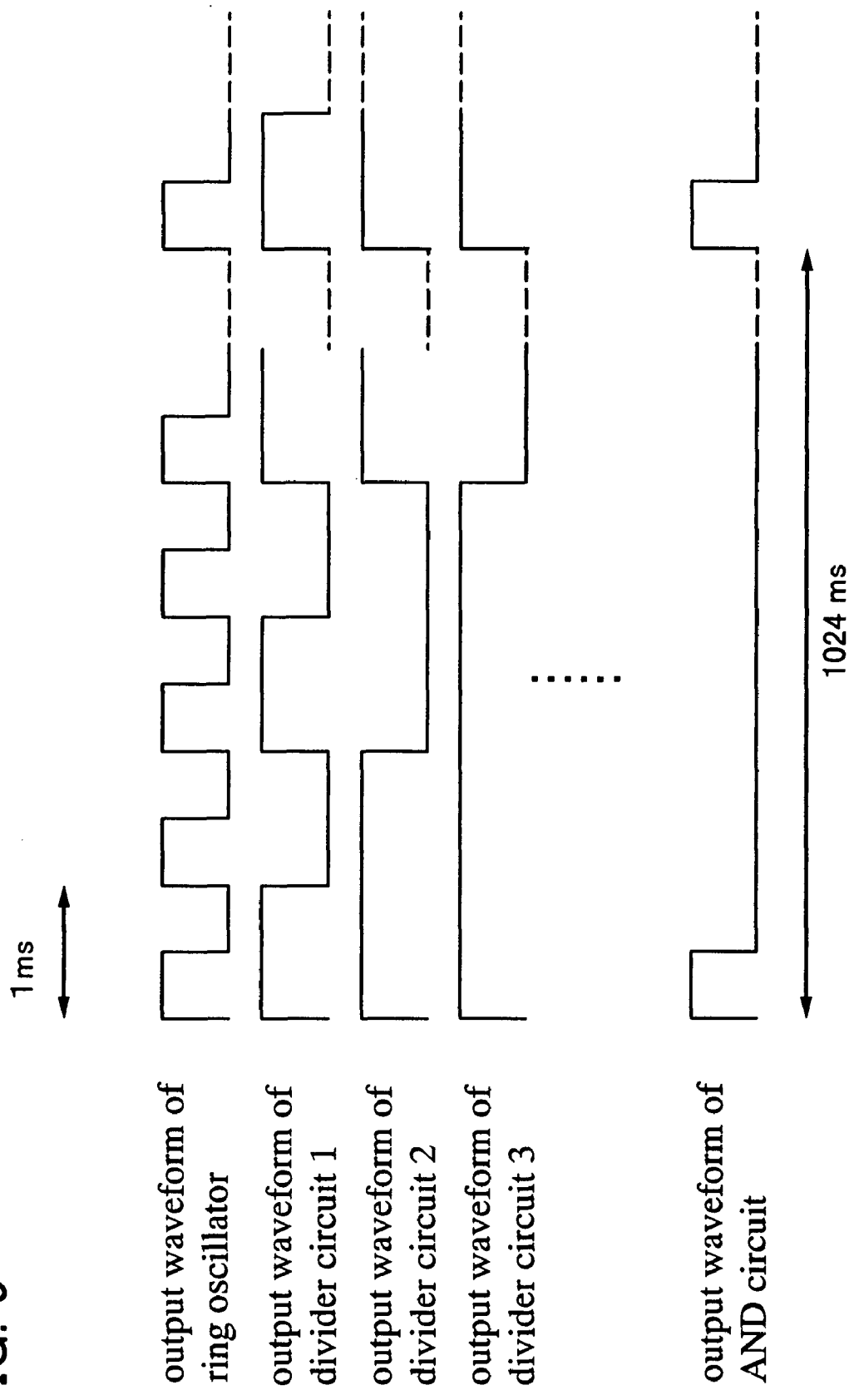
FIG. 9 illustrates a structure of Embodiment Mode 1.

FIG. 9 shows a timing chart of a signal outputted from each structure of the low-frequency signal generation circuit 115 shown in FIG. 8. FIG. 9 shows an output waveform of the ring oscillator 820, an output waveform of the divider circuit 821, and an output waveform of the AND circuit 822. When the divider circuit 821 is a divider circuit, where the number of division is 1024, signals that are sequentially frequency-divided as shown in FIG. 9, that is, a divider circuit output waveform 1, a divider circuit output waveform 2, and a divider circuit output waveform 3 are sequentially output as output signals of the divider circuit. When the divider circuit 821 is a divider circuit, where the number of division is 1024, as an example of this embodiment mode, a signal which is outputted from the AND circuit 822, into which a plurality of signals outputted from the divider circuit 821 is inputted, can be formed as a signal the duty ratio of which is 1:1024. As long as the repetition rate of the ring oscillator 820 is 1 KHz at this time, an operation period is 0.5 us and a non-operation period is 512 us in one period. The repetition rate of the ring oscillator is not limited to 1 KHz and another repetition rate may also be employed. In addition, the number of division in divider circuit is not limited to 1024 and another value may also be employed.

Then, the signal outputted from the low-frequency signal generation circuit of the present invention can periodically control on/off of the transmission gate of the switching circuit 116 and control the supply of power to the power source circuit from the battery 114. In other words, power is intermittently supplied to the signal control circuit from the battery 114 so that low power consumption of the RFID can be achieved.

In the RFID of the present invention, a signal is transmitted at the rate of a certain period with respect to the signal from the reader/writer so that power consumption can be reduced adequately enough. Additionally, the wireless signal inputted from outside the RFID is received by the antenna circuit and power is stored in the battery in the power supply circuit so that power supplied to the signal control circuit can be operated without being supplied periodically by the antenna circuit. In addition, power of the signal received from the antenna circuit and power stored in the battery are compared by the control circuit so as to select whether power is supplied from the rectifier circuit or supplied from the battery to the power source circuit. Accordingly, this is preferable because much lower power consumption can be achieved.

As described above, a semiconductor device of the present invention including an RFID has a battery; therefore, as in the conventional technique, shortage of power for transmitting and receiving individual information in accordance with deterioration over time of a battery can be prevented. In addition, a semiconductor device of the present invention has an antenna that receives a signal for supplying power to the battery. Therefore, the semiconductor device can charge the battery with the utilization of a wireless signal from outside as a power source for driving the RFID without being directly connected to a charger. Consequently, it becomes possible to continuously use the semiconductor device without check of remaining charge capacity of a battery or replacement of the battery, which is necessary in the case of an active RFID. Additionally, power for driving the RFID is always retained in the battery, whereby power which is enough for an operation of the RFID can be obtained and communication distance with the reader/writer can be extended.

Note that this embodiment mode can be implemented by freely being combined with other embodiment modes of this specification.

(Embodiment Mode 2)

This embodiment mode will explain a semiconductor device, which is the RFID having the structure described in Embodiment Mode 1 of the above, and additionally having a control circuit for controlling selection between power supplied from the rectifier circuit and that supplied from the battery, as power supplied to the power source circuit of the power supply circuit, with reference to drawings. Note that, as for the drawings used in this embodiment mode, the same portions as those in Embodiment Mode 1 are denoted by the same reference numerals in some cases.

One structural example of the semiconductor device of the present invention in this embodiment mode will be explained with reference to block diagrams shown in FIGS. 10 and 11. Note that this embodiment mode will explain the case where a semiconductor device is used as an RFID.

Figure 10:
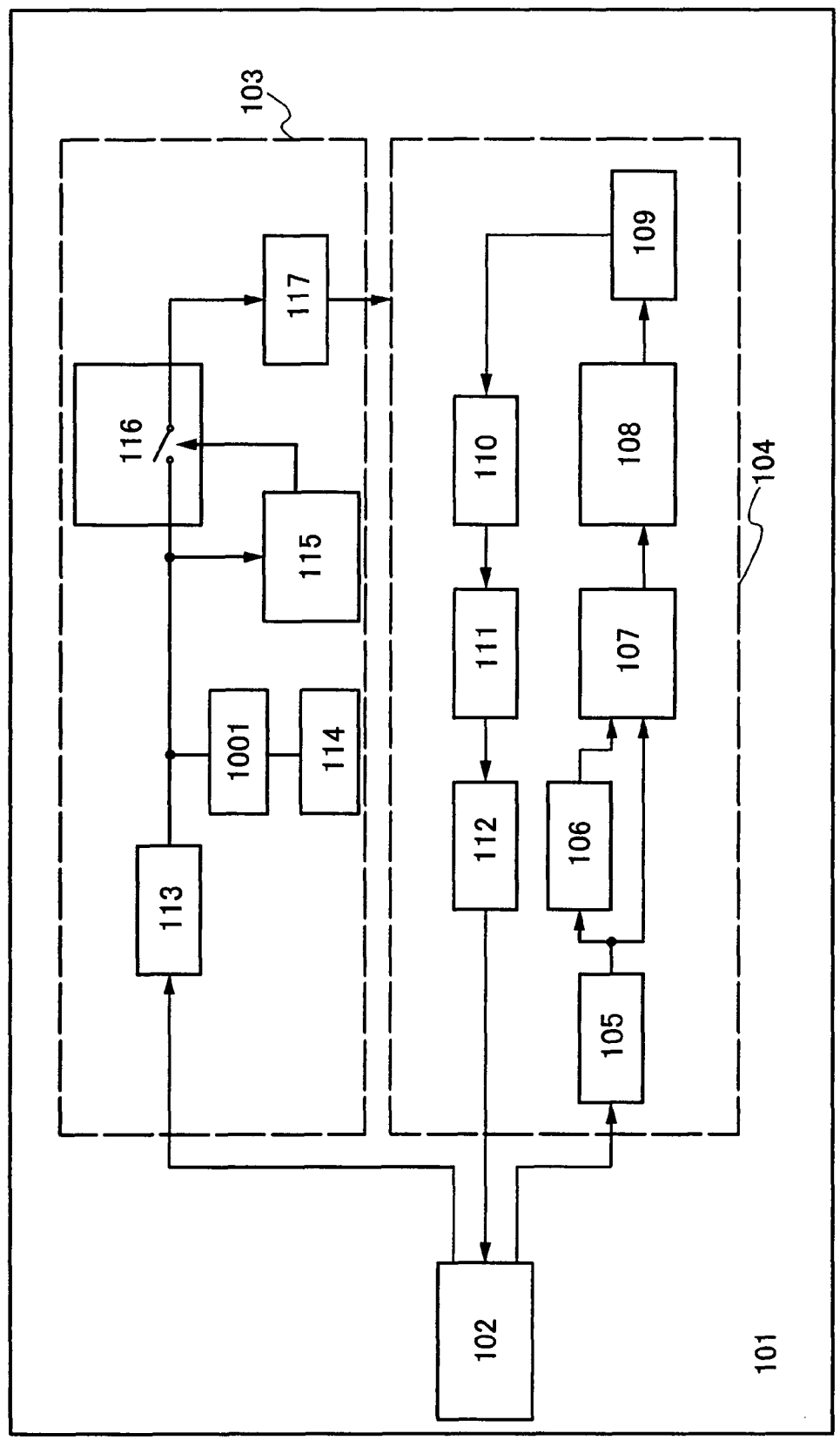
FIG. 10 illustrates a structure of Embodiment Mode 2.

An RFID 101 of FIG. 10 includes an antenna circuit 102, a power supply circuit 103, and a signal control circuit 104. The signal control circuit 104 includes an amplifier circuit 105, a demodulation circuit 106, a logic circuit 107, a memory control circuit 108, a memory circuit 109, a logic circuit 110, an amplifier circuit 111, and a modulation circuit 112. In addition, the power supply circuit 103 includes a rectifier circuit 113, a control circuit 1001, a battery 114, a low-frequency signal generation circuit 115, a switching circuit 116, and a power source circuit 117. The difference from the structure of FIG. 1 in Embodiment Mode 1 is that there is the control circuit 1001 between the rectifier circuit 113 and the battery 114.

Figure 11:
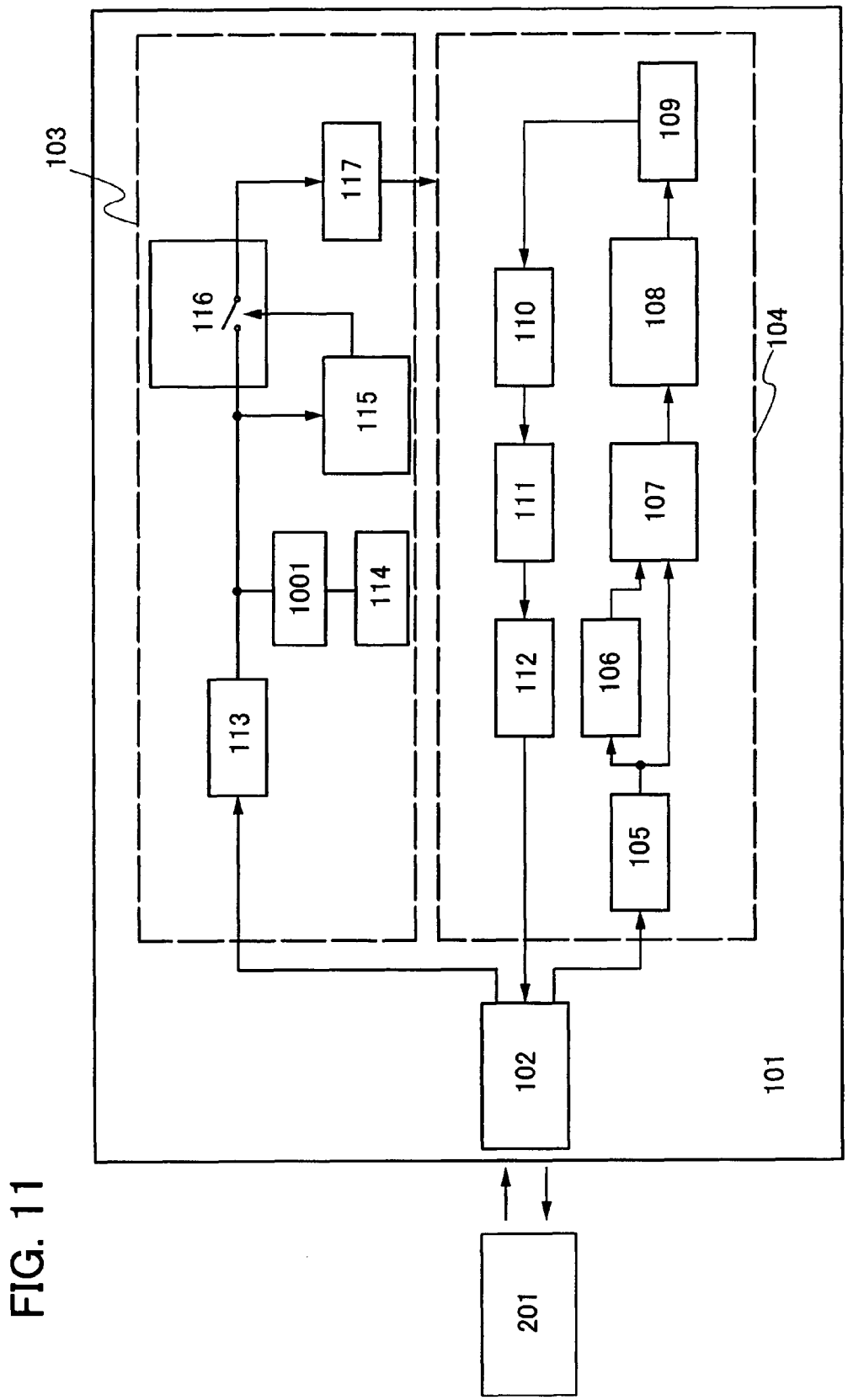
FIG. 11 illustrates a structure of Embodiment Mode 2.

FIG. 11 shows a block diagram where the antenna circuit 102 transmits and receives a signal to and from a reader/writer 201 and then charging is performed in accordance with the signal from the reader/writer 201. In FIG. 11, signals received by the antenna circuit 102 are inputted into the power supply circuit 103 and the signal control circuit 104.

In FIG. 11, a signal inputted into the power supply circuit 103 by the antenna circuit 102 is inputted into the power source circuit 117 through the rectifier circuit 113 and the switching circuit 116. In addition, in FIG. 11, the signal received by the antenna circuit 102 is inputted into the battery 114 through the rectifier circuit 113 and the control circuit 1001 to charge the battery 114.

In addition, in FIG. 11, signals inputted into the signal control circuit 104 by the antenna circuit 102 is inputted into the demodulation circuit 106 through the amplifier circuit 105, and then, the signals are demodulated by the demodulation circuit 106. The signals are inputted into the modulation circuit 112 through the logic circuit 107, the memory control circuit 108, the memory circuit 109, the logic circuit 110, and the amplifier circuit 111, and then, the signals are modulated by the modulation circuit 112. Then, the signals are transmitted to the reader/writer 201 by the antenna circuit 102.

Note that any antenna circuit is acceptable as the antenna circuit 102 as long as it has the structure shown in FIG. 4A described in Embodiment Mode 1. In addition, any rectifier circuit is acceptable as the rectifier circuit 113 as long as it has the structure shown in FIG. 4B described in Embodiment Mode 1.

In addition, as for the antenna circuit 102 in FIGS. 10 and 11, explanation thereof is similar to that of the antenna circuit 102 which is described in Embodiment Mode 1; therefore, the explanation is omitted here.

Note that, as an example of an antenna shape provided for the antenna circuit 102, the shapes of FIGS. 3A to 3E which are described in Embodiment Mode 1 may be used and explanation thereof is similar to that of the above; therefore, the explanation is omitted here.

Figure 12:
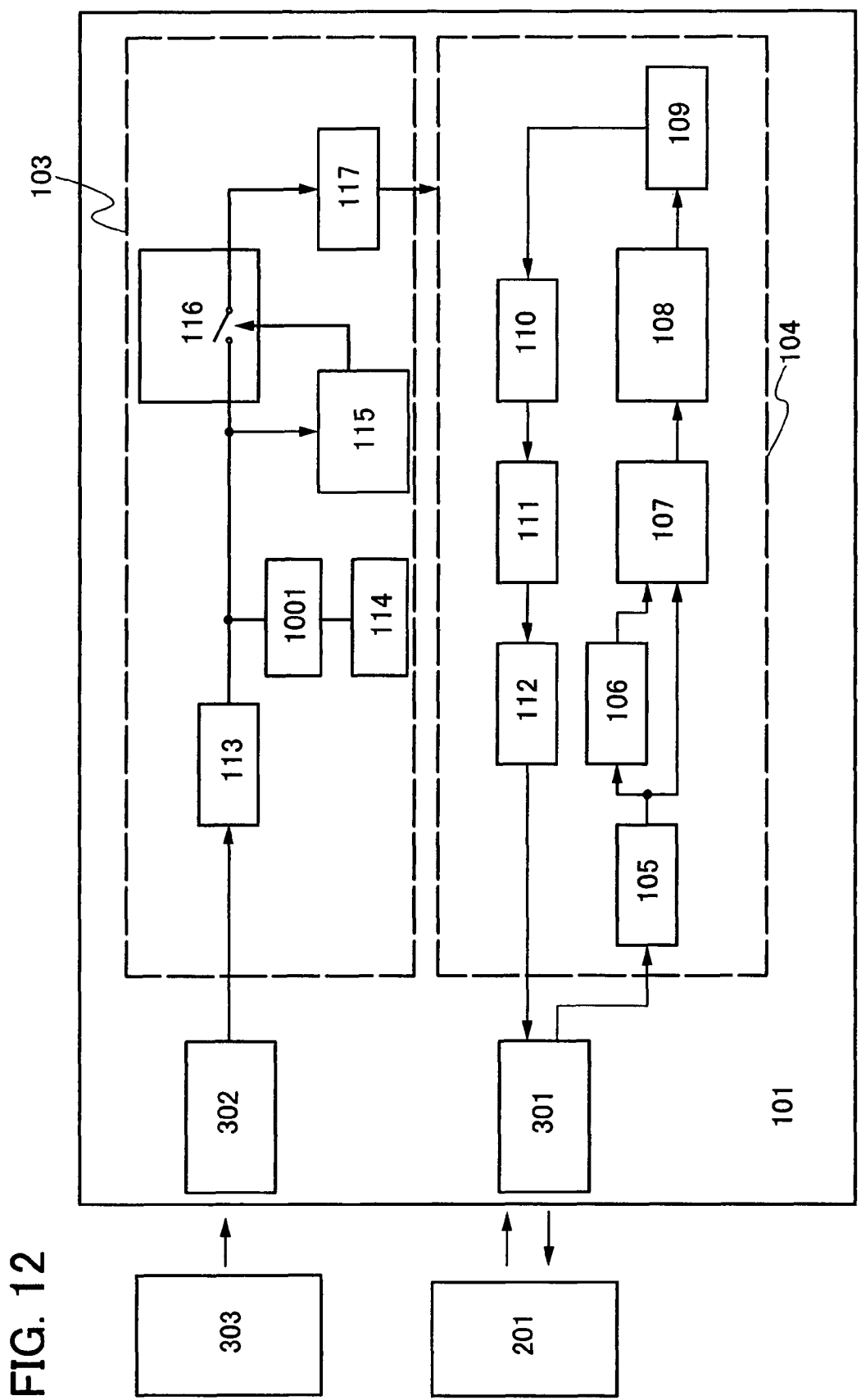
FIG. 12 illustrates a structure of Embodiment Mode 2.

FIG. 12 shows an RFID having the structures shown in FIGS. 10 and 11 while the structure of FIG. 12 has more antenna circuits than FIGS. 10 and 11. The structure shown in FIG. 12 corresponds to the structure of FIG. 5 shown in Embodiment Mode 1. Therefore, explanation thereof is similar to that made in FIG. 5 which is shown in Embodiment Mode 1; therefore, the explanation is omitted here.

The structure of the power source circuit 117 in each of FIGS. 10 and 11 is similar to the explanation of the power source circuit 117 and the structure of FIG. 6 which are described in Embodiment Mode 1; therefore, the explanation is omitted here.

In accordance with this embodiment mode, in the power supply circuit 103, when power outputted from the rectifier circuit 113 is higher enough than power necessary to operate the signal control circuit 104, surplus of power outputted from the rectifier circuit is stored in the battery; and, when power outputted from the rectifier circuit is not enough to operate the signal control circuit, power is supplied also from the battery to the power source circuit.

In this embodiment mode, control of supply to the power source circuit can be realized by the connection between the rectifier circuit 113 and the battery 114 through the control circuit 1001. By the connection between the rectifier circuit 113 and the battery 114, surplus power is stored in the battery 114, and power is supplied from the battery 114 to the power source circuit 117 when power outputted from the rectifier circuit 113 is not enough to operate the signal control circuit.

In addition, an example of the control circuit 1001 shown in FIGS. 10 and 11 will be explained with reference to FIG. 13.

Figure 13:
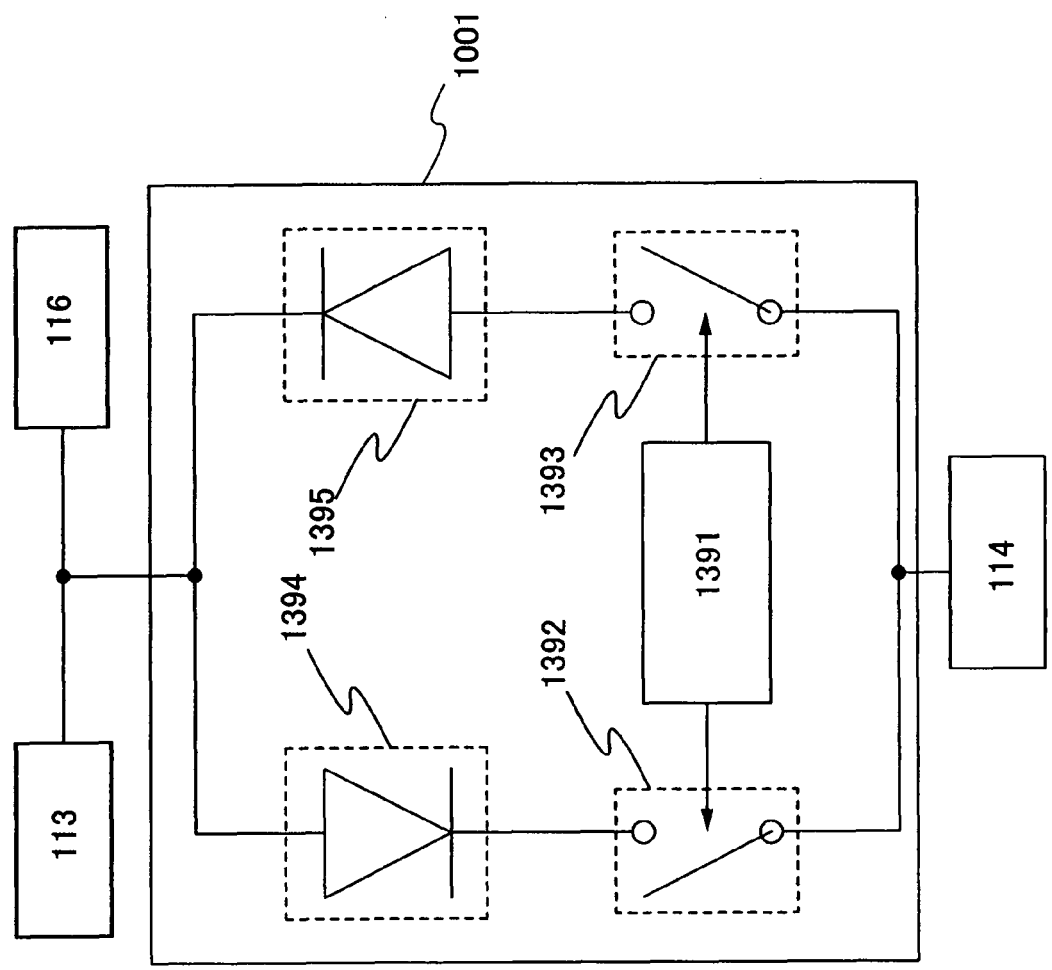
FIG. 13 illustrates a structure of Embodiment Mode 2.

In FIG. 13, the control circuit 1001 includes a rectifier element 1394, a rectifier element 1395, a voltage comparator 1391, a switch 1392, and a switch 1393.

In FIG. 13, the voltage comparator 1391 compares a voltage outputted from the battery 114 with a voltage outputted from the rectifier circuit 113. When the voltage outputted from the rectifier circuit 113 is higher enough than the voltage outputted from the battery 114, the voltage comparator 1391 turns the switch 1392 on and the switch 1393 off. Thus, a current flows to the battery 114 from the rectifier circuit 113 through the rectifier element 1394 and the switch 1392. On the other hand, when the voltage outputted from the rectifier circuit 113 is not higher enough than the voltage outputted from the battery 114, the voltage comparator 1391 turns the switch 1392 off and the switch 1393 on. At this time, if the voltage outputted from the rectifier circuit 113 is higher than the voltage outputted from the battery 114, no current flows to the rectifier element 1395; however, if the voltage outputted from the rectifier circuit 113 is lower than the voltage outputted from the battery 114, current flows to the power source circuit 117 from the battery 114 through the switch 1393, the rectifier element 1395, and the switch circuit 116.

Note that the control circuit 1001 is not limited to the structure explained in this embodiment mode and a structure having another form may also be used.

In addition, an example of the voltage comparator 1391 explained in FIG. 13 will be explained with reference to FIG. 14.

Figure 14:
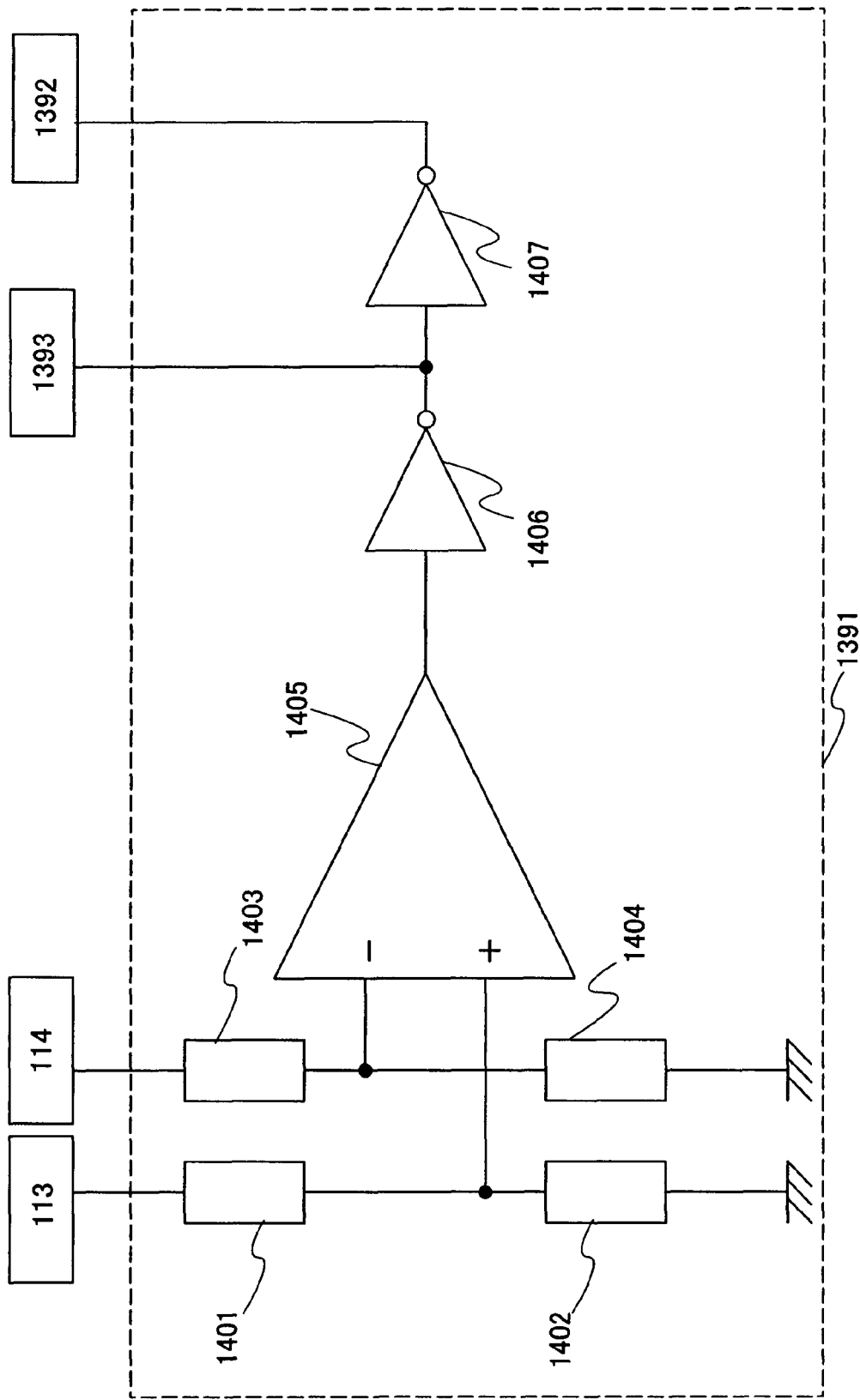
FIG. 14 illustrates a structure of Embodiment Mode 2.

In a structure shown in FIG. 14, the voltage comparator 1391 divides the voltage outputted from the battery 114 with resistance elements 1403 and 1404, divides the voltage outputted from the rectifier circuit 113 with resistance elements 1401 and 1402, and inputs electric potentials obtained by the divided voltages by the resistance elements into a comparator 1405. Inverter-type buffer circuits 1406 and 1407 are connected in series to the output of the comparator 1405. Then, an output of the buffer circuit 1406 is inputted into a control terminal of the switch 1393, an output of the buffer circuit 1407 is inputted into a control terminal of the switch 1392, thereby on/off of the switches 1392 and 1393 is controlled in FIG. 13. Note that each of the switches 1392 and 1393 may be turned on when a signal inputted into each of the control terminal thereof is at the H-level, and each of the switches 1392 and 1393 is turned off when the signal inputted into the control terminals thereof is at the L-level.

In addition, in the structure shown in FIG. 14, by dividing a voltage by resistance elements to regulate electric potentials inputted into the comparator 1405, the voltage comparator 1391 can control when the switch 1392 is turned on and the switch 1393 is turned off in accordance with how much the voltage outputted from the rectifier circuit 113 is higher than the voltage outputted from the battery 114.

The voltage comparator 1391 is not limited to the structure explained in this embodiment mode and a structure having another form may also be used.

In addition, the operation in writing data into the signal control circuit 104 of the RFID 101 shown in FIGS. 10 and 11 by the reader/writer 201 and the operation of calling up data stored in the memory circuit 109 in the signal control circuit 104 of the RFID 101 by the reader/writer 201 are similar to the operations in FIGS. 1 and 2 which are explained in Embodiment Mode 1; therefore, explanations thereof are omitted in this embodiment mode.

Next, an operation in charging power to the RFID 101 shown in FIGS. 10 and 11 by an external wireless signal will be explained below. An external wireless signal received by the antenna circuit 102 is half-wave rectified and then smoothed by the rectifier circuit 113.

Then, the voltage outputted from the battery 114 and the voltage outputted from the rectifier circuit 113 are compared in the control circuit 1001. When the voltage outputted from the rectifier circuit 113 is higher enough than the voltage outputted from the battery 114, the rectifier circuit 113 and the battery 114 are connected. At this time, power outputted from the rectifier circuit 113 is supplied to both the battery 114 and the power source circuit 117, and surplus power is stored in the battery 114.

When the voltage outputted from the rectifier circuit 113 is not higher enough than the voltage outputted from the battery 114, the control circuit 1001 connects the power source circuit 117 and the battery 114. At this time, when the voltage outputted from the rectifier circuit 113 is higher than the voltage outputted from the battery 114, power outputted from the rectifier circuit 113 is supplied to the power source circuit 117 and there is no charge to the battery and no consumption of power of the battery. Then, when the voltage outputted from the rectifier circuit 113 is lower than the voltage outputted from the battery 114, power is supplied to the power source circuit from the battery 114. In other words, the control circuit 1001 controls the direction of current in accordance with the voltage outputted from the rectifier circuit 113 and the voltage outputted from the battery 114.

As described above, in the present invention, the RFID operates intermittently so that reduction of power consumption can be achieved by switching of on/off of the switching circuit 116 by an output signal of the low-frequency signal generation circuit 115. In general, the RFID operates constantly by reception of the signal; however, the RFID does not always have to respond constantly in some cases depending on the content of data or the use of the RFID. In such a case, the operation of the RFID is stopped so that consumption of power stored in the battery can be reduced.

Note that the structure and the timing chart of the low-frequency signal generation circuit in this embodiment mode are similar to FIGS. 7, 8, 9, and explanation parts thereof, which are explained in Embodiment Mode 1; therefore, explanation thereof is omitted in this embodiment mode.

In such a manner, in the RFID of the present invention, signals are transmitted at a certain period with respect to signals from the reader/writer so that power consumption can be reduced adequately enough. Additionally, the wireless signal inputted from the outside of the RFID is received by the antenna circuit and power is stored in the battery in the power supply circuit so that the RFID can be operated without supplying power periodically from the antenna circuit to the signal control circuit. In addition, power of the signal received from the antenna circuit and power stored in the battery are compared by the control circuit so as to determine whether power is supplied from the rectifier circuit or supplied from the battery to the power source circuit. Accordingly, this is preferable because further reduction of power consumption in the battery can be achieved.

As described above, a semiconductor device of the present invention including an RFID has a battery; therefore, shortage of power for transmitting and receiving individual information in accordance with deterioration over time of a battery, which has been caused in the prior art, can be prevented. In addition, a semiconductor device of the present invention has an antenna that receives a signal for supplying power to the battery. Therefore, the battery can be charged with the utilization of a wireless signal from the outside as a power source for driving the RFID without being directly connected to a charger. Consequently, it becomes possible to continuously use the semiconductor device without check of remaining charge capacity of a battery or replacement of the battery, which is necessary in the case of an active RFID. Additionally, power for driving the RFID is always retained in the battery, whereby power which is enough for an operation of the RFID can be obtained and communication distance between the RFID and the reader/writer can be extended.

Note that this embodiment mode can be implemented by freely being combined with other embodiment modes of this specification.

(Embodiment Mode 3)

This embodiment mode will explain a structure having a booster antenna circuit (hereinafter, referred to as a booster antenna) in the semiconductor device having the RFID shown in Embodiment Mode 1, with reference to drawings. Note that, in the drawings which are used in this embodiment mode, the same reference numerals denote the same portions as in Embodiment Mode 1.

Note that a booster antenna described in this embodiment mode refers to an antenna circuit (hereinafter, referred to as a booster antenna) which is larger than an antenna circuit which receives a signal from a reader/writer or a wireless signal from a charger or the like. An antenna circuit and the booster antenna resonate at a frequency band to be used and are magnetic-field coupled so that a signal generated by the reader/writer or the charger can be efficiently transmitted to a targeted RFID. Since the booster antenna is connected to a coil antenna through a magnetic field, the booster antenna is not necessary to be directly connected to a chip antenna and a signal control circuit, which is preferable.

A semiconductor device which is used for the RFID in this embodiment mode is explained with reference to a block diagram shown in FIG. 15.

Figure 15:
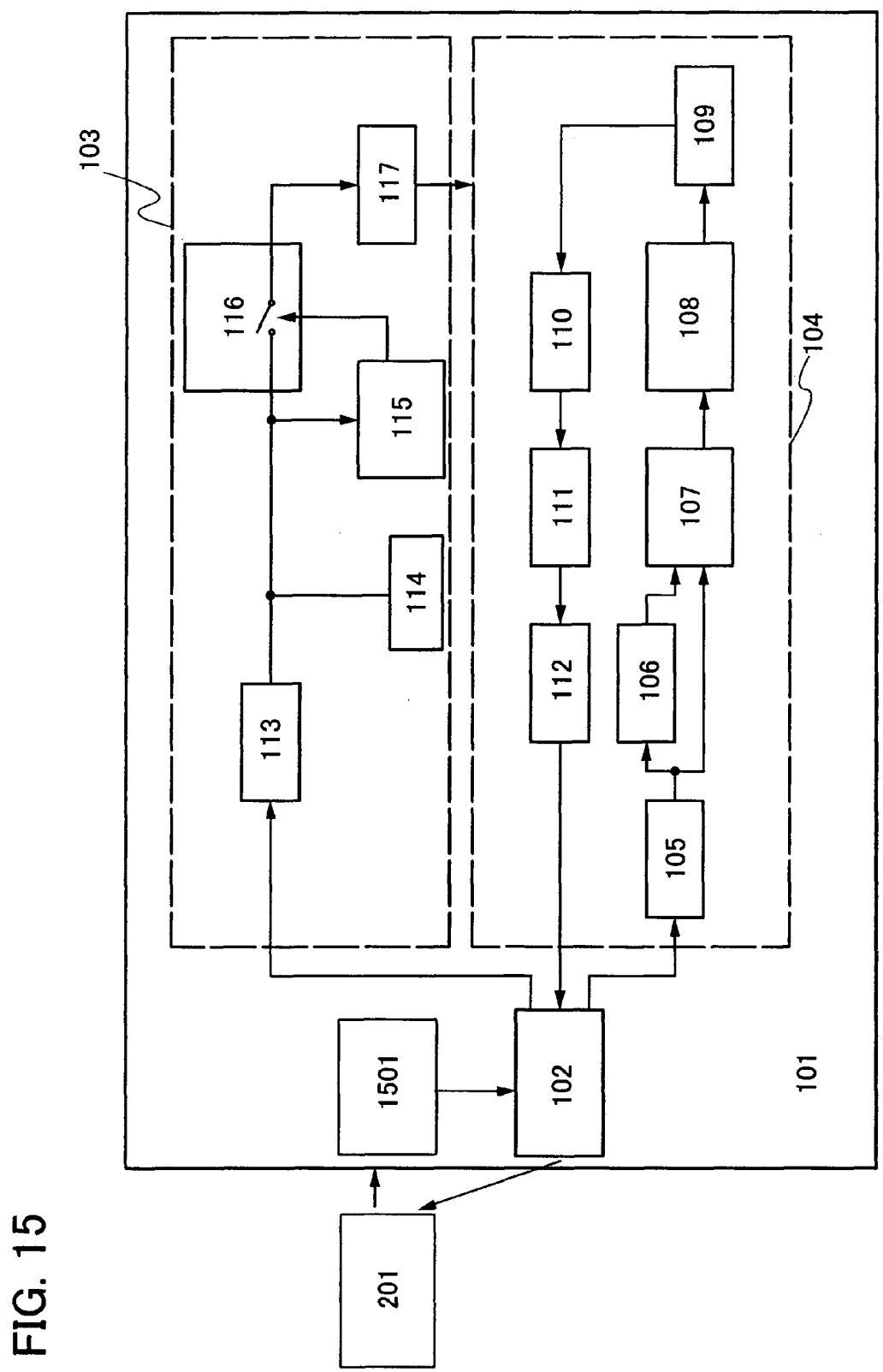
FIG. 15 illustrates a structure of Embodiment Mode 3.

The RFID 101 of FIG. 15 includes an antenna circuit 102, a booster antenna 1501, a power supply circuit 103, and a signal control circuit 104. The signal control circuit 104 includes an amplifier circuit 105, a demodulation circuit 106, a logic circuit 107, a memory control circuit 108, a memory circuit 109, a logic circuit 110, an amplifier circuit 111, and a modulation circuit 112. In addition, the power supply circuit 103 includes a rectifier circuit 113, a battery 114, a low-frequency signal generation circuit 115, a switching circuit 116, and a power source circuit 117. In addition, FIG. 15 is also a block diagram showing that signals are transmitted and received between the antenna 102 and the reader/writer 201 through the booster antenna 1501, and the battery 114 is charged by signals from the reader/writer 201. The difference from the structure of FIG. 2 in Embodiment Mode 1 is that the booster antenna 1501 is included between the reader/writer 201 and the antenna circuit 102 in this embodiment mode.

In FIG. 15, in the RFID 101, the booster antenna 1501 receives a signal from the reader/writer 201 to be magnetic-field coupled with the antenna 102 so that the signal from the reader/writer is received by the antenna circuit 102. In FIG. 15, a signal inputted into the power supply circuit 103 from the antenna circuit 102 is inputted into the power source circuit 117 through the rectifier circuit 113 and the switching circuit 116. In addition, in FIG. 15, the signal received by the antenna circuit 102 is inputted into the battery 114 through the rectifier circuit 113 to charge the battery 114.

In addition, in FIG. 15, signals inputted into the signal control circuit 104 by the antenna circuit 102 is transmitted to the demodulation circuit 106 through the amplifier circuit 105, and then, the signals are demodulated by the demodulation circuit 106. The signals are transmitted to the modulation circuit 112 through the logic circuit 107, the memory control circuit 108, the memory circuit 109, the logic circuit 110, and the amplifier circuit 111, and then, the signals are modulated by the modulation circuit 112. Then, the signals are transmitted to the reader/writer 201 by the antenna circuit 102.

Note that any antenna circuit is acceptable as long as the antenna circuit has the structure of the antenna circuit 102 shown in FIG. 4A described in Embodiment Mode 1. In addition, any rectifier circuit is acceptable as long as the rectifier circuit has the structure of the rectifier circuit 113 shown in FIG. 4B described in Embodiment Mode 1.

In addition, as for the antenna circuit 102 in FIG. 15, explanation thereof is similar to that of the antenna circuit 102 which is described in Embodiment Mode 1; therefore, the explanation is omitted here.

In addition, in this embodiment mode, the signals are received by the antenna circuit 102 through the booster antenna 1501 by communication with an electromagnetic induction. Therefore, the RFID 101 in FIG. 15 includes the coiled antenna circuit 102 and the booster antenna 1501. In FIG. 15, when the booster antenna 1501 of the RFID 101 is brought close to a coiled antenna in an antenna circuit of the reader/writer 201, an alternating current magnetic field is generated from the coiled antenna of the antenna circuit in the reader/writer 201. The alternating current magnetic field goes through the coiled booster antenna 1501 inside the RFID 101, and an electromotive force is generated between the terminals (between one terminal of the antenna and the other thereof) of the coiled booster antenna inside the RFID 101 by electromagnetic induction. The alternating current magnetic field is generated from the booster antenna itself as well as the electromotive force is generated in the coiled booster antenna 1501 by electromagnetic induction. Then, the alternating current magnetic field generated from the booster antenna 1501 goes through the coiled antenna circuit 102 inside the RFID 101, and an electromotive force is generated between the terminals (between one terminal of the antenna and the other thereof) of the coiled antenna circuit 102 inside the RFID 101 by electromagnetic induction. Accordingly, the RFID 101 can obtain a signal and an electromotive force.

With the structure where the booster antenna of FIG. 15 is provided, communication distance of transmission and reception of signals between the reader/writer 201 and the RFID 101 can be extended in this embodiment mode, which is preferable because communication of data can be performed more surely.

Figure 16:
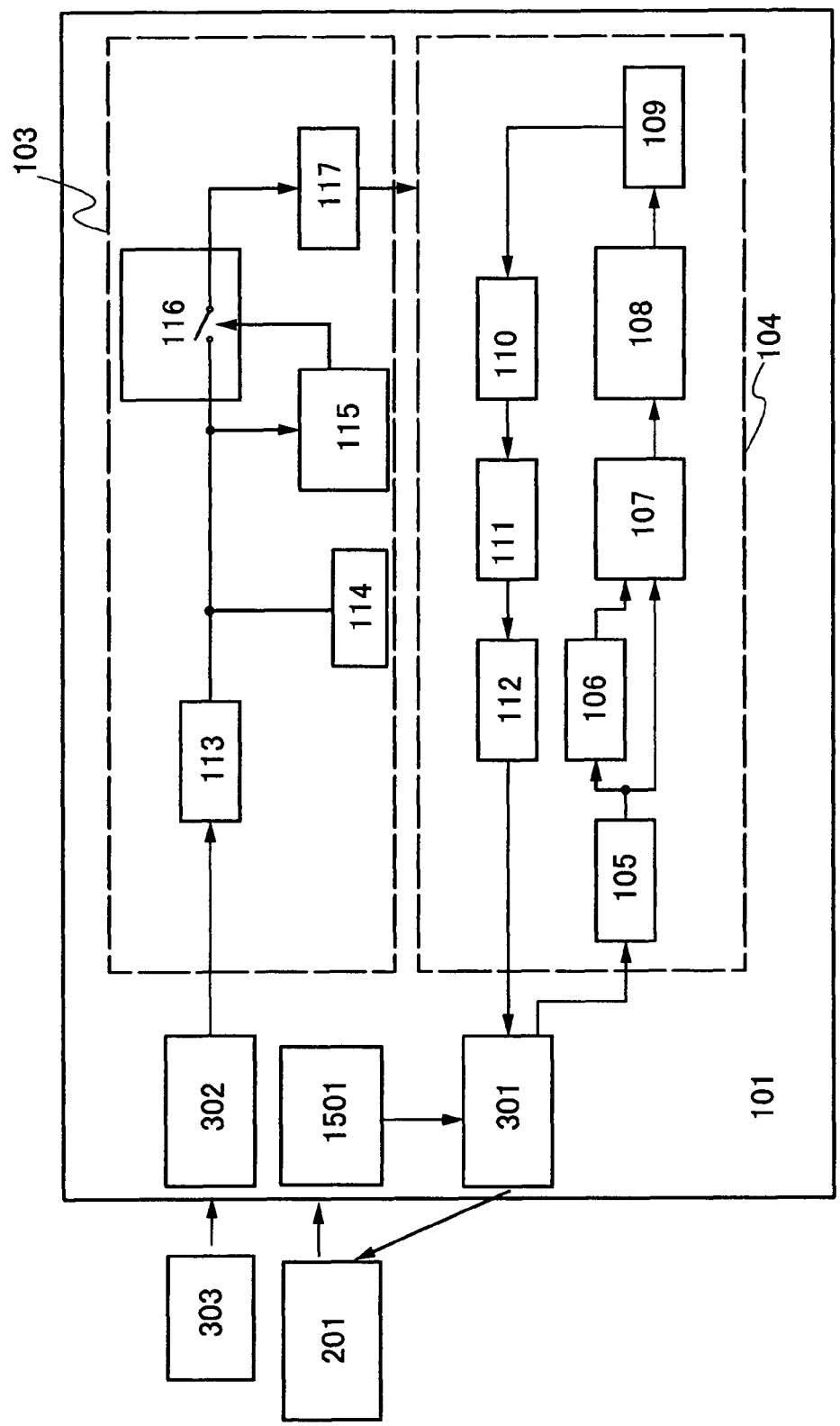
FIG. 16 illustrates a structure of Embodiment Mode 3.

In addition, as the antenna circuit shown in FIG. 5 of Embodiment Mode 1, a structure where the following is provided may also be employed: a first antenna circuit 301 for transmitting and receiving signals to and from the reader/writer 201; a second antenna circuit 302 for receiving a wireless signal from a charger 303; and a booster antenna for transmitting and receiving signals to and from the first antenna circuit 301 and the reader/writer 201. As an example of the structure, FIG. 16 shows a structure including the first antenna circuit 301, the second antenna circuit 302, and the charger 303. An antenna circuit and the booster antenna resonate at a frequency band to be used and are magnetic-field coupled so that a signal generated by the reader/writer 201 can be efficiently transmitted to a targeted RFID, which is preferable.

Note that, in the structure shown in FIG. 16, when the booster antenna 1501 is tuned not only to the first antenna circuit 301, but when the frequency band to which the booster antenna 1501 is tuned is varied, the booster antenna 1501 can be magnetic-field coupled to another antenna. For example, in the structure shown in FIG. 16, the booster antenna 1501 may receive a signal from the charger 303 and transmit the signal to the second antenna 302 by magnetic-field couple.

Note that, in the structure shown in FIG. 16, the tuning of the booster antenna 1501 is not limited to either the first antenna circuit 301 or the second antenna circuit 302. A frequency band that the booster antenna 1501 is tuned is extended so that the booster antenna 1501 can be magnetic-field coupled to a plurality of antennas. For example, in the structure shown in FIG. 16, the booster antenna 1501 may receive a signal from the reader/writer 201 and the charger 303 and be magnetic-field coupled to the first antenna circuit 301 and the second antenna circuit 302 so that a signal from the reader/writer and a signal from the charger are transmitted and received. In this case, frequencies that the first antenna circuit 301 and the second antenna circuit 302 are tuned are brought close to each other so that efficiency of electromagnetic induction in the booster antenna 1501 is more increased, which is preferable. Thus, when a frequency of a signal transmitted and received between the second antenna circuit 302 and the charger 303 is set m (m is a positive number) and a frequency of a signal transmitted and received to and from the first antenna circuit 301 and the reader/writer 201 is set M (M is a positive number), a frequency which satisfies a relation of 0.5 m<M<1.5 m and m≠M is preferably used. In addition to the above advantageous effect, when a frequency of a signal inputted into the second antenna circuit 302 is set within the above range, design can be performed without significantly changing the shapes of the first antenna circuit 301 and the second antenna circuit 302, which is preferable. In other words, communication distance of transmission and reception of a signal between the reader/writer 201 and the RFID 101 and communication distance of transmission and reception of a signal between the charger 303 and the RFID 101 can be extended, which is preferable, because data can be transmitted and received more surely and the battery 114 can be charged more surely.

In addition, the operation in writing data into the signal control circuit 104 of the RFID 101 shown in FIG. 15 by the reader/writer 201 and the operation of calling up data stored in the memory circuit 109 in the signal control circuit 104 of the RFID 101 by the reader/writer 201 are similar to the operations in FIGS. 1 and 2 which are explained in Embodiment Mode 1, except that the signal from the reader/writer 201 is inputted into the antenna circuit through the booster antenna; therefore, explanations thereof are omitted in this embodiment mode.

Moreover, an operation in charging power to the RFID 101 shown in FIG. 15 by an external wireless signal is similar to the operation in FIG. 1 which is explained in Embodiment Mode 1; therefore, explanation thereof is omitted in this embodiment mode.

The structure and the timing chart of the low-frequency signal generation circuit in this embodiment mode are similar to FIGS. 7, 8, 9, and explanation parts thereof, which are explained in Embodiment Mode 1; therefore, explanation thereof is omitted in this embodiment mode.

Note that this embodiment mode may also have a structure where the control circuit in the power supply circuit 103, which is explained in Embodiment Mode 2, is provided. With the structure having the control circuit in this embodiment mode, power of the signal received from the antenna circuit and power stored in the battery are compared by the control circuit so as to select whether power is supplied from the rectifier circuit or supplied from the battery to the power source circuit; therefore this is preferable because further reduction of power consumption in the battery can be achieved, in addition to the advantageous effect of the structure where the booster antenna is provided.

As described above, a semiconductor device of the present invention including an RFID has a battery; therefore, as in the conventional technique, shortage of power for transmitting and receiving individual information in accordance with deterioration over time of a battery can be prevented. In addition, a semiconductor device of the present invention has an antenna that receives a signal for supplying power to the battery. Therefore, the semiconductor device can charge the battery with the utilization of a wireless signal from outside as a power source for driving the RFID without being directly connected to a charger. Consequently, it becomes possible to continuously use the semiconductor device without check of remaining charge capacity of a battery or replacement of the battery, which is necessary in the case of an active RFID. Additionally, power for driving the RFID is always retained in the battery, whereby power which is enough for an operation of the RFID can be obtained and communication distance with the reader/writer can be extended.

As described above, the RFID operates intermittently so that reduction of power consumption can be achieved by turning of on/off of the switching circuit 116 by an output signal of the low-frequency signal generation circuit 115 in the present invention. In general, the RFID operates constantly by reception of the signal; however, the RFID does not always have to respond constantly in some cases depending on the content of data or the use of the RFID. In such a case, the operation of the RFID is stopped so that power consumption in the battery or a high-capacity capacitor can be reduced.

Further, in the structure of this embodiment mode, the booster antenna is provided in addition to the structure of Embodiment Mode 1. Therefore, there is an advantage that communication of transmission and reception of data between the RFID and the reader/writer and reception of a signal for charging from the RFID and the charger can be performed more surely.

Note that this embodiment mode can be implemented by freely being combined with other embodiment modes of this specification.

[Embodiment 1]

In this specification where an example of a battery in a semiconductor device (hereinafter, described as an RFID) of the present invention for transmitting and receiving data by wireless communication is explained, a battery refers to a battery which can restore continuous operating time by being charged in this embodiment. Note that a sheet-like battery is preferably used as the battery. For example, a lithium battery, preferably, a lithium polymer battery using a gel-like electrolyte, a lithium ion battery, or the like is used. Accordingly, the battery can be reduced in its size. Of course, any battery can be used as long as the battery can be charged, and a battery capable of charging and discharging such as a nickel-metal-hydride battery or a nickel-cadmium battery may also be used or a high-capacity capacitor or the like can also be used.

In this embodiment, an example of a lithium-ion battery will be explained as the battery. In comparison with a nickel-cadmium battery, a lead battery, or the like, the lithium-ion battery is widely used due to the advantages such as lack of a memory effect and the large current amount. In addition, research on thinning a lithium-ion battery has recently been carried out and a lithium-ion battery having a thickness of 1 to several μm has been manufactured (hereinafter, such a lithium-ion battery is referred to as a thin film secondary battery). Such a thin film secondary battery can be utilized as a flexible secondary battery by being attached to an RFID or the like.

Figure 17:
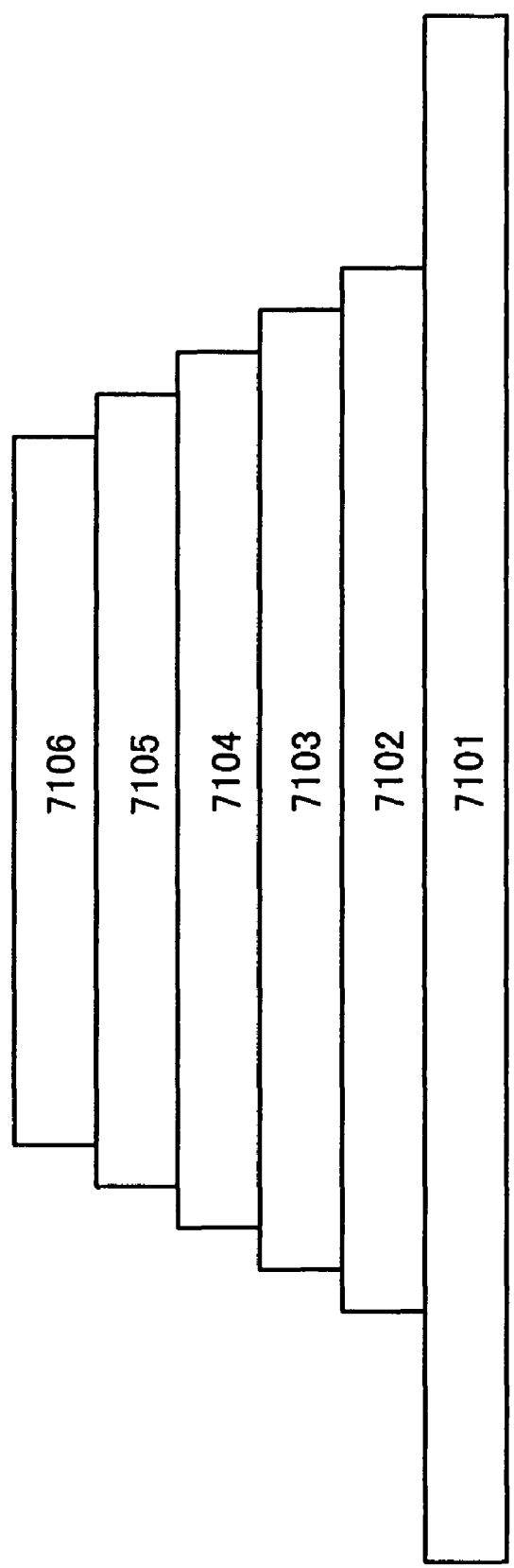
FIG. 17 illustrates a structure of Embodiment 1.

FIG. 17 shows an example of the thin film secondary battery which can be used as the battery of the present invention. The example shown in FIG. 17 is a cross-sectional example of a lithium-ion thin film battery.

A stacked-layer structure of FIG. 17 is explained. A collector thin film 7102 to be an electrode is formed over a substrate 7101 of FIG. 17. The collector thin film 7102 has favorable adhesiveness to an anode active material layer 7103 and needs to have low resistance; thus, aluminum, copper, nickel, vanadium, or the like can be used. Next, the anode active material layer 7103 is formed over the collector thin film 7102. Vanadium oxide ($V_2O_5$) or the like is generally used for the anode active material layer 7103. Then, a solid electrolyte layer 7104 is formed over the anode active material layer 7103. Lithium phosphorus oxide ($Li_3PO_4$) or the like is generally used for the solid electrolyte layer 7104.

Then, a cathode active material layer 7105 is formed over the solid electrolyte layer 7104. Lithium manganese oxide (LiMn$_2$O$_4$) or the like is generally used for the cathode active material layer 7105. Lithium cobalt oxide (LiCoO$_2$) or lithium nickel oxide (LiNiO$_2$) may also be used. Then, a collector thin film 7106 to be an electrode is formed over the cathode active material layer 7105. The collector thin film 7106 needs to have favorable adhesiveness to the cathode active material layer 7105 and low resistance; thus, aluminum, copper, nickel, vanadium, or the like can be used.

Each of the thin film layers of the above collector thin film 7102, anode active material layer 7103, solid electrolyte layer 7104, cathode active material layer 7105, and collector thin film 7106 may also be formed using a sputtering technique or an evaporation technique. Each thickness of the collector thin film 7102, the anode active material layer 7103, the solid electrolyte layer 7104, the cathode active material layer 7105, and the collector thin film 7106 is preferably 0.1 to 3 μm.

Next, hereinafter, operations at the time of charging and discharging will be explained. At the time of charging, lithium is separated from the cathode active material layer to be an ion. The lithium ion is absorbed by the anode active material layer through the solid electrolyte layer. At this time, electrons are discharged outside from the cathode active material layer.

At the time of discharging, lithium is separated from the anode active material layer to be an ion. The lithium ion is absorbed by the cathode active material layer through the solid electrolyte layer. At this time, electrons are discharged outside from the anode active material layer. In such a manner, the thin film secondary battery operates.

Note that the thin film layers of the collector thin film 7102, the anode active material layer 7103, the solid electrolyte layer 7104, the cathode active material layer 7105, and the collector thin film 7106 are stacked again to form the thin film secondary battery so that charge and discharge with a larger amount of power become possible, which is preferable.

As described above, a battery in a sheet that can be charged and discharged can be formed by formation of the thin film secondary battery.

This embodiment can freely be combined with the above embodiment modes and other embodiments. In other words, a battery can be charged periodically; therefore, as in the conventional technique, shortage of power for transmitting and receiving individual information in accordance with deterioration over time of a battery can be prevented. In addition, in charging the battery, the semiconductor device of the present invention receives power in an antenna circuit provided in an RFID so that the battery is charged. Therefore, the semiconductor device can charge the battery with the utilization of power of radio wave or electromagnetic waves from outside as a power source for driving the RFID without being directly connected to a charger. Consequently, it becomes possible to continuously use the semiconductor device without check of remaining charge capacity of a battery or replacement of the battery, which is necessary in the case of an active RFID. Additionally, power for driving the RFID is always retained in the battery, whereby power which is enough for an operation of the RFID can be obtained and communication distance with the reader/writer can be extended.

In the semiconductor device of the present invention, in addition to the advantage of providing the above battery, a switching circuit is provided in the power supply circuit that supplies power to a signal control circuit which transmits and receives individual information to and from outside to periodically control supply of power to the signal control circuit. An RFID operation can be performed intermittently by control of the supply of power to the signal control circuit in the switching circuit provided in the power supply circuit. Therefore, reduction in the power consumption of the battery can be achieved and further longtime operation can be performed even without supply of power by a wireless signal.

[Embodiment 2]

This embodiment will explain an example of a manufacturing method in using the semiconductor device of the present invention, which is described in the above embodiment modes, as an RFID, with reference to drawings. This embodiment will explain a structure where an antenna circuit, a power supply circuit, and a signal control circuit are provided over the same substrate. Note that an antenna circuit, a power supply circuit, and a signal control circuit are formed over a substrate at a time, and a transistor including the power supply circuit and the signal control circuit is formed as a thin film transistor. Accordingly, miniaturization can be achieved, which is preferable. Moreover, as for a battery in the power supply circuit, an example of using the thin film secondary battery, which is explained in the above embodiment, will be explained in this embodiment.

Note that, in this embodiment mode, as for the antenna circuit described in the above embodiment modes, only its form and position will be described; thus, it will be referred to as simply an 'antenna'.

Figure 18A:
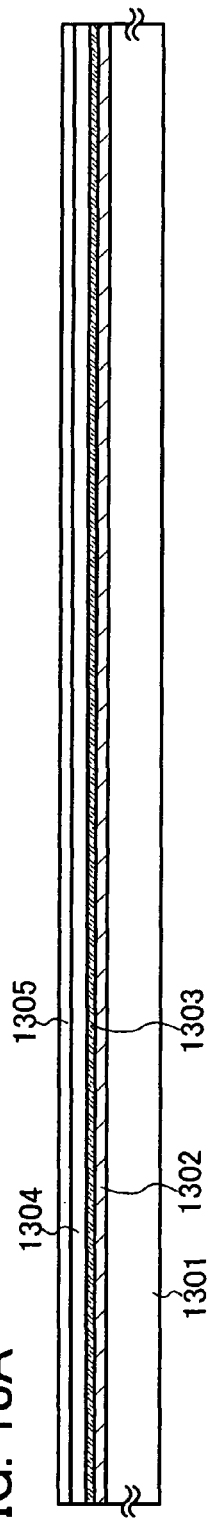
FIGS. 18A to 18D illustrate a structure of Embodiment 2.

First, over a surface of a substrate 1301, a peeling layer 1303 is formed with an insulating film 1302 interposed therebetween. Subsequently, an insulating film 1304 which serves as a base film and a semiconductor film 1305 (for example, a film containing amorphous silicon) are stacked (see FIG. 18A). Note that the insulating film 1302, the peeling layer 1303, the insulating film 1304, and the amorphous semiconductor film 1305 can be formed consecutively.

The substrate 1301 may be selected from a glass substrate, a quartz substrate, a metal substrate (such as a stainless steel substrate), a ceramic substrate, a semiconductor substrate such as a Si substrate, or the like. Alternatively, as a plastic substrate, a substrate formed of polyethylene terephthalate (PET), polyethylene naphthalate (PEN), polyether sulfone (PES), acrylic, or the like can also be selected. Note that, in this process, the peeling layer 1303 is provided over the entire surface of the substrate 1301 with the insulating film 1302 interposed therebetween. However, if necessary, the peeling layer 1303 may also be selectively provided using a photolithography method after the peeling layer is provided over the entire surface of the substrate 1301.

The insulating film 1302 and the insulating film 1304 are formed by a CVD method, a sputtering method, or the like with the use of an insulating material such as silicon oxide, silicon nitride, silicon oxynitride (SiO$_x$N$_y$, where x>y>0), or silicon nitride oxide (SiN$_x$O$_y$, where x>y>0). For example, when the insulating films 1302 and 1304 have a two-layer structure, a silicon nitride oxide film may be formed as a first insulating film and a silicon oxynitride film may be formed as a second insulating film. Alternatively, a silicon nitride film may also be formed as a first insulating film and a silicon oxide film may also be formed as a second insulating film. The insulating film 1302 serves as a blocking layer that prevents an impurity element from the substrate 1301 from being mixed with the peeling layer 1303 or with an element formed over the peeling layer 1303, and the insulating film 1304 serves as a blocking layer that prevents an impurity element from the substrate 1301 or the peeling layer 1303 from being mixed with an element formed over the peeling layer 1303. The insulating films 1302 and 1304 serving as blocking layers are formed in such a manner, whereby an alkali metal such as Na or an alkaline earth metal from the substrate 1301 and an impurity element contained in the peeling layer 1303 can be prevented from adversely affecting an element formed over the insulating films. Note that, in such a case where quartz is used as the substrate 1301, the insulating films 1302 and 1304 may be omitted from the structure.

As the peeling layer 1303, a metal film, a stacked-layer structure of a metal film and a metal oxide film, or the like can be used. As the metal film, an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), or iridium (Ir), or an alloy material or a compound material containing the element as its main component is formed in a single layer or stacked layers. In addition, such materials can be formed by a sputtering method, various CVD methods such as a plasma CVD method, or the like. As the stacked-layer structure of a metal film and a metal oxide film, after the above metal film is formed, oxide or oxynitride of the metal film can be provided on the surface of the metal film by performance of plasma treatment in an oxygen atmosphere or an $N_2O$ atmosphere, or heat treatment in an oxygen atmosphere or an $N_2O$ atmosphere. For example, in a case where a tungsten film is provided as the metal film by a sputtering method, a CVD method, or the like, plasma treatment is performed on the tungsten film, whereby a metal oxide film formed of tungsten oxide can be formed on the surface of the tungsten film. In this case, an oxide of tungsten is expressed as $WO_x$, where x is 2 to 3, and there are cases where x is 2 ($WO_2$), cases where x is 2.5 ($W_2O_5$), cases where x is 2.75 ($W_4O_{11}$), cases where x is 3 ($WO_3$), and the like. When forming the oxide of tungsten, there is no particular limitation on the value of x, and which oxide is to be formed may be determined in accordance with an etching rate or the like. Alternatively, for example, after a metal film (for example, tungsten) is formed, an insulating film such as silicon oxide ($SiO_2$) may be provided over the metal film by a sputtering method, and a metal oxide may also be formed over the metal film (for example, tungsten oxide over tungsten). In addition, as plasma treatment, the above high-density plasma treatment may also be performed, for example. Further, besides the metal oxide film, metal nitride or metal oxynitride may also be used. In such a case, plasma treatment or heat treatment under a nitrogen atmosphere or an atmosphere of nitrogen and oxygen may be performed on the metal film.

The amorphous semiconductor film 1305 is formed with a thickness of 25 to 200 nm (preferably 30 to 150 nm) by a sputtering method, an LPCVD method, a plasma CVD method, or the like.

Figure 18B:
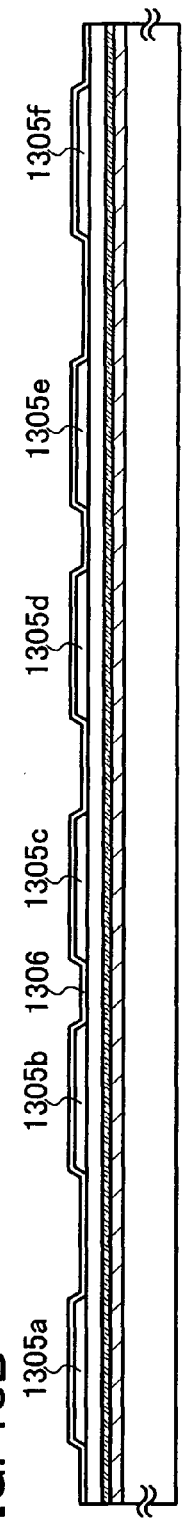

Next, the amorphous semiconductor film 1305 is crystallized by laser light irradiation. The amorphous semiconductor film 1305 may be crystallized by a method in which a laser irradiation method is combined with a thermal crystallization method using RTA or an annealing furnace or a thermal crystallization method using a metal element that promotes crystallization, or the like. Subsequently, the obtained crystalline semiconductor film is etched in a desired shape to form crystalline semiconductor films 1305a to 1305f and a gate insulating film 1306 so as to cover the semiconductor films 1305a to 1305f (see FIG. 18B).

The gate insulating film 1306 is formed by a CVD method, a sputtering method, or the like with the use of an insulating material such as silicon oxide, silicon nitride, silicon oxynitride ($SiO_xN_y$, where x>y>0), or silicon nitride oxide ($SiN_xO_y$, where x>y>0). For example, when the gate insulating film 1306 has a two-layer structure, a silicon oxynitride film may be formed as a first insulating film and a silicon nitride oxide film may be formed as a second insulating film. Alternatively, a silicon oxide film may also be formed as a first insulating film and a silicon nitride film may also be formed as a second insulating film.

An example of a manufacturing process of the crystalline semiconductor films 1305a to 1305f will be briefly explained below. First, an amorphous semiconductor film with a thickness of 50 to 60 nm is formed by a plasma CVD method. Next, a solution containing nickel, which is a metal element that promotes crystallization, is retained on the amorphous semiconductor film, and then dehydrogenation treatment (at 500° C., for one hour) and thermal crystallization treatment (at 550° C., for four hours) are performed on the amorphous semiconductor film. Therefore, a crystalline semiconductor film is formed. Subsequently, laser light irradiation is performed and a photolithography method is used, whereby the crystalline semiconductor films 1305a to 1305f are formed. Note that, alternatively, the amorphous semiconductor film may also be crystallized only by laser light irradiation, without thermal crystallization performed using a metal element that promotes crystallization.

As a laser oscillator which is used for crystallization, a continuous wave laser beam (a CW laser beam) or a pulsed wave laser beam (a pulsed laser beam) can be used. As a laser beam which can be used here, a laser beam emitted from one or more of the following can be used: a gas laser such as an Ar laser, a Kr laser, or an excimer laser; a laser of which the medium is single crystal YAG, $YVO_4$, forsterite ($Mg_2SiO_4$), $YAlO_3$, $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm and Ta is added as a dopant; a glass laser; a ruby laser; an alexandrite laser; a Ti: sapphire laser; a copper vapor laser; or a gold vapor laser. It is possible to obtain crystals with a large grain size when fundamental waves of such laser beams or second to fourth harmonics of the fundamental waves are used. For example, the second harmonic (532 nm) or the third harmonic (355 nm) of an Nd:$YVO_4$ laser (fundamental wave of 1064 nm) can be used. An energy density of the laser at this time is necessary to be approximately 0.01 to 100 $MW/cm^2$ (preferably, 0.1 to 10 $MW/cm^2$). Irradiation is performed with a scanning rate of approximately 10 to 2000 cm/sec. Note that a laser using, as a medium, single crystal YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, and Ta is added as a dopant; an Ar ion laser; or a Ti: sapphire laser can be continuously oscillated. Furthermore, pulse oscillation thereof can also be performed with a repetition rate of 10 MHz or more by a Q-switch operation, mode locking, or the like being performed. When a laser beam is oscillated with a repetition rate of 10 MHz or more, after a semiconductor film is melted by laser and before it solidifies, the semiconductor film is irradiated with a next pulse. Thus, unlike the case of using a pulsed laser with a low repetition rate, a solid-liquid interface can be continuously moved in the semiconductor film so that crystal grains that have grown continuously in a scanning direction can be obtained.

Moreover, the gate insulating film 1306 may also be formed by the high-density plasma treatment described above performed on the semiconductor films 1305a to 1305f to oxidize or nitride the surfaces. For example, the film is formed by plasma treatment using a mixed gas containing a rare gas such as He, Ar, Kr or Xe, and oxygen, nitrogen oxide ($NO_2$), ammonia, nitrogen, hydrogen, or the like. When excitation of the plasma in this case is performed by introduction of a microwave, high-density plasma can be generated with a low electron temperature. The surface of the semiconductor film can be oxidized or nitrided by an oxygen radical (there are cases where an OH radical is included) or a nitrogen radical (there are cases where an NH radical is included) generated by this high-density plasma.

By treatment using such high-density plasma, an insulating film with a thickness of 1 to 20 nm, typically 5 to 10 nm, is formed over the semiconductor film. Since the reaction in this case is a solid-phase reaction, interface state density between the insulating film and the semiconductor film can be set extremely low. Since such high-density plasma treatment oxidizes (or nitrides) a semiconductor film (crystalline silicon or polycrystalline silicon) directly, the insulating film can ideally be formed with extremely small variation in its thickness. In addition, since oxidation is not performed strongly even at a crystal grain boundary of crystalline silicon, extremely favorable states are obtained. In other words, by a solid-phase oxidation of the surface of the semiconductor film by the high-density plasma treatment shown here, an insulating film with favorable uniformity and low interface state density can be formed without an excessive oxidation reaction at a crystal grain boundary.

As the gate insulating film, only an insulating film formed by the high-density plasma treatment may be used, or an insulating film such as silicon oxide, silicon oxynitride, or silicon nitride may be formed thereover by a CVD method using plasma or thermal reaction so as to make stacked layers. In any case, when a transistor includes an insulating film formed by high-density plasma in part of the gate insulating film or in the whole of the gate insulating film, variation in the characteristics can be made small.

Further, in the semiconductor films 1305a to 1305f obtained by irradiation of a semiconductor film with a continuous wave laser beam or a laser beam oscillated with a repetition rate of 10 MHz or more and scanning of the semiconductor film in one direction to crystallize the semiconductor film, the crystal grows in the scanning direction of the beam. When a transistor is disposed so that the scanning direction is in accordance with the channel length direction (the direction in which a carrier flows when a channel formation region is formed) and the above gate insulating layer is used in combination, thin film transistors (TFTs) with small variation in characteristics and high electron field-effect mobility can be obtained.

Next, a first conductive film and a second conductive film are stacked over the gate insulating film 1306. Here, the first conductive film is formed with a thickness of 20 to 100 nm by a CVD method, a sputtering method, or the like. The second conductive film is formed with a thickness of 100 to 400 nm. The first conductive film and the second conductive film are formed using an element selected from tantalum (Ta), tungsten (W), titanium (Ti), molybdenum (Mo), aluminum (Al), copper (Cu), chromium (Cr), niobium (Nb), or the like, or an alloy material or a compound material containing these elements as its main component. Alternatively, the first conductive film and the second conductive film are formed using a semiconductor material typified by polycrystalline silicon doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Since tungsten and tantalum nitride have high heat resistance, heat treatment for thermal activation can be performed after the first conductive film and the second conductive film are formed. In addition, in the case of using a three-layer structure instead of a two-layer structure, a stacked-layer structure including a molybdenum film, an aluminum film, and a molybdenum film may be used.

Then, a resist mask is formed using a photolithography method, and etching treatment for forming a gate electrode and a gate line is performed to form gate electrodes 1307 over the semiconductor films 1305a to 1305f. Here, an example in which the gate electrodes 1307 have a stacked-layer structure including a first conductive film 1307a and a second conductive film 1307b is described.

Figure 18C:
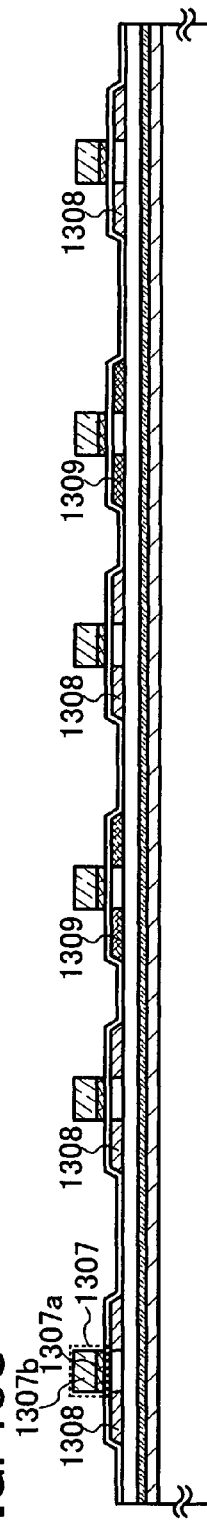

Next, the gate electrodes 1307 are used as masks, and an impurity element imparting n-type conductivity is added to the semiconductor films 1305a to 1305f at a low concentration by an ion doping method or an ion implantation method. Then, a resist mask is selectively formed by a photolithography method, and an impurity element imparting p-type conductivity is added at a high concentration to the semiconductor films 1305a to 1305f. As an impurity element which has n-type conductivity, phosphorus (P), arsenic (As), or the like can be used. As an impurity element which has p-type conductivity, boron (B), aluminum (Al), gallium (Ga), or the like can be used. Here, phosphorus (P) is used as an impurity element imparting n-type conductivity, and is selectively introduced into the semiconductor films 1305a to 1305f such that the semiconductor films contain phosphorus (P) at a concentration of $1\times10^{15}$ to $1\times10^{19}/cm^3$. Thus, n-type impurity regions 1308 are formed. Further, boron (B) is used as an impurity element imparting p-type conductivity, and is selectively introduced into the semiconductor films 1305c and 1305e such that the semiconductor films contain boron (B) at a concentration of $1\times10^{19}$ to $1\times10^{20}/cm^3$. Thus, p-type impurity regions 1309 are formed (see FIG. 18C).

Subsequently, an insulating film is formed so as to cover the gate insulating film 1306 and the gate electrodes 1307. The insulating film is formed as a single layer or stacked layers of a film containing an inorganic material such as silicon, an oxide of silicon, or a nitride of silicon or an organic material such as an organic resin by a plasma CVD method, a sputtering method, or the like. Next, the insulating film is selectively etched by anisotropic etching, which etches mainly in a vertical direction, to form insulating films 1310 (also referred to as sidewalls) which are in contact with side surfaces of the gate electrodes 1307. The insulating films 1310 are used as masks for doping when LDD (Lightly Doped Drain) regions are formed.

Subsequently, with the use of a resist mask formed by a photolithography method, the gate electrodes 1307, and the insulating films 1310 as masks, an impurity element imparting n-type conductivity is added at a high concentration to the semiconductor films 1305a, 1305b, 1305d, and 1305f to form n-type impurity regions 1311. Here, phosphorus (P) is used as an impurity element imparting n-type conductivity, and is selectively introduced into the semiconductor films 1305a, 1305b, 1305d, and 1305f such that the semiconductor films contain phosphorus (P) at a concentration of $1\times10^{19}$ to $1\times10^{20}/cm^3$. Thus, the n-type impurity regions 1311, which have a higher concentration than the impurity regions 1308, are formed.

Figure 18D:
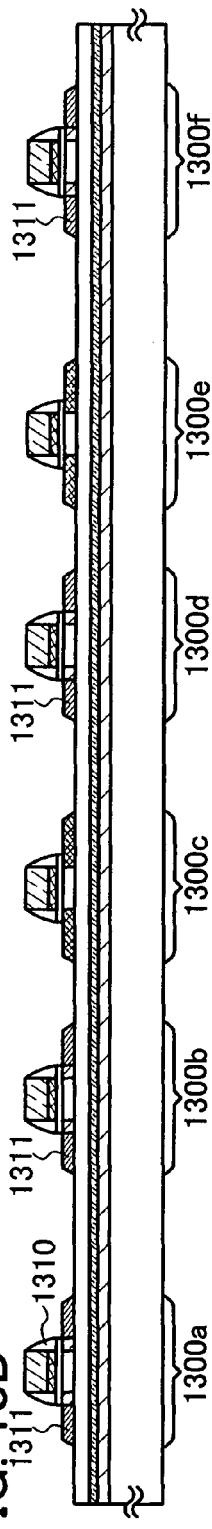

In the above steps, n-channel thin film transistors 1300a, 1300b, 1300d, and 1300f, and p-channel thin film transistors 1300c and 1300e are formed (see FIG. 18D).

In the n-channel thin film transistor 1300a, a channel formation region is formed in a region of the semiconductor film 1305a which overlaps with the gate electrode 1307; the impurity regions 1311 which each form a source region or a drain region are formed in regions of the semiconductor film 1305a which do not overlap with the gate electrode 1307 and the insulating films 1310; and lightly doped drain regions (LDD regions) are formed in regions of the semiconductor film 1305a which overlap with the insulating films 1310 and are between the channel formation region and the impurity regions 1311. In addition, the n-channel thin film transistors 1300b, 1300d, and 1300f are similarly provided with channel formation regions, lightly doped drain regions, and impurity regions 1311.

In the p-channel thin film transistor 1300c, a channel formation region is formed in a region of the semiconductor film 1305c which overlaps with the gate electrode 1307, and the impurity regions 1309 which each form a source region or a drain region are formed in regions of the semiconductor film 1305c which do not overlap with the gate electrode 1307. In addition, the p-channel thin film transistor 1300e is similarly provided with a channel formation region and impurity regions 1309. Note that the p-channel thin film transistors 1300c and 1300e are not provided with LDD regions here; however, the p-channel thin film transistor may be provided with an LDD region, and the n-channel thin film transistor may also have a structure without an LDD region.

Figure 19A:
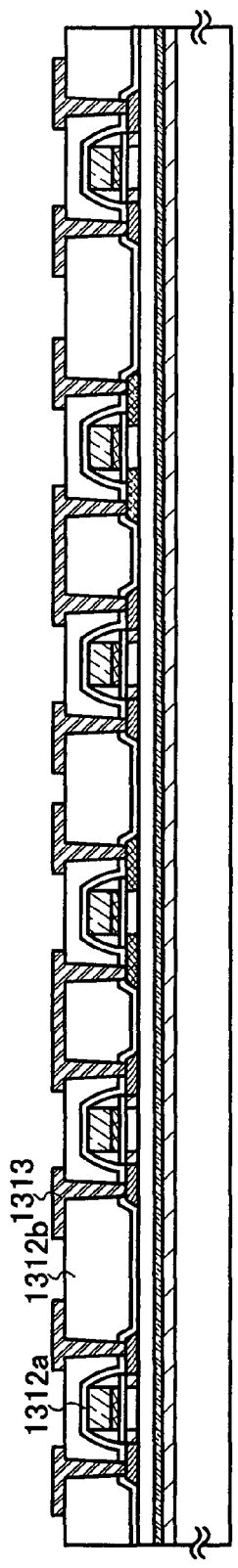
FIGS. 19A to 19C illustrate a structure of Embodiment 2.

Next, an insulating film is formed in a single layer or stacked layers so as to cover the semiconductor films 1305a to 1305f, the gate electrodes 1307, and the like; therefore, conductive films 1313, which are electrically connected to the impurity regions 1309 and 1311 which each form the source region or the drain region of the thin film transistors 1300a to 1300f, are formed over the insulating film (see FIG. 19A). The insulating film is formed in a single layer or stacked layers with the use of an inorganic material such as an oxide of silicon or a nitride of silicon, an organic material such as polyimide, polyamide, benzocyclobutene, acrylic, or epoxy, a siloxane material, or the like by a CVD method, a sputtering method, an SOG method, a droplet discharging method, a screen printing method, or the like. Here, the insulating film has a two-layer structure. A silicon nitride oxide film is formed as a first insulating film 1312a, and a silicon oxynitride film is formed as a second insulating film 1312b. Moreover, each of the conductive films 1313 can form a source electrode or a drain electrode of the thin film transistors 1300a to 1300f.

Note that, before the insulating films 1312a and 1312b are formed or after one or more of thin films of the insulating films 1312a and 1312b are formed, heat treatment may be performed to recover the crystallinity of the semiconductor film, activate an impurity element which has been added into the semiconductor film, or hydrogenate the semiconductor film. As the heat treatment, thermal annealing, a laser annealing method, an RTA method, or the like may be applied.

The conductive films 1313 are formed by a CVD method, a sputtering method, or the like in a single layer or stacked layers with an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing these elements as its main component. An alloy material containing aluminum as its main component corresponds to, for example, a material containing aluminum as its main component and which also contains nickel, or an alloy material which contains aluminum as its main component and which also contains nickel and one or both of carbon and silicon. The conductive films 1313 preferably employ, for example, a stacked-layer structure including a barrier film, an aluminum-silicon (Al—Si) film, and a barrier film, or a stacked-layer structure including a barrier film, an aluminum-silicon (Al—Si) film, a titanium nitride (TiN) film, and a barrier film. Note that the barrier film corresponds to a thin film formed of titanium, a nitride of titanium, molybdenum, or a nitride of molybdenum. Aluminum and aluminum silicon have low resistance and are inexpensive, which are ideal materials for forming the conductive films 1313. Moreover, generation of a hillock of aluminum or aluminum silicon can be prevented when upper and lower barrier layers are provided. Further, when the barrier film is formed of titanium, which is a highly-reducible element, even if a thin natural oxide film is formed over the crystalline semiconductor film, the natural oxide film is chemically reduced so that preferable contact with the crystalline semiconductor film can be obtained.

Next, an insulating film 1314 is formed so as to cover the conductive films 1313, and conductive films 1315a and 1315b, which are each electrically connected to the conductive films 1313 which each form a source electrode or a drain electrode of the thin film transistors 1300a and 1300f, are formed over the insulating film 1314. In addition, a conductive film 1316 is formed, which is electrically connected to the conductive film 1313 which forms a source electrode or a drain electrode of the thin film transistor 1300b. Note that the conductive films 1315a and 1315b may also be formed of the same material at the same time as the conductive film 1316. The conductive films 1315a and 1315b and the conductive film 1316 can be formed using any of the above materials of which the conductive films 1313 can be formed.

Subsequently, a conductive film 1317 serving as an antenna is formed so as to be electrically connected to the conductive film 1316 (see FIG. 19B).

The insulating film 1314 can be provided by a CVD method, a sputtering method, or the like in a single-layer or stacked-layer structure formed of an insulating film having oxygen or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (diamond-like carbon); an organic material such as epoxy, polyimide, polyamide, polyvinyl phenol, benzocyclobutene, or acrylic; or a siloxane material such as a siloxane resin. Note that the siloxane material corresponds to a material having a Si—O—Si bond. Siloxane has a skeleton structure formed from a bond of silicon (Si) and oxygen (O). As a substitutent, an organic group containing at least hydrogen (for example, an alkyl group or aromatic hydrocarbon) is used. A fluoro group can also be used as a substitutent. Alternatively, a fluoro group and an organic group containing at least hydrogen may also be used as a substitutent.

The conductive film 1317 is formed of a conductive material with the use of a CVD method, a sputtering method, a printing method such as a screen printing method or a gravure printing method, a droplet discharging method, a dispensing method, a plating method, or the like. The conductive material is formed in a single-layer or stacked-layer structure of an element selected from aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material containing these elements as its main component.

For example, in the case of using a screen printing method to form the conductive film 1317 serving as an antenna, the conductive film 1317 can be provided by selective printing of a conductive paste in which conductive particles having a grain size of several nm to several tens of µm are dissolved or dispersed in an organic resin. As the conductive particles, metal particles of one or more of any of silver (Ag), gold (Au), copper (Cu), nickel (Ni), platinum (Pt), palladium (Pd), tantalum (Ta), molybdenum (Mo), titanium (Ti), or the like, fine particles of silver halide, or dispersive nanoparticles can be used. In addition, as the organic resin contained in the conductive paste, one or more organic resins selected from organic resins serving as a binder, a solvent, a dispersing agent, or a coating material for the metal particles can be used. An organic resin such as an epoxy resin or a silicon resin can be given as a typical example. Moreover, when the conductive film is formed, it is preferable to perform baking after the conductive paste is applied. For example, in the case of using fine particles containing silver as a main component (for example, the grain size is greater than or equal to 1 nm and less than or equal to 100 nm) as a material for the conductive paste, the conductive film can be obtained by curing of the fine particles by baking at a temperature in the range of 150 to 300° C. Alternatively, fine particles containing solder or lead-free solder as its main component may also be used. In this case, preferably, fine particles having a grain size of 20 μm or less are used. Solder or lead-free solder has advantages such as low cost.

In addition, each of the conductive films 1315*a* and 1315*b* can serve as a wiring electrically connected to a battery included in a semiconductor device of the present invention in a subsequent process. Moreover, when the conductive film 1317 serving as an antenna is formed, another conductive film may also be separately formed so as to be electrically connected to the conductive films 1315*a* and 1315*b* so that that the conductive film may also be used as a wiring connected to the battery.

Next, after an insulating film 1318 is formed so as to cover the conductive film 1317, a layer (hereinafter, described as an "element formation layer 1319") including the thin film transistors 1300*a* to 1300*f*, the conductive film 1317, and the like is peeled from the substrate 1301. Here, openings are formed in regions where the thin film transistors 1300*a* to 1300*f* are not formed by laser light (for example, UV light) irradiation (see FIG. 12C), and then, the element formation layer 1319 can be peeled from the substrate 1301 using physical force. Alternatively, before the element formation layer 1319 is peeled from the substrate 1301, an etchant may also be introduced into the formed openings to selectively remove the peeling layer 1303. As the etchant, a gas or liquid containing halogen fluoride or an interhalogen compound is used. For example, chlorine trifluoride ($ClF_3$) is used as a gas containing halogen fluoride. Accordingly, the element formation layer 1319 is peeled from the substrate 1301. Note that the peeling layer 1303 may be partially left instead of being removed entirely. In such a manner, the amount of consumption of the etchant and treatment time necessary for removing the peeling layer can be reduced. Moreover, the element formation layer 1319 can be left over the substrate 1301 even after the peeling layer 1303 is removed. Further, the substrate 1301, from which the element formation layer 1319 is peeled, is reused, whereby cost can be reduced.

The insulating film 1318 can be provided by a CVD method, a sputtering method, or the like in a single-layer or stacked-layer structure formed of an insulating film containing oxygen or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (diamond-like carbon); an organic material such as epoxy, polyimide, polyamide, polyvinyl phenol, benzocyclobutene, or acrylic; or a siloxane material such as a siloxane resin.

In this embodiment mode, after the openings are formed in the element formation layer 1319 by laser light irradiation, a first sheet material 1320 is attached to one surface of the element formation layer 1319 (a surface where the insulating film 1318 is exposed), and then, the element formation layer 1319 is peeled from the substrate 1301 (see FIG. 20A).

Next, a second sheet material 1321 is attached to the other surface of the element formation layer 1319 (a surface exposed by peeling) by one or both of heat treatment and pressure treatment being performed (see FIG. 20B). As the first sheet material 1320 and the second sheet material 1321, a hot-melt film or the like can be used.

As the first sheet material 1320 and the second sheet material 1321, a film on which antistatic treatment for preventing static electricity or the like has been performed (hereinafter, described as an antistatic film) can also be used. Examples of the antistatic film are a film in which a material that can prevent electrostatic charge is dispersed in a resin, a film to which a material that can prevent electrostatic charge is attached, and the like. The film provided with a material that can prevent electrostatic charge may be a film with a material that can prevent electrostatic charge provided over one of its surfaces, or a film with a material that can prevent electrostatic charge provided over each of its surfaces. Further, concerning the film with a material that can prevent electrostatic charge provided over one of its surfaces, the film may be attached to the layer so that the material that can prevent electrostatic charge is placed on the inner side of the film or the outer side of the film. The material that can prevent electrostatic charge may be provided over the entire surface of the film, or over part of the film. As a material here that can prevent electrostatic charge, a metal, indium tin oxide (ITO), or a surfactant such as an amphoteric surfactant, a cationic surfactant, or a nonionic surfactant can be used. Besides, as an antistatic material, a resin material containing a cross-linked copolymer having a carboxyl group and a quaternary ammonium base on its side chain, or the like can be used. Such a material is attached, mixed, or applied to a film, whereby an antistatic film can be formed. Sealing using the antistatic film is performed, whereby the extent to which a semiconductor element is affected by static electricity from outside and the like can be suppressed when being dealt as a commercial product.

Note that the battery is formed so that the thin film secondary battery described in Embodiment 1 described above is connected to the conductive films 1315*a* and 1315*b*. However, the connection with the battery may be performed before the element formation layer 1319 is peeled from the substrate 1301 (in a step at a stage shown in FIG. 19B or 19C), may be performed after the element formation layer 1319 is peeled from the substrate 1301 (in a step at a stage shown in FIG. 20A), or may be performed after the element formation layer 1319 is sealed with the first sheet material and the second sheet material (in a step at a stage shown in FIG. 20B). An example in which the element formation layer 1319 and the battery are formed so as to be connected will be explained below with reference to FIGS. 21A and 21B and FIGS. 22A and 22B.

Figure 19B:
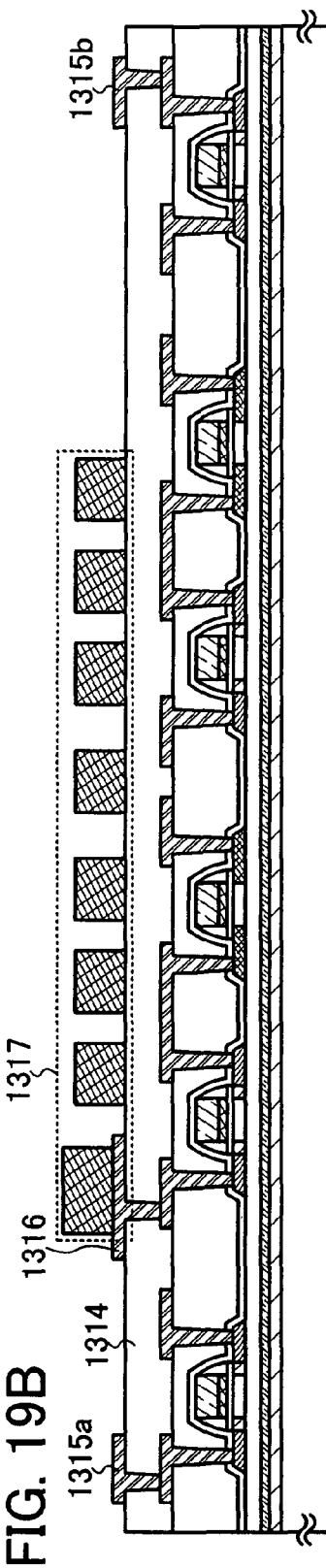
Figure 19C:
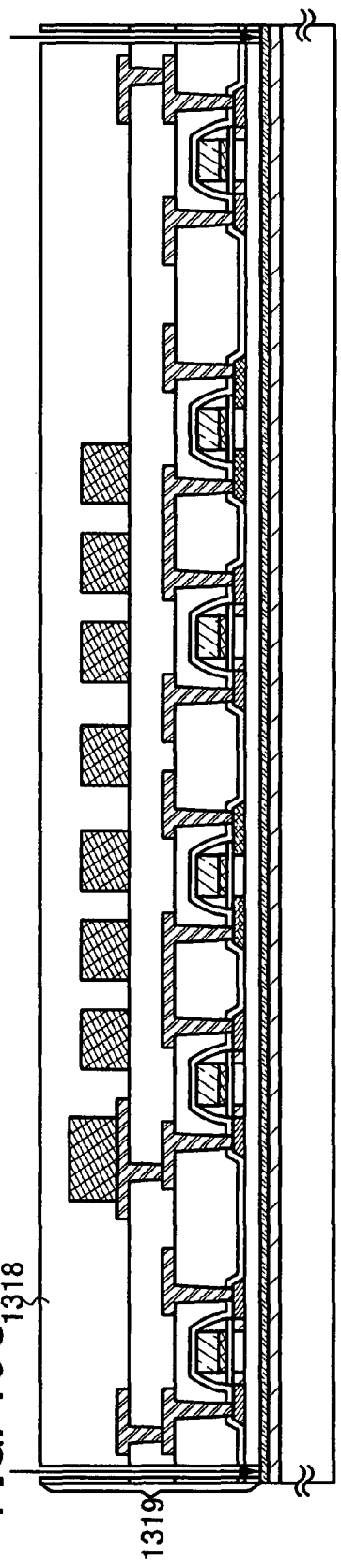
Figure 21A:
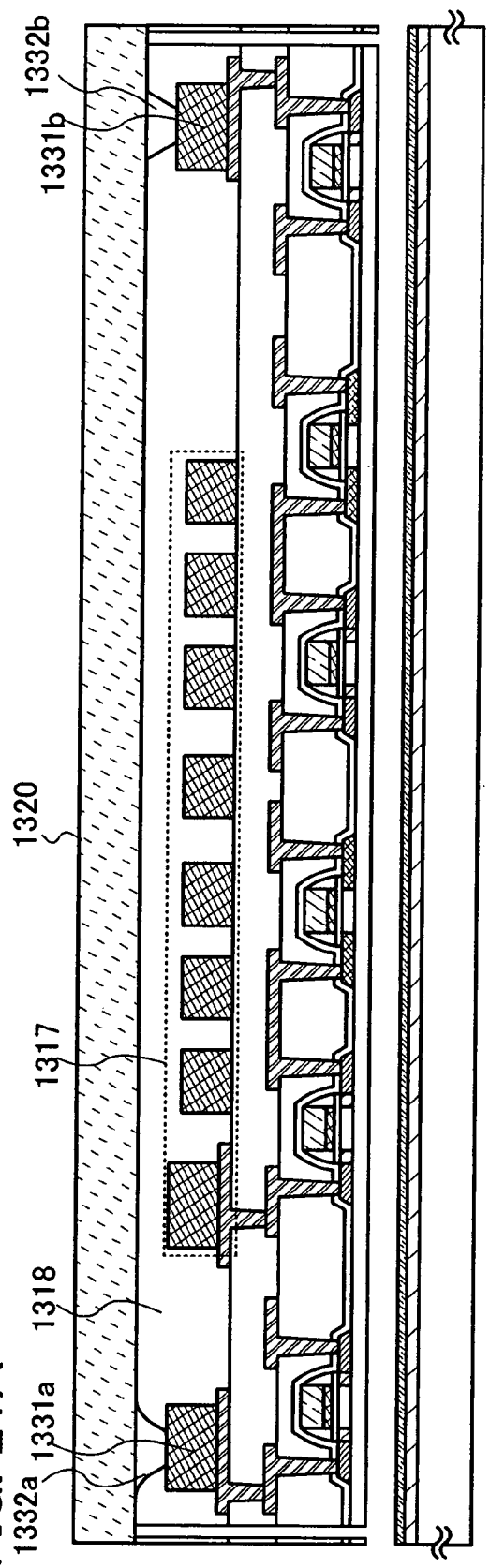
FIGS. 21A and 21B illustrate a structure of Embodiment 2.
Figure 21B:
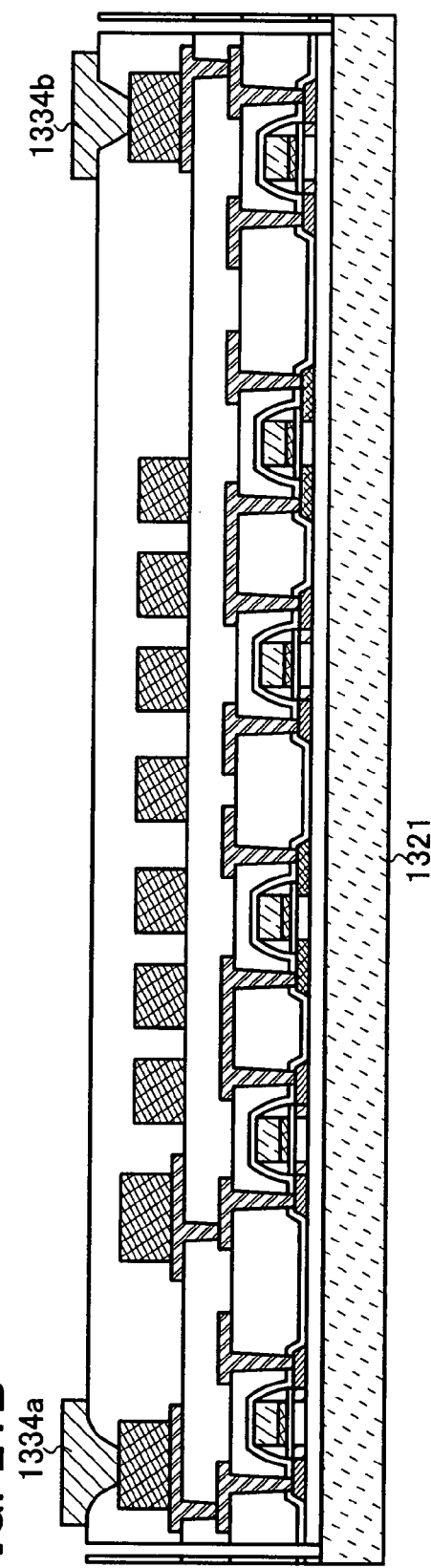

In FIG. 19B, conductive films 1331*a* and 1331*b* electrically connected to the conductive films 1315*a* and 1315*b*, respectively, are formed at the same time as the conductive film 1317 serving as an antenna. Subsequently, the insulating film 1318 is formed so as to cover the conductive film 1317 and the conductive films 1331*a* and 1331*b*. Then, openings 1332*a* and 1332*b* are formed so as to expose the surfaces of the conductive films 1331*a* and 1331*b*. Thereafter, after the openings are formed in the element formation layer 1319 by laser light irradiation, the first sheet material 1320 is attached to one surface of the element formation layer 1319 (the surface where the insulating film 1318 is exposed), and then, the element formation layer 1319 is peeled from the substrate 1301 (see FIG. 21A).

Next, the second sheet material 1321 is attached to the other surface (a surface exposed by peeling) of the element formation layer 1319, and the element formation layer 1319 is then peeled from the first sheet material 1320. Thus, a sheet material with weak adhesion is used here as the first sheet material 1320. Subsequently, conductive films 1334a and 1334b electrically connected to the conductive films 1331a and 1331b through the openings 1332a and 1332b, respectively, are selectively formed (see FIG. 21B).

The conductive films 1334a and 1334b are formed of a conductive material with the use of a CVD method, a sputtering method, a printing method such as a screen printing method or a gravure printing method, a droplet discharging method, a dispensing method, a plating method, or the like. The conductive material is formed in a single-layer or stacked-layer structure of an element selected from aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material containing these elements as its main component.

Note that an example is shown here where the element formation layer 1319 is peeled from the substrate 1301 before the conductive films 1334a and 1334b are formed. However, the element formation layer 1319 may be peeled from the substrate 1301 after the conductive films 1334a and 1334b are formed.

Next, in the case where a plurality of elements is formed over the substrate, the element formation layer 1319 is separated into different elements (see FIG. 22A). A laser irradiation apparatus, a dicing apparatus, a scribing apparatus, or the like can be used for the separation. Here, the plurality of elements formed over one substrate are separated from one another by laser light irradiation.

Then, the separated element is electrically connected to the battery (see FIG. 22B). In this embodiment, the thin film secondary battery shown in Embodiment 1 described above is used as the battery, and the collector thin film, the anode active material layer, the solid electrolyte layer, the cathode active material layer, and the collector thin film are stacked sequentially.

Conductive films 1336a and 1336b are formed of a conductive material with the use of a CVD method, a sputtering method, a printing method such as a screen printing method or a gravure printing method, a droplet discharging method, a dispensing method, a plating method, or the like. The conductive material is formed in a single-layer or stacked-layer structure of an element selected from aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material containing these elements as its main component. Note that the conductive films 1334a and 1334b each correspond to the collector thin film 7102 shown in Embodiment described above. Therefore, as the conductive material, the conductive films 1334a and 1334b need to have favorable adhesiveness to the anode active material layer and low resistance; thus, aluminum, copper, nickel, vanadium, or the like is particularly preferable.

Then, the structure of the thin film secondary battery will be described in detail. An anode active material layer 1381 is formed over the conductive film 1336a. Vanadium oxide ($V_2O_5$) or the like is generally used for the anode active material layer 1381. Then, a solid electrolyte layer 1382 is formed over the anode active material layer 1381. Lithium phosphorus oxide ($Li_3PO_4$) or the like is generally used for the solid electrolyte layer 1382. Then, a cathode active material layer 1383 is formed over the solid electrolyte layer 1382. Lithium manganese oxide ($LiMn_2O_4$) or the like is generally used for the cathode active material layer 1383. Lithium cobalt oxide ($LiCoO_2$) or lithium nickel oxide ($LiNiO_2$) may also be used. Then, a collector thin film 1384 to be an electrode is formed over the cathode active material layer 1383. The collector thin film 1384 needs to have favorable adhesiveness to the cathode active material layer 1383 and low resistance; thus, aluminum, copper, nickel, vanadium, or the like can be used.

Each of the thin film layers of the above anode active material layer 1381, solid electrolyte layer 1382, cathode active material layer 1383, and collector thin film 1384 may also be formed using a sputtering technique or an evaporation technique. Each thickness thereof is preferably 0.1 to 3 µm.

Next, coating of resin is performed to form an interlayer film 1385. Then, the interlayer film 1385 is etched to form a contact hole. The interlayer film 1385 is not limited to resin. Another film such as a CVD oxide film may also be used; however, resin is preferable in terms of planarity. In addition, the contact hole may also be formed using photosensitive resin without etching. Subsequently, a wiring layer 1386 is formed over the interlayer film 1385 to be connected to the conductive film 1334b, whereby electrical connection of the thin film secondary battery is ensured.

Here, the conductive films 1336a and 1336b to be connection terminals of the conductive films 1334a and 1334b, which is provided in the element formation layer 1319, and a thin film secondary battery 1389, which is the battery stacked in advance, respectively, are connected to each other. A case is shown here in which the conductive film 1334a and the conductive film 1336a, or the conductive film 1334b and the conductive film 1336b, are pressure-bonded to each other with a material having an adhesive property such as an anisotropic conductive film (an ACF) or an anisotropic conductive paste (an ACP) interposed therebetween, so as to be electrically connected to each other. An example is shown here where conductive particles 1338 contained in a resin 1337 having an adhesive property are used for connection. Besides, connection can be performed using a conductive adhesive agent such as a silver paste, a copper paste, or a carbon paste, or using solder bonding, or the like.

In a case where the battery is larger than the element, a plurality of elements are formed over one substrate, as shown in FIGS. 21A and 21B and FIGS. 22A and 22B, and the elements are separated and then the elements are connected to the battery, whereby the number of elements which can be formed over one substrate can be increased. Accordingly, a semiconductor device can be formed at lower cost.

This embodiment can freely be combined with the above embodiment modes and other embodiments. In other words, a battery can be charged periodically; therefore, as in the conventional technique, shortage of power for transmitting and receiving individual information in accordance with deterioration over time of a battery can be prevented. In addition, in charging the battery, the semiconductor device of the present invention receives power in an antenna circuit provided in an RFID so that the battery is charged. Therefore, the semiconductor device can charge the battery with the utilization of power of a radio wave from outside as a power source for driving the RFID without being directly connected to a charger. Consequently, it becomes possible to continuously use the semiconductor device without check of remaining charge capacity of a battery or replacement of the battery, which is necessary in the case of an active RFID. Additionally, power for driving the RFID is always retained in the battery, whereby power which is enough for an operation of the RFID can be obtained and communication distance with the reader/writer can be extended.

In the semiconductor device of the present invention, in addition to the advantage of providing the above battery, a switching circuit is provided in the power supply circuit that supplies power to a signal control circuit which transmits and receives individual information to and from outside to periodically control supply of power to the signal control circuit. An RFID operation can be performed intermittently by control of the supply of power to the signal control circuit in the switching circuit provided in the power supply circuit. Therefore, reduction in the power consumption of the battery can be achieved and further longtime operation can be performed even without supply of power by a wireless signal.

[Embodiment 3]

This embodiment will explain an example of a manufacturing method in using the semiconductor device of the present invention, which is described in the above embodiment modes, as an RFID, with reference to drawings. This embodiment will explain a structure where a power supply circuit and a signal control circuit are provided over the same substrate. Note that a power supply circuit and a signal control circuit are formed over a substrate, and a transistor including the power supply circuit and the signal control circuit is formed as a transistor formed using a single crystal substrate. Therefore, an RFID can be formed of a transistor with less variation in transistor characteristics, which is preferable. In addition, this embodiment will explain an example of using the thin film secondary battery, which is explained in the above embodiment, as a battery in a power supply circuit.

First, separated element regions 2304 and 2306 (hereinafter, also described as regions 2304 and 2306) are formed in a semiconductor substrate 2300 (see FIG. 23A). The regions 2304 and 2306 provided in the semiconductor substrate 2300 are separated from each other by an insulating film 2302 (also referred to as a field oxide film). In addition, a single crystal Si substrate having n-type conductivity is used as the semiconductor substrate 2300, and a p-well 2307 is provided in the regions 2306 of the semiconductor substrate 2300.

In addition, any semiconductor substrate can be used as the substrate 2300. For example, a single crystal silicon substrate having n-type or p-type conductivity, a compound semiconductor substrate (such as a GaAs substrate, an InP substrate, a GaN substrate, a SiC substrate, a sapphire substrate, or a ZnSe substrate), an SOI (Silicon On Insulator) substrate manufactured by a bonding method or a SIMOX (Separation by IMplanted OXygen) method, or the like can be used.

For forming the separated element regions 2304 and 2306, a selective oxidation method (LOCOS (Local Oxidation of Silicon) method), a trench isolation method, or the like can be appropriately used.

Moreover, the p-well formed in the region 2306 of the semiconductor substrate 2300 can be formed by selective introduction of an impurity element having p-type conductivity into the semiconductor substrate 2300. As the p-type impurity element, boron (B), aluminum (Al), gallium (Ga), or the like can be used.

Note that, in this embodiment, although an impurity element is not introduced into the region 2304 because the semiconductor substrate having n-type conductivity is used as the semiconductor substrate 2300, an n-well may be formed in the region 2304 by introduction of an impurity element having n-type conductivity. As the n-type impurity element, phosphorus (P), arsenic (As), or the like can be used. On the other hand, in the case where a semiconductor substrate having p-type conductivity is used, an n-well may be formed in the region 2304 by introduction of an impurity element having n-type conductivity and no impurity element may be introduced into the regions 2306.

Next, insulating films 2332 and 2334 are formed so as to cover the regions 2304 and 2306, respectively (see FIG. 23B).

The insulating films 2332 and 2334 can be formed of silicon oxide films by oxidizing of respective surfaces of the regions 2304 and 2306 provided in the semiconductor substrate 2300 by heat treatment, for example. Alternatively, a surface of a silicon oxide film may be nitrided by nitriding treatment after the silicon oxide film is formed by a thermal oxidation method, whereby the insulating films 2332 and 2334 may be formed in a stacked-layer structure of a silicon oxide film and a film containing oxygen and nitrogen (silicon oxynitride film).

Besides, as described above, the insulating films 2332 and 2334 may also be formed using plasma treatment. For example, oxidation treatment or nitriding treatment with high-density plasma treatment is performed on the surfaces of the regions 2304 and 2306 provided in the semiconductor substrate 2300, whereby a silicon oxide ($SiO_x$) film or a silicon nitride ($SiN_x$) film can be formed as the insulating films 2332 and 2334. Alternatively, after oxidation treatment is performed on the surfaces of the regions 2304 and 2306 by high-density plasma treatment, nitriding treatment may be performed by high-density plasma treatment which is performed again. In this case, a silicon oxide film is formed on the surfaces of the regions 2304 and 2306 in contact, and a silicon oxynitride film is formed over the silicon oxide film so that each of the insulating films 2332 and 2334 is formed as a film in which the silicon oxide film and the silicon oxynitride film are stacked. Further alternatively, after a silicon oxide film is formed over the surfaces of the regions 2304 and 2306 by a thermal oxidation method, oxidation treatment or nitriding treatment may be performed by high-density plasma treatment.

In addition, the insulating films 2332 and 2334 formed in the regions 2304 and 2306 of the semiconductor substrate 2300, respectively, serve as gate insulating films in the transistors which will be subsequently completed.

Next, a conductive film is formed so as to cover the insulating films 2332 and 2334 formed above the regions 2304 and 2306 (see FIG. 23C). In the example described here, a conductive film 2336 and a conductive film 2338 are sequentially stacked as the conductive film. Of course, the conductive film may be formed with a single-layer structure or a staked-layer structure of three or more layers.

The conductive films 2336 and 2338 can be formed of an element selected from tantalum (Ta), tungsten (W), titanium (Ti), molybdenum (Mo), aluminum (Al), copper (Cu), chromium (Cr), niobium (Nb), or the like, or an alloy material or a compound material containing these elements as its main component. Alternatively, a metal nitride film obtained by nitriding of these elements can be used. Further alternatively, a semiconductor material typified by polycrystalline silicon doped with an impurity element such as phosphorus can also be used.

Here, a stacked-layer structure is formed where the conductive film 2336 is formed using tantalum nitride and the conductive film 2338 is formed using tungsten thereover. Alternatively, a single-layer or stacked-layer film of tungsten nitride, molybdenum nitride, or titanium nitride can be used as the conductive film 2336, and a single-layer or stacked-layer film of tantalum, molybdenum, or titanium can be used as the conductive film 2338.

Figure 24A:
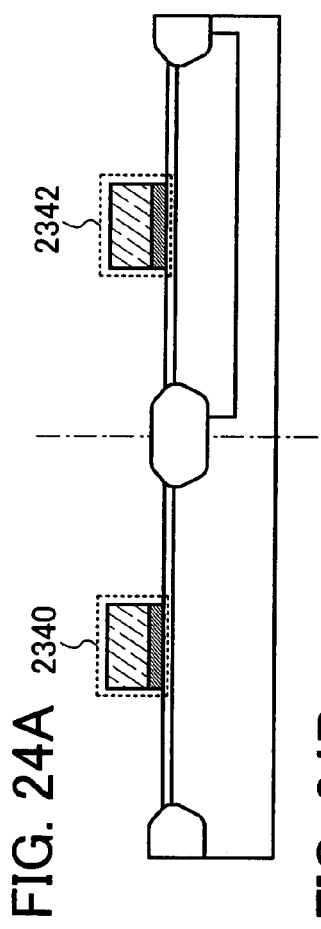
FIGS. 24A to 24C illustrate a structure of Embodiment 3.

Next, the conductive films 2336 and 2338 which are stacked are selectively etched and removed, whereby the conductive films 2336 and 2338 are partially left above the regions 2304 and 2306 to form gate electrodes 2340 and 2342, respectively (see FIG. 24A).

Figure 24B:
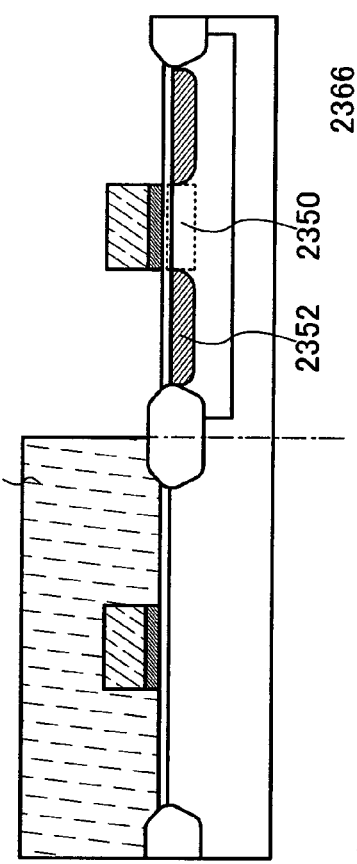

Then, a resist mask 2348 is selectively formed so as to cover the region 2304, and an impurity element is introduced into the region 2306 with the use of the resist mask 2348 and the gate electrode 2342 as masks, whereby impurity regions are formed (see FIG. 24B). As the impurity element, an impurity element imparting n-type conductivity or an impurity element imparting p-type conductivity is used. As the impurity element having n-type conductivity, phosphorus (P), arsenic (As), or the like can be used. As the impurity element having p-type conductivity, boron (B), aluminum (Al), gallium (Ga), or the like can be used. Here, phosphorus (P) is used as the impurity element.

In FIG. 24B, the impurity element is introduced, whereby impurity regions 2352 for each forming a source region or a drain region and a channel formation region 2350 are formed in the region 2306.

Figure 24C:
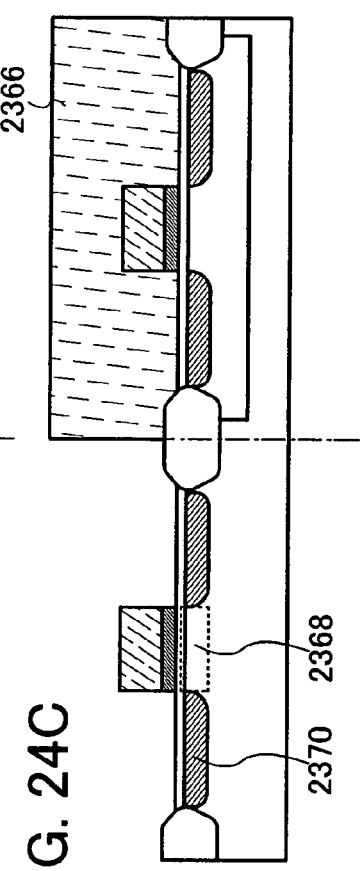

Subsequently, a resist mask 2366 is selectively formed so as to cover the region 2306, and an impurity element is introduced into the region 2304 with the use of the resist mask 2366 and the gate electrode 2340 as masks, whereby impurity regions are formed (see FIG. 24C). As the impurity element, an impurity element imparting n-type conductivity or an impurity element imparting p-type conductivity is used. As the impurity element having n-type conductivity, phosphorus (P), arsenic (As), or the like can be used. As the impurity element having p-type conductivity, boron (B), aluminum (Al), gallium (Ga), or the like can be used. Here, an impurity element having a different conductivity type from the impurity element introduced into the region 2306 in FIG. 24C (for example, boron (B)) is introduced. Consequently, impurity regions 2370 for each forming a source region or a drain region and a channel formation region 2368 are formed in the region 2304.

Next, a second insulating film 2372 is formed so as to cover the insulating films 2332 and 2334, and the gate electrodes 2340 and 2342. A wiring 2374, which is electrically connected to the impurity regions 2352 and 2370 formed in the regions 2304 and 2306, respectively, is formed over the second insulating film 2372 (see FIG. 25A).

The second insulating film 2372 can be provided by a CVD method, a sputtering method, or the like in a single-layer or stacked-layer structure formed of an insulating film having oxygen or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (diamond-like carbon); an organic material such as epoxy, polyimide, polyamide, polyvinyl phenol, benzocyclobutene, or acrylic; or a siloxane material such as a siloxane resin. Note that the siloxane material corresponds to a material having a Si—O—Si bond. Siloxane has a skeleton structure formed from a bond of silicon (Si) and oxygen (O). As a substitutent, an organic group containing at least hydrogen (for example, an alkyl group or aromatic hydrocarbon) is used. A fluoro group can also be used as a substitutent. Alternatively, a fluoro group and an organic group containing at least hydrogen may also be used as a substitutent.

The wiring 2374 is formed by a CVD method, a sputtering method, or the like in a single layer or stacked layers with an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing these elements as its main component. An alloy material containing aluminum as its main component corresponds to, for example, a material containing aluminum as its main component and which also contains nickel, or an alloy material which contains aluminum as its main component and which also contains nickel and one or both of carbon and silicon. The wiring 2374 preferably employs, for example, a stacked-layer structure including a barrier film, an aluminum-silicon (Al—Si) film, and a barrier film, or a stacked-layer structure including a barrier film, an aluminum-silicon (Al—Si) film, a titanium nitride (TiN) film, and a barrier film. Note that the barrier film corresponds to a thin film formed of titanium, a nitride of titanium, molybdenum, or a nitride of molybdenum. Aluminum and aluminum silicon have low resistance and are inexpensive, which are ideal materials for forming the wiring 2374. Moreover, generation of a hillock of aluminum or aluminum silicon can be prevented when upper and lower barrier layers are provided. Further, when the barrier film is formed of titanium, which is a highly-reducible element, even if a thin natural oxide film is formed over the crystalline semiconductor film, the natural oxide film is chemically reduced so that preferable contact with the crystalline semiconductor film can be obtained.

It is additionally described that the structure of the transistor for forming the transistor of the present invention is not limited to the structure shown in the drawings. For example, a transistor having a reverse-stagger structure, a Fin FET structure, or the like can be employed. When a Fin FET structure is employed, a short-channel effect can be suppressed because of miniaturization in transistor size, which is preferable.

In addition, a semiconductor device in the present invention is provided with a battery. As the battery, it is preferable to use the thin film secondary battery which is shown in the above embodiment. Thus, this embodiment will explain the connection to a thin film secondary battery in the transistor which is manufactured in this embodiment.

In this embodiment, the thin film secondary battery is formed by being stacked over the wiring 2374 which is connected to the transistor. As the thin film secondary battery, thin film layers of a collector thin film, a anode active material layer, a solid electrolyte layer, a cathode active material layer, and a collector thin film are stacked sequentially (FIG. 25B). Therefore, the material of the wiring 2374, which is also used as the material of the collector thin films of the thin film secondary battery, needs to have favorable adhesiveness to the anode active material layer and low resistance; thus, aluminum, copper, nickel, vanadium, or the like is preferable.

The structure of the thin film secondary battery will be described in detail. A anode active material layer 2391 is formed over the wiring 2374. Vanadium oxide ($V_2O_5$) or the like is generally used for the anode active material layer 2391. Then, a solid electrolyte layer 2392 is formed over the anode active material layer 2391. Lithium phosphorus oxide ($Li_3PO_4$) or the like is generally used for the solid electrolyte layer 2392. Then, a cathode active material layer 2393 is formed over the solid electrolyte layer 2392. Lithium manganese oxide ($LiMn_2O_4$) or the like is generally used for the cathode active material layer 2393. Lithium cobalt oxide ($LiCoO_2$) or lithium nickel oxide ($LiNiO_2$) may also be used. Then, a collector thin film 2394 to be an electrode is formed over the cathode active material layer 2393. The collector thin film 2394 needs to have favorable adhesiveness to the cathode active material layer 2393 and low resistance; thus, aluminum, copper, nickel, vanadium, or the like can be used.

Each of the thin film layers of the above anode active material layer 2391, solid electrolyte layer 2392, cathode active material layer 2393, and collector thin film 2394 may also be formed using a sputtering technique or an evaporation technique. Each thickness thereof is preferably 0.1 to 3 μm.

Next, coating of resin is performed to form an interlayer film 2396. Then, the interlayer film 2396 is etched to form a contact hole. The interlayer film 2396 is not limited to resin. Another film such as a CVD oxide film may also be used; however, resin is preferable in terms of planarity. In addition, the contact hole may also be formed using photosensitive resin without etching. Subsequently, a wiring layer 2395 is formed over the interlayer film 2396 to be connected to a wiring 2397, whereby electrical connection of the thin film secondary battery is ensured.

With the structure described above, such a structure can be employed where a transistor is formed using a single crystal substrate and a thin film secondary battery is formed over the transistor in a semiconductor device of the present invention. Therefore, it is possible to provide a semiconductor device having flexibility, the extreme thinning and downsizing of which are realized, as a semiconductor device of the present invention.

This embodiment can freely be combined with the above embodiment modes and other embodiments. In other words, a battery can be charged periodically; therefore, as in the conventional technique, shortage of power for transmitting and receiving individual information in accordance with deterioration over time of a battery can be prevented. In addition, in charging the battery, the semiconductor device of the present invention receives power in an antenna circuit provided in an RFID so that the battery is charged. Therefore, the semiconductor device can charge the battery with the utilization of power of a radio wave from outside as a power source for driving the RFID without being directly connected to a charger. Consequently, it becomes possible to continuously use the semiconductor device without check of remaining charge capacity of a battery or replacement of the battery, which is necessary in the case of an active RFID. Additionally, power for driving the RFID is always retained in the battery, whereby power which is enough for an operation of the RFID can be obtained and communication distance with the reader/writer can be extended.

In the semiconductor device of the present invention, in addition to the advantage of providing the above battery, a switching circuit is provided in the power supply circuit that supplies power to a signal control circuit which transmits and receives individual information to and from outside to periodically control supply of power to the signal control circuit. An RFID operation can be performed intermittently by control of the supply of power to the signal control circuit in the switching circuit provided in the power supply circuit. Therefore, reduction in the power consumption of the battery can be achieved and further longtime operation can be performed even without supply of power by a wireless signal.

[Embodiment 4]

This embodiment will explain an example of a manufacturing method in using the semiconductor device of the present invention, which is different from the semiconductor device in Embodiment 3 described above, as an RFID, with reference to drawings. This embodiment will explain a structure where a power supply circuit and a signal control circuit are provided over the same substrate. Note that a power supply circuit and a signal control circuit are formed over a substrate, and a transistor including the power supply circuit and the signal control circuit is formed as a transistor formed using a single crystal substrate. Therefore, an RFID can be formed of a transistor with less variation in transistor characteristics, which is preferable. In addition, this embodiment will explain an example of using the thin film secondary battery, which is explained in the above embodiment, as a battery in a power supply circuit.

Figure 26A:
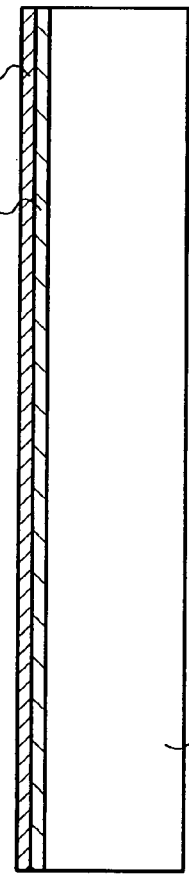
FIGS. 26A to 26C illustrate a structure of Embodiment 4.

First, an insulating film is formed over a substrate 2600. Here, single crystal silicon having n-type conductivity is used for the substrate 2600, and an insulating film 2602 and an insulating film 2604 are formed over the substrate 2600 (see FIG. 26A). For example, silicon oxide ($SiO_x$) is formed as the insulating film 2602 by heat treatment performed to the substrate 2600, and a film of silicon nitride ($SiN_x$) is formed over the insulating film 2602 with the use of a CVD method.

In addition, any semiconductor substrate can be used as the substrate 2600. For example, a single crystal silicon substrate having n-type or p-type conductivity, a compound semiconductor substrate (such as a GaAs substrate, an InP substrate, a GaN substrate, a SiC substrate, a sapphire substrate, or a ZnSe substrate), an SOI (Silicon On Insulator) substrate manufactured by a bonding method or a SIMOX (Separation by IMplanted OXygen) method, or the like can be used.

Moreover, the insulating film 2604 may be provided by nitriding of the insulating film 2602 by high-density plasma treatment after the insulating film 2602 is formed. Note that the insulating film over the substrate 2600 may be formed with a single-layer structure or a staked-layer structure of three or more layers.

Figure 26B:
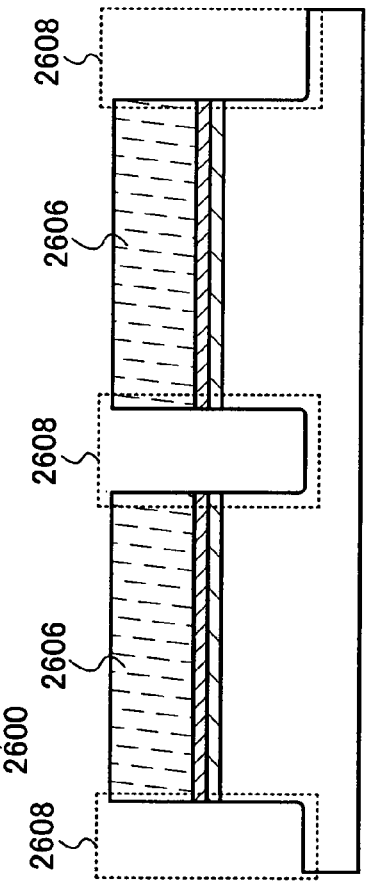

Next, a pattern of a resist mask 2606 is selectively formed over the insulating film 2604 and etching is selectively performed using the resist mask 2606 as a mask, whereby depressions 208 are selectively formed in the substrate 2600 (see FIG. 26B). The etching of the substrate 2600 and the insulating films 2602 and 2604 can be performed by dry etching with the utilization of plasma.

Figure 26C:
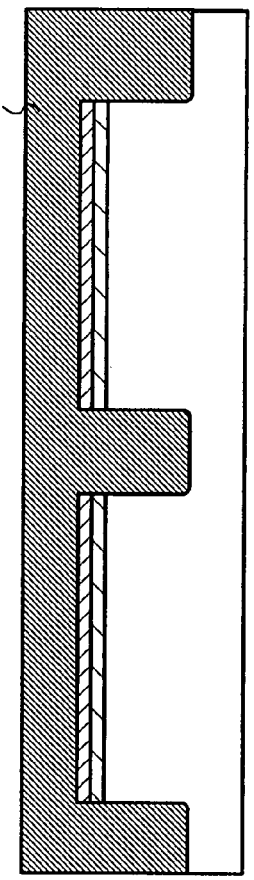

Next, after the pattern of the resist mask 2606 is removed, an insulating film 2610 is formed so as to fill the depressions 2608 formed in the substrate 2600 (see FIG. 26C).

The insulating layer 2610 is formed using a CVD method, a sputtering method, or the like with the use of an insulating material such as silicon oxide, silicon nitride, silicon oxynitride ($SiO_xN_y$ (x>y>0)), or silicon nitride oxide ($SiN_xO_y$ (x>y>0)). Here, a silicon oxide film is formed as the insulating film 2610 with the use of a TEOS (Tetra-Ethyl-Ortho Silicate) gas by a normal-pressure CVD method or a low-pressure CVD method.

Figure 27A:
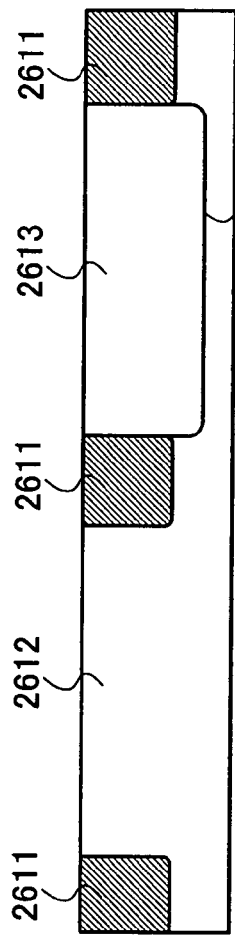
FIGS. 27A to 27C illustrate a structure of Embodiment 4.

Next, grinding treatment, polishing treatment, or CMP (Chemical Mechanical Polishing) treatment is performed, whereby a surface of the substrate 2600 is exposed. Here, the surface of the substrate 2600 is exposed, whereby regions 2612 and 2613 are each provided between insulating films 2611 formed in the depressions 2608 in the substrate 2600. Note that the insulating films 2611 are formed by removal of the insulating film 2610 formed on the surface of the substrate 2600 by grinding treatment, polishing treatment, or CMP treatment. Subsequently, an impurity element having p-type conductivity is selectively introduced, whereby a p-well 2615 is formed in the region 2613 in the substrate 2600 (see FIG. 27A).

As the impurity element having p-type conductivity, boron (B), aluminum (Al), gallium (Ga), or the like can be used. Here, boron (B) is introduced into the region 2613 as the impurity element.

Note that, in this embodiment, although an impurity element is not introduced into the region 2612 because the semiconductor substrate having n-type conductivity is used as the substrate 2600, an n-well may be formed in the region 2612 by introduction of an impurity element having n-type conductivity. As the n-type impurity element, phosphorus (P), arsenic (As), or the like can be used.

On the other hand, in the case where a semiconductor substrate having p-type conductivity is used, an n-well may be formed in the region 2612 by introduction of an impurity element having n-type conductivity and no impurity element may be introduced into the regions 2612 and 2613.

Figure 27B:
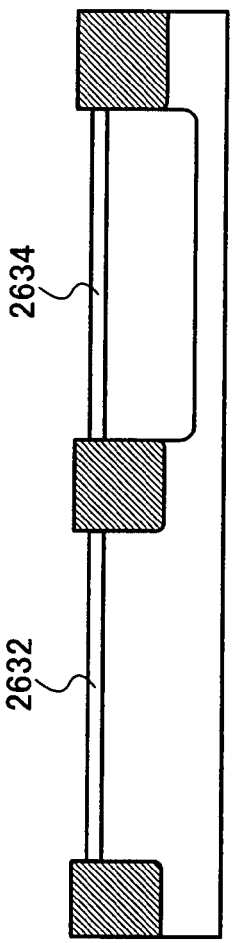

Next, insulating films 2632 and 2634 are formed over surfaces of the regions 2612 and 2613 formed in the substrate 2600, respectively (see FIG. 27B).

The insulating films 2632 and 2634 can be formed of silicon oxide films by oxidizing of respective surface of the regions 2612 and 2613 provided in the substrate 2600 by heat treatment, for example. Alternatively, a surface of a silicon oxide film may be nitrided by nitriding treatment after the silicon oxide film is formed by a thermal oxidation method, whereby the insulating films 2632 and 2634 may be formed in a stacked-layer structure of a silicon oxide film and a film containing oxygen and nitrogen (silicon oxynitride film).

Besides, as described above, the insulating films 2632 and 2634 may also be formed using plasma treatment. For example, oxidation treatment or nitriding treatment with high-density plasma treatment is performed on the surfaces of the regions 2612 and 2613 provided in the substrate 2600, whereby a silicon oxide ($SiO_x$) film or a silicon nitride ($SiN_x$) film can be formed as the insulating films 2632 and 2634. Alternatively, after oxidation treatment is performed on the surfaces of the regions 2612 and 2613 by high-density plasma treatment, nitriding treatment may be performed by high-density plasma treatment which is performed again. In this case, a silicon oxide film is formed on the surfaces of the regions 2612 and 2613 in contact, and a silicon oxynitride film is formed over the silicon oxide film so that each of the insulating films 2632 and 2634 is formed as a film in which the silicon oxide film and the silicon oxynitride film are stacked. Further alternatively, after a silicon oxide film is formed over the surfaces of the regions 2612 and 2613 by a thermal oxidation method, oxidation treatment or nitriding treatment may be performed by high-density plasma treatment.

Note that the insulating films 2632 and 2634 formed in the regions 2612 and 2613 of the substrate 2600, respectively, serve as gate insulating films in the transistors which will be subsequently completed.

Figure 27C:
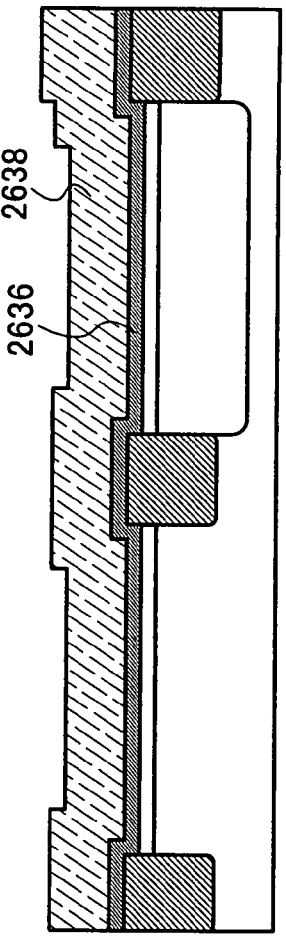

Next, a conductive film is formed so as to cover the insulating films 2632 and 2634 formed above the regions 2612 and 2613 provided in the substrate 2600 (see FIG. 27C). In the example described here, a conductive film 2636 and a conductive film 2638 are sequentially stacked as the conductive film. Of course, the conductive film may be formed with a single-layer structure or a staked-layer structure of three or more layers.

The conductive films 2636 and 2638 can be formed of an element selected from tantalum (Ta), tungsten (W), titanium (Ti), molybdenum (Mo), aluminum (Al), copper (Cu), chromium (Cr), niobium (Nb), or the like, or an alloy material or a compound material containing these elements as its main component. Alternatively, a metal nitride film obtained by nitriding of these elements can be used. Further alternatively, a semiconductor material typified by polycrystalline silicon doped with an impurity element such as phosphorus can also be used.

Here, a stacked-layer structure is provided where the conductive film 2636 is formed using tantalum nitride and the conductive film 2638 is formed using tungsten thereover. Alternatively, a single-layer or stacked-layer film of tungsten nitride, molybdenum nitride, or titanium nitride can be used as the conductive film 2636, and a single-layer or stacked-layer film of tantalum, molybdenum, or titanium can be used as the conductive film 2638.

Figure 28A:
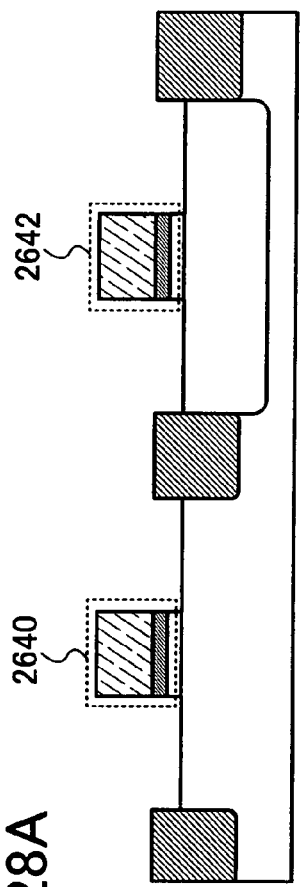
FIGS. 28A to 28C illustrate a structure of Embodiment 4.

Next, the stacked conductive films 2636 and 2638 are selectively etched and removed, whereby the conductive films 2636 and 2638 are partially left above the regions 2612 and 2613 of the substrate 2600 to form conductive films 2640 and 2642 each serving as a gate electrode (see FIG. 28A). In addition, here, surfaces of the regions 2612 and 2613, which are not overlapped with the conductive films 2640 and 2642, are exposed in the substrate 2600.

Specifically, in the region 2612 of the substrate 2600, part of the insulating film 2632 formed under the conductive film 2640, which is not overlapped with the conductive film 2640, is selectively removed so that ends of the conductive film 2640 and the insulating film 2632 roughly conform to each other. In the region 2613 of the substrate 2600, part of the insulating film 2634 formed under the conductive film 2642, which is not overlapped with the conductive film 2642, is selectively removed so that ends of the conductive film 2642 and the insulating film 2634 roughly conform to each other.

In this case, parts of the insulating films and the like which are not overlapped with the conductive films 2640 and 2642 may be removed at the same time as the formation of the conductive films 2640 and 2642, or may be removed after the conductive films 2640 and 2642 are formed using the left resist or the conductive films 2640 and 2642 as masks.

Figure 28B:
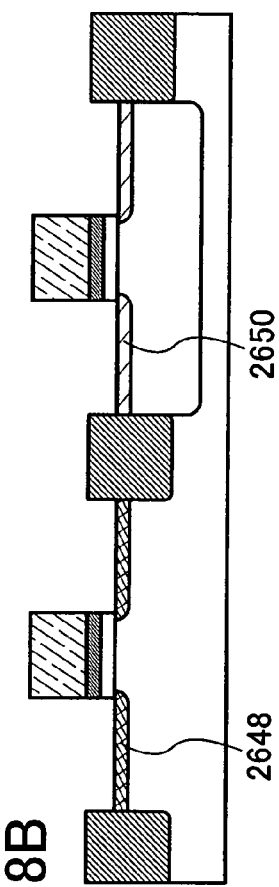

Next, an impurity element is selectively introduced into the regions 2612 and 2613 of the substrate 2600 (see FIG. 28B). Here, an impurity element having n-type conductivity is selectively introduced into a region 2650 at a low concentration with the use of the conductive film 2642 as a mask, while an impurity element having p-type conductivity is selectively introduced into a region 2648 at a low concentration with the use of the conductive film 2640 as a mask. As the impurity element having n-type conductivity, phosphorus (P), arsenic (As), or the like can be used. As the impurity element having p-type conductivity, boron (B), aluminum (Al), gallium (Ga), or the like can be used.

Then, sidewalls 2654 are formed so as to be in contact with side surfaces of the conductive films 2640 and 2642. Specifically, an insulating film such as a film containing an inorganic material such as silicon, an oxide of silicon, or a nitride of silicon, or a film containing an organic material such as an organic resin is formed as a single layer or a stacked layer by a plasma CVD method, a sputtering method, or the like. Then, the insulating film is selectively etched by anisotropic etching mainly in the perpendicular direction such that the insulating film can be formed in contact with the side surfaces of the conductive films 2640 and 2642. Note that the sidewalls 2654 are used as masks for doping when LDD (Lightly Doped Drain) regions are formed. Moreover, here, the sidewalls 2654 are formed so as to be in contact with side surfaces of the insulating films and the conductive films 2640 and 2642 formed under the conductive films 2640 and 2642 as well.

Figure 28C:
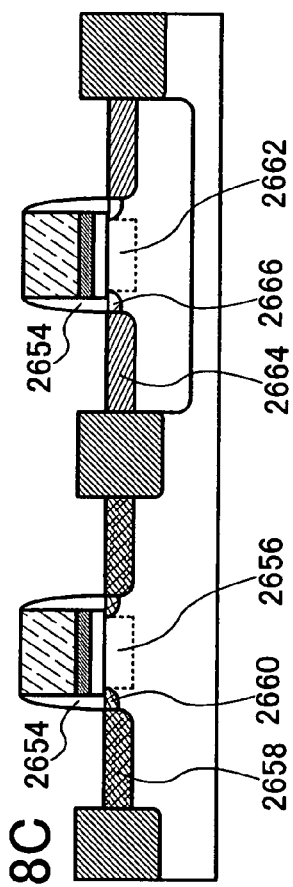

Subsequently, an impurity element is introduced into the regions 2612 and 2613 of the substrate 2600 with the use of the sidewalls 2654 and the conductive films 2640 and 2642 as masks, whereby impurity regions each serving as a source region or a drain region are formed (see FIG. 28C). Here, an impurity element having n-type conductivity is introduced at a high concentration into the region 2613 of the substrate 2600 with the use of the sidewalls 2654 and the conductive film 2642 as masks, while an impurity element having p-type conductivity is introduced at a high concentration into the region 2612 with the use of the sidewalls 2654 and the conductive film 2640 as masks.

Consequently, in the region 2612 of the substrate 2600, impurity regions 2658 for each forming a source region or a drain region, low-concentration impurity regions 2660 forming LDD regions, and a channel formation region 2656 are formed. In the region 2613 of the substrate 2600, impurity regions 2664 for each forming a source region or a drain region, low-concentration impurity regions 2666 forming LDD regions, and a channel formation region 2662 are formed.

Note that, in this embodiment, the introduction of the impurity element is performed under a condition in which the parts of the regions 2612 and 2613 of the substrate 2600, which are not overlapped with the conductive films 2640 and 2642, are exposed. Therefore, the channel formation regions 2656 and 2662 formed in the regions 2612 and 2613 of the substrate 2600, respectively, can be formed in a self-aligned manner with the conductive films 2640 and 2642.

Figure 29A:
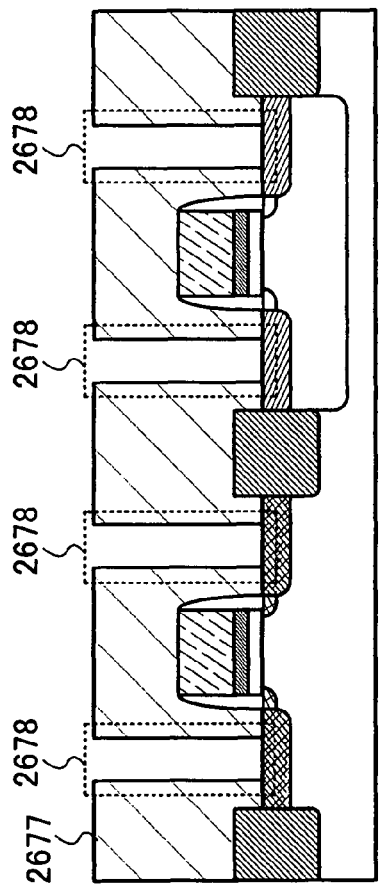
FIGS. 29A and 29B illustrate a structure of Embodiment 4.

Next, second insulating films 2677 are formed so as to cover the insulating films, the conductive films, and the like provided over the regions 2612 and 2613 of the substrate 2600 to form openings 2678 in the insulating film 2677 (see FIG. 29A).

The second insulating film 2677 can be provided by a CVD method, a sputtering method, or the like in a single-layer or stacked-layer structure formed of an insulating film having oxygen or nitrogen such as silicon oxide ($SiO_x$), silicon nitride ($SiN_x$), silicon oxynitride ($SiO_xN_y$, where x>y>0), or silicon nitride oxide ($SiN_xO_y$, where x>y>0); a film containing carbon such as DLC (diamond-like carbon); an organic material such as epoxy, polyimide, polyamide, polyvinyl phenol, benzocyclobutene, or acrylic; or a siloxane material such as a siloxane resin. Note that the siloxane material corresponds to a material having a Si—O—Si bond. Siloxane has a skeleton structure formed from a bond of silicon (Si) and oxygen (O). As a substitutent, an organic group containing at least hydrogen (for example, an alkyl group or aromatic hydrocarbon) is used. A fluoro group can also be used as a substitutent. Alternatively, a fluoro group and an organic group containing at least hydrogen may also be used as a substitutent.

Figure 29B:
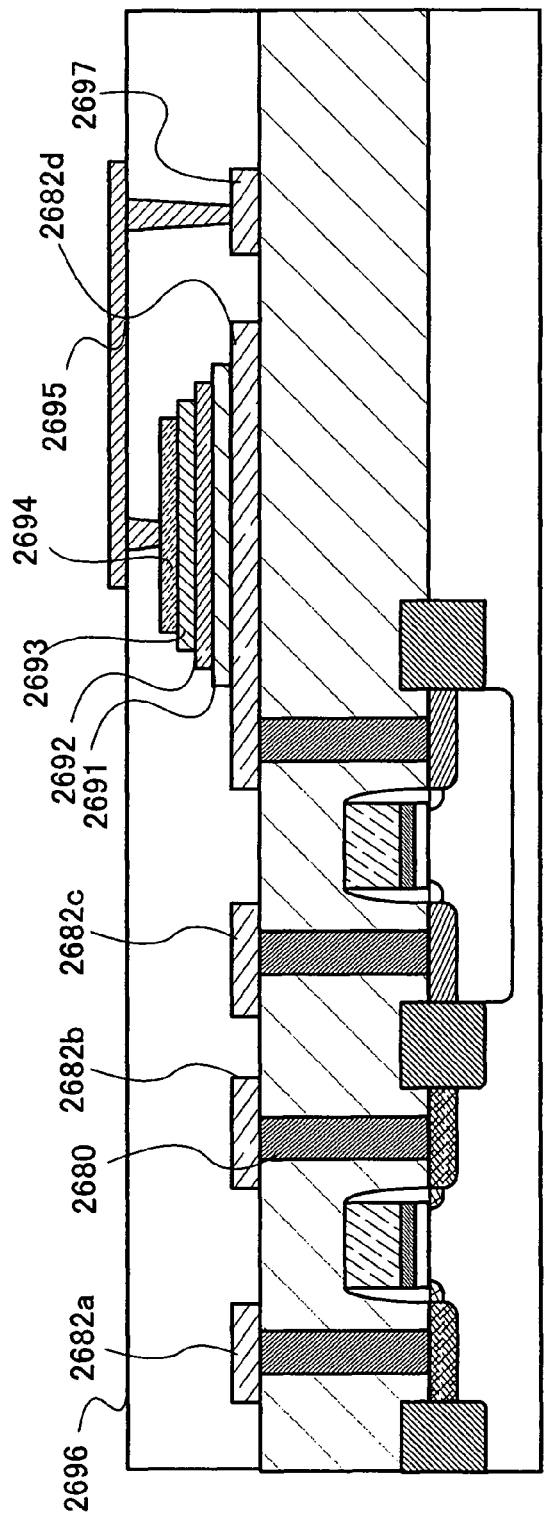

Next, conductive films 2680 are formed in the openings 2678 with the use of a CVD method to selectively form conductive films 2682a to 2682d over the insulating film 2677 so as to be electrically connected to the conductive films 2680 (see FIG. 29B).

The conductive films 2680, and 2682a to 2682d are formed by a CVD method, a sputtering method, or the like in a single layer or stacked layers with an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing these elements as its main component. An alloy material containing aluminum as its main component corresponds to, for example, a material containing aluminum as its main component and which also contains nickel, or an alloy material which contains aluminum as its main component and which also contains nickel and one or both of carbon and silicon. The conductive films 2680, and 2682a to 2682d preferably employ, for example, a stacked-layer structure including a barrier film, an aluminum-silicon (Al—Si) film, and a barrier film, or a stacked-layer structure including a barrier film, an aluminum-silicon (Al—Si) film, a titanium nitride (TiN) film, and a barrier film. Note that the barrier film corresponds to a thin film formed of titanium, a nitride of titanium, molybdenum, or a nitride of molybdenum. Aluminum and aluminum silicon have low resistance and are inexpensive, which are ideal materials for forming the conductive films 2680, and 2682a to 2682d. Moreover, generation of a hillock of aluminum or aluminum silicon can be prevented when upper and lower barrier layers are provided. Further, when the barrier film is formed of titanium, which is a highly-reducible element, even if a thin natural oxide film is formed over the crystalline semiconductor film, the natural oxide film is chemically reduced so that preferable contact with the crystalline semiconductor film can be obtained. Here, each of the conductive films 2680, and 2682a to 2682d can be formed by selective growth of tungsten (W) using a CVD method.

In the above steps, a semiconductor device provided with a p-type transistor formed in the region 2612 and an n-type transistor formed in the region 2613 of the substrate 2600 can be obtained.

It is additionally described that the structure of the transistor for forming the transistor of the present invention is not limited to the structure shown in the drawings. For example, a transistor having a reverse-stagger structure, a Fin FET structure, or the like can be employed. When a Fin FET structure is employed, a short-channel effect can be suppressed because of miniaturization in transistor size, which is preferable.

In addition, a semiconductor device in the present invention is provided with a battery. As the battery, it is preferable to use the thin film secondary battery which is shown in the above embodiment. Thus, this embodiment will explain the connection to a thin film secondary battery in the transistor which is manufactured in this embodiment.

In this embodiment, the thin film secondary battery is formed by being stacked over the conductive film 2682d which is connected to the transistor. As the thin film secondary battery, thin film layers of a collector thin film, an anode active material layer, a solid electrolyte layer, a cathode active material layer, and a collector thin film are stacked sequentially (FIG. 29B). Therefore, the material of the conductive film 2682d, which is also used as the material of the collector thin films of the thin film secondary battery, needs to have favorable adhesiveness to the anode active material layer and low resistance; thus, aluminum, copper, nickel, vanadium, or the like is preferable.

The structure of the thin film secondary battery will be described in detail. An anode active material layer 2691 is formed over the conductive film 2682d. Vanadium oxide ($V_2O_5$) or the like is generally used for the anode active material layer 2691. Then, a solid electrolyte layer 2692 is formed over the anode active material layer 2691. Lithium phosphorus oxide ($Li_3PO_4$) or the like is generally used for the solid electrolyte layer 2692. Then, a cathode active material layer 2693 is formed over the solid electrolyte layer 2692. Lithium manganese oxide ($LiMn_2O_4$) or the like is generally used for the cathode active material layer 2693. Lithium cobalt oxide ($LiCoO_2$) or lithium nickel oxide ($LiNiO_2$) may also be used. Then, a collector thin film 2694 to be an electrode is formed over the cathode active material layer 2693. The collector thin film 2694 needs to have favorable adhesiveness to the cathode active material layer 2693 and low resistance; thus, aluminum, copper, nickel, vanadium, or the like can be used.

Each of the thin film layers of the above anode active material layer 2691, solid electrolyte layer 2692, cathode active material layer 2693, and collector thin film 2694 may also be formed using a sputtering technique or an evaporation technique. Each thickness thereof is preferably 0.1 to 3 µm.

Next, coating of resin is performed to form an interlayer film 2696. Then, the interlayer film 2696 is etched to form a contact hole. The interlayer film 2696 is not limited to resin.

Another film such as a CVD oxide film may also be used; however, resin is preferable in terms of planarity. In addition, the contact hole may also be formed using photosensitive resin without etching. Subsequently, a wiring layer 2695 is formed over the interlayer film 2696 to be connected to a wiring 2697, whereby electrical connection of the thin film secondary battery is ensured.

With the structure described above, such a structure can be employed where a transistor is formed using a single crystal substrate and a thin film secondary battery is formed over the transistor in a semiconductor device of the present invention. Therefore, it is possible to provide a semiconductor device having flexibility, the extreme thinning and downsizing of which are realized, as a semiconductor device of the present invention.

This embodiment can freely be combined with the above embodiment modes and other embodiments. In other words, a battery can be charged periodically; therefore, as in the conventional technique, shortage of power for transmitting and receiving individual information in accordance with deterioration over time of a battery can be prevented. In addition, in charging the battery, the semiconductor device of the present invention receives power in an antenna circuit provided in an RFID so that the battery is charged. Therefore, the semiconductor device can charge the battery with the utilization of power of a radio wave from outside as a power source for driving the RFID without being directly connected to a charger. Consequently, it becomes possible to continuously use the semiconductor device without check of remaining charge capacity of a battery or replacement of the battery, which is necessary in the case of an active RFID. Additionally, power for driving the RFID is always retained in the battery, whereby power which is enough for an operation of the RFID can be obtained and communication distance with the reader/writer can be extended.

In the semiconductor device of the present invention, in addition to the advantage of providing the above battery, a switching circuit is provided in the power supply circuit that supplies power to a signal control circuit which transmits and receives individual information to and from outside to periodically control supply of power to the signal control circuit. An RFID operation can be performed intermittently by control of the supply of power to the signal control circuit in the switching circuit provided in the power supply circuit. Therefore, reduction in the power consumption of the battery can be achieved and further longtime operation can be performed even without supply of power by a wireless signal.

[Embodiment 5]

Figure 33:
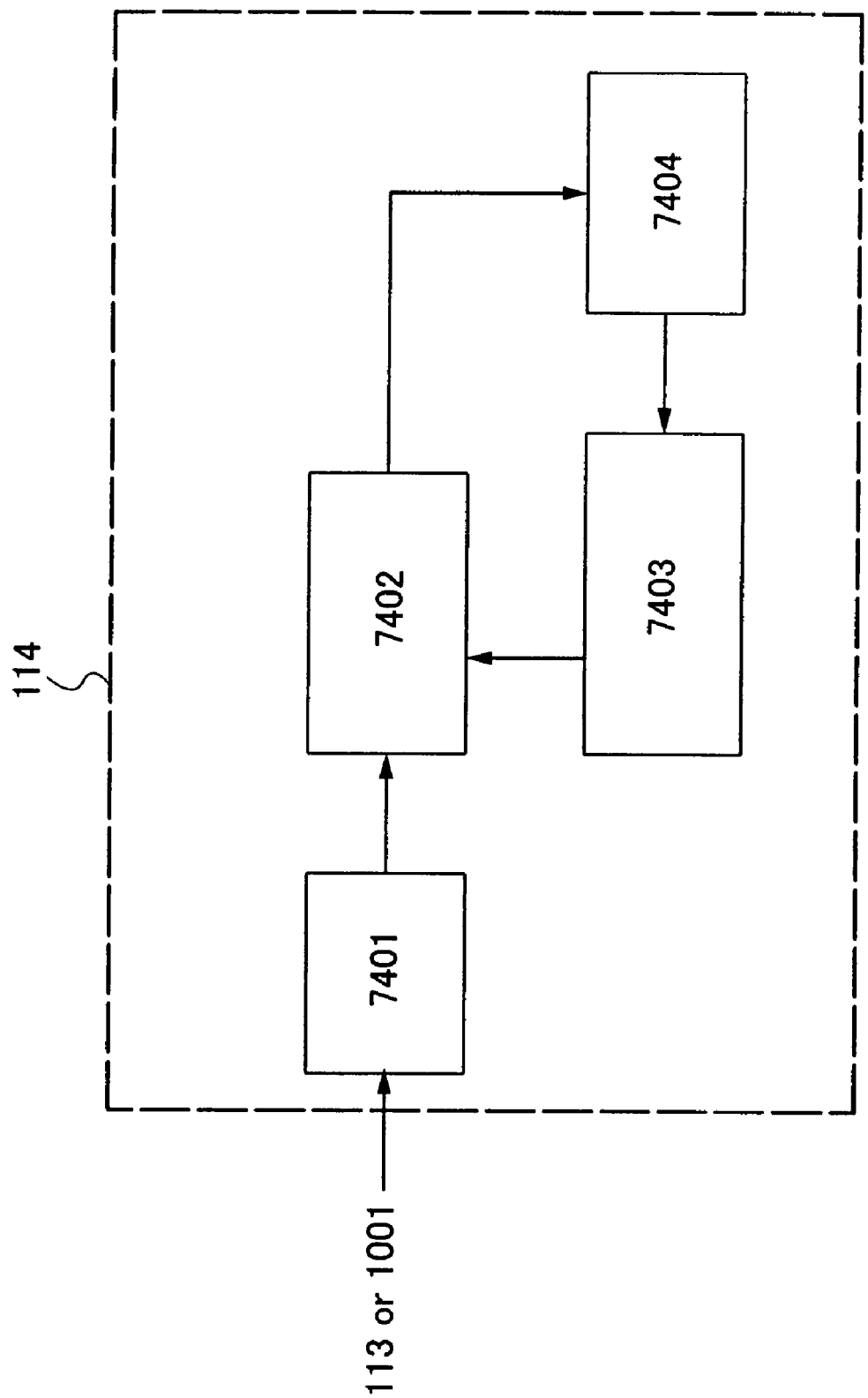
FIG. 33 illustrates a structure of Embodiment 5.

This embodiment will explain a charge management circuit for managing the charge of a battery of a power supply circuit in the semiconductor device of the present invention which is described in the above embodiment modes and embodiments. When a secondary battery is used as a battery in the present invention, generally, it is necessary to control the charge and discharge. It is necessary to charge the secondary battery while a charge situation is monitored so that the secondary battery is not overcharged in the case of the charge. When the charge of the secondary battery used in the present invention is managed, a dedicated circuit is needed. FIG. 33 shows a block diagram of a charge management circuit for performing charge management.

The charge management circuit shown in FIG. 33 includes a constant current source 7401, a switching circuit 7402, a charge amount control circuit 7403, and a secondary battery 7404. Note that the constant current source 7401, the switching circuit 7402, the charge amount control circuit 7403, and the secondary battery 7404 in the structure shown in FIG. 33 corresponds as a whole to the battery 114 of FIG. 1 which is shown in Embodiment Mode 1 described above. In other words, signals from the rectifier circuit 113 in FIG. 1 and the control circuit 1001 in FIG. 10, which are described in the above embodiment modes, are inputted into the constant current source 7401 in the battery 114.

The charge management circuit described here, which is just an example, is not limited to this structure and other structures may also be employed. In this embodiment, the secondary battery is charged by the constant current; however, instead of charge only by the constant current, the charge by the constant current may also be switched to a charge by a constant voltage at a certain point. Alternatively, another method without a constant current may also be employed. Moreover, transistors that form the circuits in the block diagram of FIG. 33, which will be explained below, may be a thin film transistor, a transistor using a single-crystal substrate, or an organic transistor.

Figure 34:
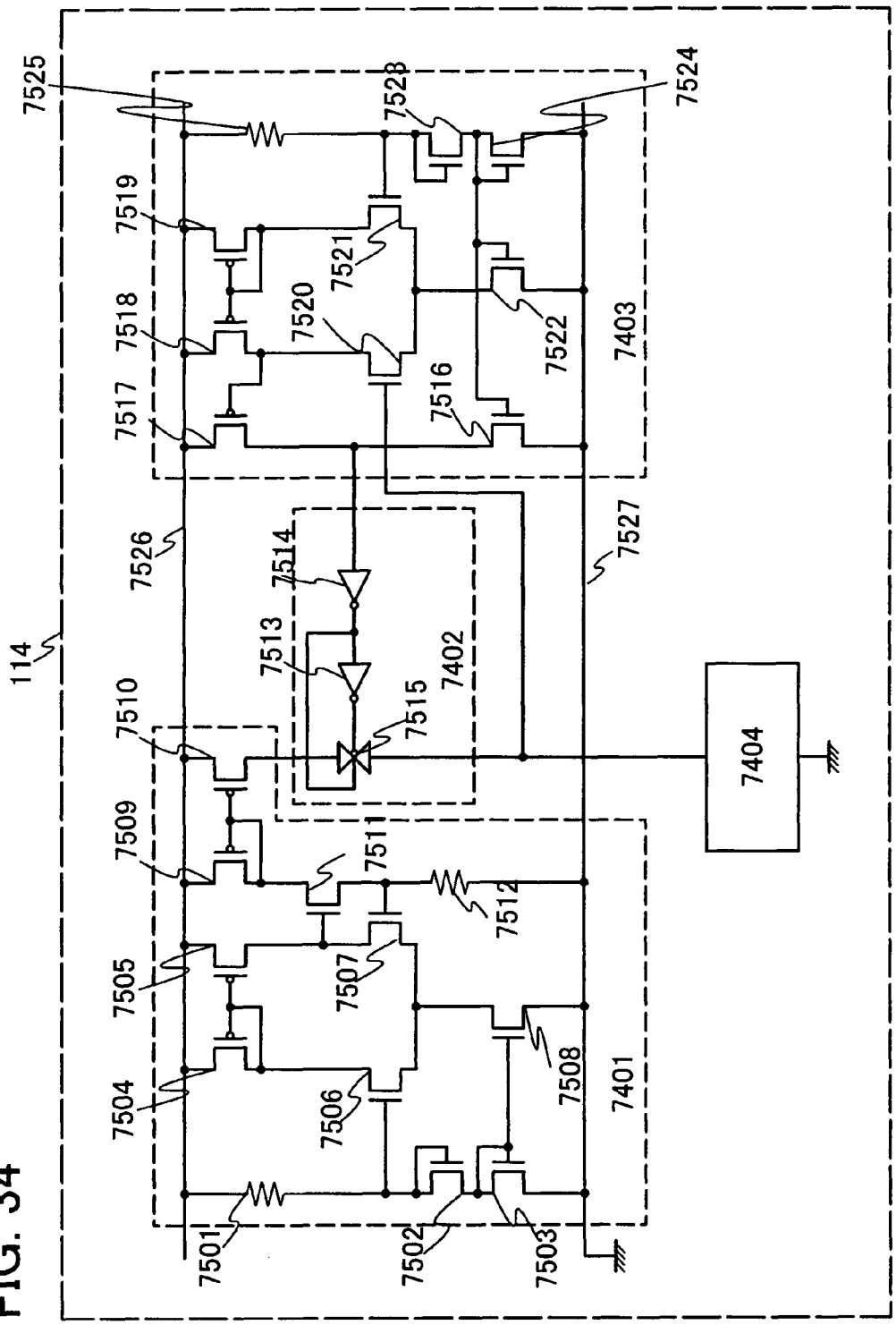
FIG. 34 illustrates a structure of Embodiment 5.

FIG. 34 shows the block diagram shown in FIG. 33 described above in more detail. Hereinafter, operations thereof will be explained.

In the structure shown in FIG. 34, the constant current source 7401, the switching circuit 7402, and the charge amount control circuit 7403 each use a high-potential power source line 7526 and a low-potential power source line 7527 as power source lines. The low-potential power source line 7527 is used as a GND line in FIG. 34; however, without limitation to a GND line, the low-potential power source line 7527 may also be used as other potential.

The constant current source 7401 includes transistors 7502 to 7511 and resistors 7501 and 7512. Current flows to the transistors 7502 and 7503 from the high-potential power source line 7526 through the resistor 7501; thus, the transistors 7502 and 7503 are turned on.

The transistors 7504, 7505, 7506, 7507, and 7508 form a feedback differential amplifier circuit, and the gate potential of the transistor 7507 is almost the same as the gate potential of the transistor 7502. The value of the drain current of the transistor 7511 is obtained by division of a difference between the gate potential of the transistor 7507 and the potential of the low-potential power source line 7527 by the resistance of the resistor 7512. The current is inputted into a current mirror circuit formed of the transistors 7509 and 7510, and the output current of the current mirror circuit is supplied to the switching circuit 7402. The constant current source 7401 is not limited to this structure and other structures may also be employed.

The switching circuit 7402 includes a transmission gate 7515 and inverters 7513 and 7514. Whether the current of the constant current source 7401 is supplied to the secondary battery 7404 or not is controlled by an input signal of the inverter 7514. The switching circuit is not limited to this structure and other structures may also be employed.

The charge amount control circuit 7403 includes transistors 7516 to 7524 and a resistor 7525. Current flows to the transistors 7523 and 7524 from the high-potential power source line 7526 through the resistor 7525; thus, the transistors 7523 and 7524 are turned on. The transistors 7518, 7519, 7520, 7521, and 7522 form a differential comparator. When the gate potential of the transistor 7520 is lower than the gate potential of the transistor 7521, the drain potential of the transistor 7518 is almost equivalent to the potential of the high-potential power source line 7526. When the gate potential of the transistor 7520 is higher than the gate potential of the transistor 7521, the drain potential of the transistor 7518 is almost equivalent to the source potential of the transistor 7520.

When the drain potential of the transistor 7518 is almost equivalent to the potential of the high-potential power source line, the charge amount control circuit outputs low through a buffer including the transistors 7517 and 7516.

When the drain potential of the transistor 7518 is almost equivalent to the source potential of the transistor 7520, the charge amount control circuit outputs high through the buffer including the transistors 7517 and 7516.

When the output of the charge amount control circuit 7403 is low, a current is supplied to the secondary battery through the switching circuit 7402. In addition, when the output of the charge amount control circuit 7403 is high, the switching circuit 7402 is turned off and no current is supplied to the secondary battery.

Since the gate of the transistor 7520 is connected to the secondary battery 7404, the secondary battery is charged, and the charge is stopped when the potential exceeds a threshold value of the comparator of the charge amount control circuit 7403. The threshold value of the comparator is set depending on the gate potential of the transistor 7523 in this embodiment; however, the threshold value is not limited thereto and other potential may also be employed. In general, predetermined potential is appropriately determined depending on the use of the charge amount control circuit 7403 and the performance of the secondary battery.

The above charge circuit to the secondary battery is formed in this embodiment; however, the charge circuit is not limited to this structure.

With such a structure described above, a function for managing the charge of a battery in a power supply circuit of a semiconductor device can be added to a semiconductor device of the present invention. Thus, it is possible to provide a semiconductor device that can prevent malfunction such as excessive charge of a battery in a power supply circuit thereof as a semiconductor device of the present invention.

This embodiment can freely be combined with the above embodiment modes and other embodiments. In other words, a battery can be charged periodically; therefore, as in the conventional technique, shortage of power for transmitting and receiving individual information in accordance with deterioration over time of a battery can be prevented. In addition, in charging the battery, the semiconductor device of the present invention receives power in an antenna circuit provided in an RFID so that the battery is charged. Therefore, the semiconductor device can charge the battery with the utilization of power of a radio wave from outside as a power source for driving the RFID without being directly connected to a charger. Consequently, it becomes possible to continuously use the semiconductor device without check of remaining charge capacity of a battery or replacement of the battery, which is necessary in the case of an active RFID. Additionally, power for driving the RFID is always retained in the battery, whereby power which is enough for an operation of the RFID can be obtained and communication distance with the reader/writer can be extended.

In the semiconductor device of the present invention, in addition to the advantage of providing the above battery, a switching circuit is provided in the power supply circuit that supplies power to a signal control circuit which transmits and receives individual information to and from outside to periodically control supply of power to the signal control circuit. An RFID operation can be performed intermittently by control of the supply of power to the signal control circuit in the switching circuit provided in the power supply circuit. Therefore, reduction in the power consumption of the battery can be achieved and further longtime operation can be performed even without supply of power by a wireless signal.

[Embodiment 6]

This embodiment will explain uses of a semiconductor device of the present invention which communicates data by wireless communication (hereinafter, referred to as an RFID). A semiconductor device of the present invention can be used as a so-called IC label, IC tag, and ID card provided in, for example, bills, coins, securities, bearer bonds, documents (such as driver's licenses or resident's cards), packaging containers (such as wrapping paper or bottles), storage media (such as DVD software or video tapes), vehicles (such as bicycles), personal belongings (such as bags or glasses), foods, plants, animals, human bodies, clothing, commodities, products such as electronic devices, or an article such as shipping tags of baggage. The electronic devices include a liquid crystal display device, an EL display device, a television set (also simply called a television, a TV receiver, or a television receiver), a cellular phone, and the like.

Note that an IC card refers in this specification to a card that is formed by implantation of a semiconductor integrated circuit (an IC chip) in a lamination form into a plastic card so that data can be stored. The IC cards can be categorized into "a contact type" and "a non-contact type" in accordance with a system of reading and writing data. The non-contact type card is incorporated with an antenna, which can communicate with a terminal by utilization of weak radio waves. An IC tag refers to a small IC chip used for identification of objects, which stores data such as its own identification code, and capable of transmitting and receiving data with a management system through radio waves. The IC tag having a size of several tens millimeters can communicate with a reader through radio waves or electromagnetic waves. There are various applications of an IC tag of the present invention used for an RFID which performs wireless data communication, such as a card type, a label type (referred to as an IC label), and a certificate type.

In this embodiment, applications of the present invention and examples of a product with the RFID are explained with reference to FIGS. 30A to 30E.

Figure 30A:
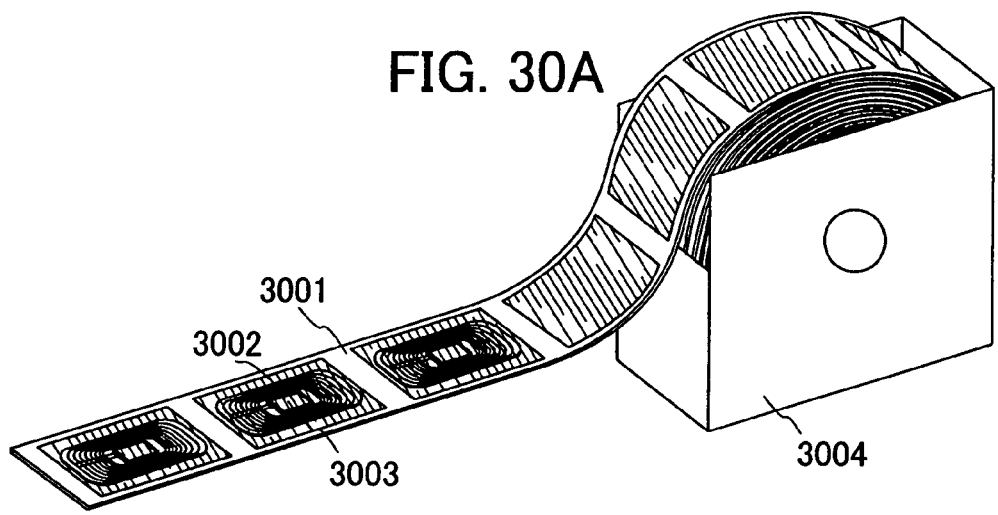
FIGS. 30A to 30E each illustrate a structure of Embodiment 6.

FIG. 30A shows an example of a state of completed products of semiconductor devices of the present invention having an RFID. On a label board (separate paper) 3001, a plurality of IC labels 3003 each incorporating an RFID 3002 are formed. The IC labels 3003 are held in a box 3004. In addition, on the IC label 3003, information on a product or service (a name of the product, a brand, a trademark, a trademark owner, a seller, a manufacturer, and the like) is written, while an ID number that is unique to the product (or the kind of the product) is assigned to the incorporated RFID to make it possible to easily figure out forgery, infringement of intellectual property rights such as a patent right and a trademark right, and illegality such as unfair competition. In addition, a lot of information that is too much to write clearly on a container of the product or the label, for example, the production area, selling area, quality, raw material, efficacy, use, quantity, shape, price, production method, usage, time of the production, time of the use, expiration date, instructions of the product, information on the intellectual property of the product, or the like can be inputted into the RFID so that a trader and a consumer can access the information with the use of a simple reader. While the producer can also easily rewrite or delete the information, a trader or a consumer is not allowed to rewrite or delete the information.

Figure 30B:
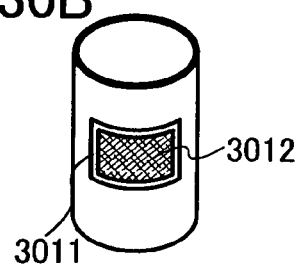

FIG. 30B shows a label-shaped IC tag 3011 incorporating an RFID 3012. By being provided with the IC tag 3011, the products can be managed easily. For example, in the case where the product is stolen, the pathway of the product is traced so that where the product is stolen in the distribution pathway can be figured out quickly. Thus, by being provided with the IC tag, products that are superior in so-called traceability can be distributed. In addition, a structure where the RFID is provided with a thin film secondary battery as a battery can be employed in the present invention. Therefore, the present invention is useful in also attaching the RFID to an article having a curved surface as shown in FIG. 30B.

Figures 30C, 30D:
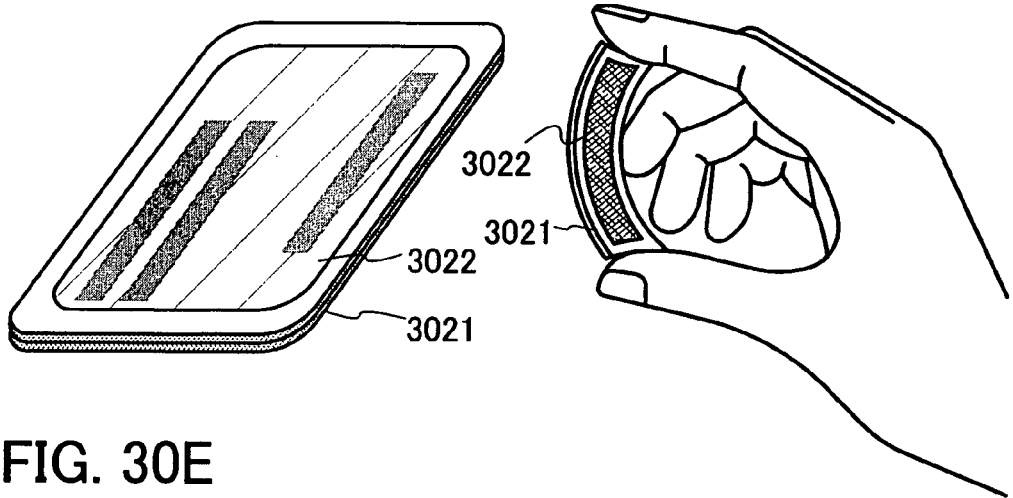

FIG. 30C shows an example of a state of a completed product of an IC card 3021 of the present invention including an RFID 3022. The IC card 3021 includes all kinds of cards such as a cash card, a credit card, a prepaid card, an electronic ticket, electronic money, a telephone card, and a membership card.

The IC card shown in FIG. 30C can employ a structure where the RFID is provided with a thin film secondary battery as a battery of the present invention. Therefore, since the IC card can be used even by being transformed into a bent shape as shown in FIG. 30D, the present invention is extremely useful.

Figure 30E:
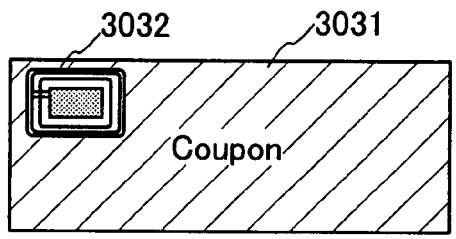
Figure 31:
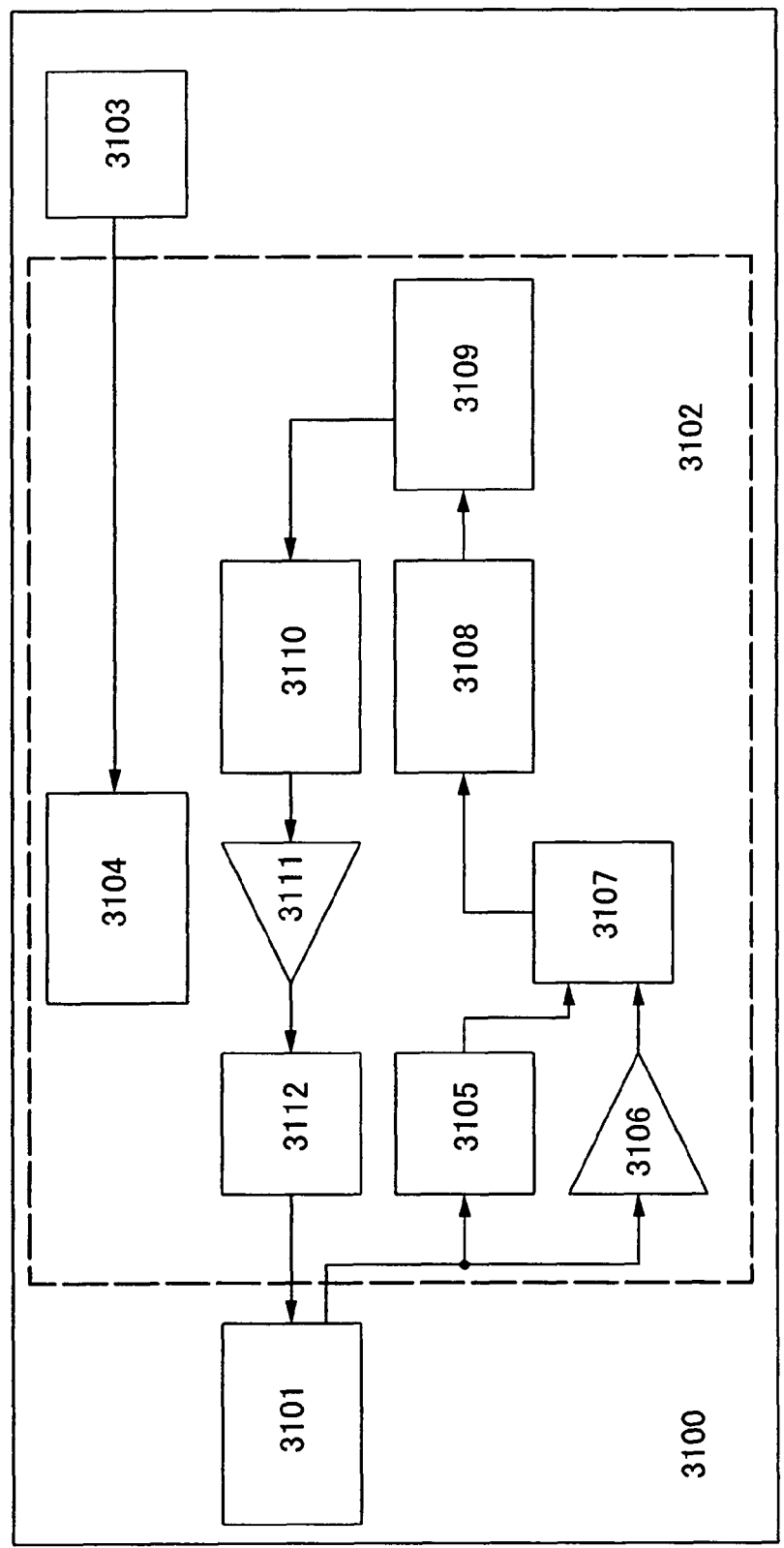
FIG. 31 illustrates a conventional structure.
Figure 32:
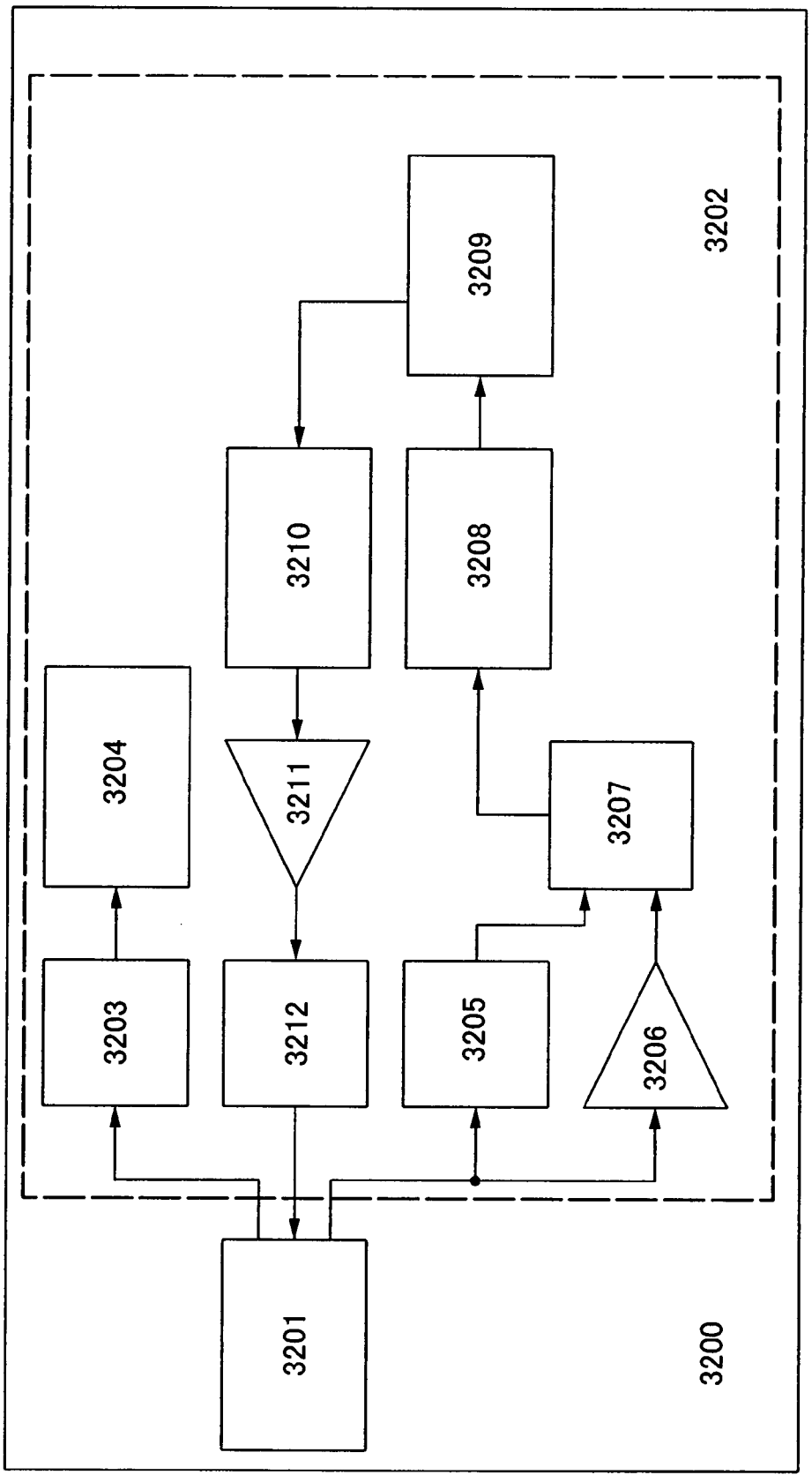
FIG. 32 illustrates a conventional structure.

FIG. 30E shows an example of a state of a completed product of a bearer bond 3031. An RFID 3032 is embedded in the bearer bond 3031 and protected by a resin formed in the periphery thereof. Here, the resin is filled with a filler. The bearer bond 3031 can be formed in the same manner as an IC label, an IC tag, and an IC card of the present invention. Note that the bearer bond described above includes stamps, tickets, admission tickets, merchandise coupons, book coupons, stationery coupons, beer coupons, rice coupons, various gift coupons, various service coupons, and the like. Of course, the bearer bond is not limited thereto. In addition, when the RFID 3032 of the present invention is provided in bills, coins, securities, bearer bonds, documents, or the like, an authentication function can be provided; therefore, forgery can be prevented with the use of the authentication function.

In addition, although not shown here, the RFID of the present invention is provided for books, packaging containers, storage media, personal belongings, foods, clothing, commodities, electronic devices, or the like, whereby the efficiency of a system such as an inspection system can be improved. Moreover, counterfeits and theft can be prevented by provision of the RFID on vehicles. Individual creatures such as animals can be easily identified by being implanted with the RFID. For example, year of birth, sex, breed, and the like can be easily identified by implantation of the RFID in creatures such as domestic animals.

As described above, the RFID of the present invention can be provided in any article (including creatures) and used.

Note that this embodiment mode can freely be combined with the above embodiment modes and other embodiments.

The present application is based on Japanese Patent Application serial No. 2006-152831 filed on May 31, 2006 in Japan Patent Office, the entire contents of which are hereby incorporated by reference.

The invention claimed is:

1. A semiconductor device comprising:
an antenna circuit;
a power supply circuit; and
a signal control circuit, wherein the power supply circuit comprises:
a rectifier circuit which rectifies signals from the antenna circuit;
a control circuit;
a battery which is charged by the rectified signals;
a low-frequency signal generation circuit which receives the rectified signals;
a switching circuit; and
a power source circuit,
wherein the control circuit is configured to supply a power outputted from the rectifier circuit to the power source circuit through the switching circuit and to charge the battery when a voltage outputted from the rectifier circuit is higher enough than a voltage of the battery,
wherein the control circuit is configured to supply the power outputted from the rectifier circuit to the power source circuit through the switching circuit and not to charge the battery when the voltage outputted from the rectifier circuit is not higher enough but still higher than the voltage of the battery, and to supply a power of the battery to the power source circuit through the switching circuit and not to charge the battery when the voltage outputted from the rectifier circuit is lower than the voltage of the battery,
wherein the low-frequency signal generation circuit comprises:
a ring oscillator that outputs an oscillation signal at a frequency;
a divider circuit configured to divide the frequency of the oscillation signal outputted from the ring oscillator and provide an output of plurality of sequentially divided oscillation signals; and
an AND circuit configured to generate a low-duty ratio signal from the output of the divider circuit, and
wherein the switching circuit controls the power supplied from the battery to the power source circuit and the power outputted from the rectifier circuit to the power source circuit, by the low-duty ratio signal from the low-frequency signal generation circuit.

2. A semiconductor device comprising:
an antenna circuit;
a power supply circuit; and
a signal control circuit,
wherein the power supply circuit comprises:
a rectifier circuit which rectifies signals from the antenna circuit;
a control circuit;
a battery which is charged by the rectified signals;
a low-frequency signal generation circuit which receives the rectified signals;
a switching circuit; and
a power source circuit,
wherein the control circuit compares a voltage outputted from the rectifier circuit with a voltage of the battery to select power supplied to the switching circuit from power from the rectifier circuit and power from the battery,
wherein the control circuit is configured to supply the power outputted from the rectifier circuit to the power source circuit through the switching circuit and to charge the battery when the voltage outputted from the rectifier circuit is higher enough than the voltage of the battery, to supply power outputted from the rectifier circuit to the power source circuit through the switching circuit and not to charge the battery when the voltage outputted from the rectifier is not higher enough but still higher than the voltage of the battery, and to supply a power of the battery to the power source circuit through the switching circuit and not to charge the battery when the voltage outputted from the rectifier circuit is lower than the voltage of the battery,
wherein the low-frequency signal generation circuit comprises:
a ring oscillator that outputs an oscillation signal at a frequency;

a divider circuit configured to divide the frequency of the oscillation signal outputted from the ring oscillator and provide an output of plurality of sequentially divided oscillation signals; and an AND circuit configured to generate a low-duty ratio signal from the output of the divider circuit, and wherein the switching circuit controls the power supplied from the battery to the power source circuit through the control circuit and the power outputted from the rectifier circuit to the power source circuit, by the low-duty ratio signal from the low frequency signal generation circuit.

3. A semiconductor device according to claim 1 or 2, wherein the battery is one selected from the group consisting of a lithium battery, a nickel-metal-hydride battery, a nickel-cadmium battery, an organic-radical battery and a capacitor.

4. A semiconductor device according to claim 1 or 2, wherein the battery includes an anode active material layer, a solid electrolyte layer over the anode active material layer, a cathode active material layer over the solid electrolyte layer, and a collector thin film over the cathode active material layer.

5. A semiconductor device according to claim 2, wherein the control circuit is a circuit which connects the battery and the switching circuit when power from the rectifier circuit is less than power from the battery, and does not connect the battery and the switching circuit when power from the battery is less than power from the rectifier circuit.

6. A semiconductor device according to claim 1 or 2, further comprising a booster antenna, and the antenna circuit receives a signal from the outside through the booster antenna.

7. A semiconductor device according to claim 1 or 2, wherein the antenna circuit includes a first antenna circuit for receiving power to charge the battery and a second antenna circuit for transmitting and receiving signals to and from the signal control circuit.

8. A semiconductor device according to claim 7, wherein the first antenna circuit includes a plurality of antenna circuits.

9. A semiconductor device according to claim 7, wherein one of the first antenna circuit and the second antenna circuit receives a signal by using electromagnetic induction.

10. A semiconductor device according to claim 1 or 2, wherein the low-frequency signal generation circuit generates the low-duty ratio signal outputted to the switching circuit by frequency-division of clock signals.

11. A semiconductor device according to claim 1 or 2, wherein the signal control circuit includes an amplifier circuit, a modulation circuit, a demodulation circuit, a logic circuit, and a memory control circuit.

12. An IC label comprising the semiconductor device according to claim 1 or 2.

13. An IC tag comprising the semiconductor device according to claim 1 or 2.

14. An IC card comprising the semiconductor device according to claim 1 or 2.

* * * * *